(12) United States Patent
Bauer et al.

(10) Patent No.: US 7,816,236 B2
(45) Date of Patent: Oct. 19, 2010

(54) SELECTIVE DEPOSITION OF SILICON-CONTAINING FILMS

(75) Inventors: Matthias Bauer, Phoenix, AZ (US); Chantal Arena, Mesa, AZ (US); Ronald Bertram, Gilbert, AZ (US); Pierre Tomasini, Tempe, AZ (US); Nyles Cody, Tempe, AZ (US); Paul Brabant, Phoenix, AZ (US); Joseph Italiano, Phoenix, AZ (US); Paul Jacobson, Phoenix, AZ (US); Keith Doran Weeks, Gilbert, AZ (US)

(73) Assignee: ASM America Inc., Phoenix, AZ (US)

( * ) Notice: Subject to any disclaimer, the term of this patent is extended or adjusted under 35 U.S.C. 154(b) by 412 days.

(21) Appl. No.: 11/343,264

(22) Filed: Jan. 30, 2006

(65) Prior Publication Data

US 2006/0234504 A1    Oct. 19, 2006

Related U.S. Application Data

(60) Provisional application No. 60/649,990, filed on Feb. 4, 2005, provisional application No. 60/663,434, filed on Mar. 18, 2005, provisional application No. 60/668,420, filed on Apr. 4, 2005.

(51) Int. Cl.
*H01L 21/20* (2006.01)
(52) U.S. Cl. .................. 438/478; 438/482; 438/488
(58) Field of Classification Search .......... 438/478, 438/482, 488
See application file for complete search history.

(56) References Cited

U.S. PATENT DOCUMENTS

| 4,058,430 | A | 11/1977 | Suntola et al. |
|---|---|---|---|
| 4,413,022 | A | 11/1983 | Suntola et al. |
| 4,747,367 | A | 5/1988 | Posa |
| 4,761,269 | A | 8/1988 | Conger et al. |
| 5,071,670 | A | 12/1991 | Kelly |
| 5,194,398 | A * | 3/1993 | Miyachi et al. ............. 438/482 |
| 5,225,032 | A | 7/1993 | Golecki |
| 5,306,666 | A | 4/1994 | Izumi |
| 5,360,986 | A | 11/1994 | Candelaria |
| 5,674,781 | A | 10/1997 | Huang et al. |

(Continued)

FOREIGN PATENT DOCUMENTS

| DE | 19820147 A1 | 7/1999 |
|---|---|---|
| WO | WO 96/17107 | 6/1996 |
| WO | WO 99/41423 | 8/1999 |
| WO | WO 99/62109 | 12/1999 |
| WO | WO 00/11721 | 3/2000 |

(Continued)

OTHER PUBLICATIONS

Antonell et al., "Carbon incorporation for strain compensation during solid phase epitaxial recrystallization of SiGe on Si at 500-600°C", J. Appl. Phys. 79 (10), pp. 7646-7651 (1996).

(Continued)

*Primary Examiner*—N Drew Richards
*Assistant Examiner*—Jae Lee
(74) *Attorney, Agent, or Firm*—Knobbe, Martens Olson & Bear LLP

(57) ABSTRACT

Chemical vapor deposition methods use trisilane and a halogen-containing etchant source (such as chlorine) to selectively deposit Si-containing films over selected regions of mixed substrates. Dopant sources may be intermixed with the trisilane and the etchant source to selectively deposit doped Si-containing films. The selective deposition methods are useful in a variety of applications, such as semiconductor manufacturing.

34 Claims, 33 Drawing Sheets

U.S. PATENT DOCUMENTS

| | | | |
|---|---|---|---|
| 5,711,811 A | 1/1998 | Suntola et al. | |
| 5,769,950 A | 6/1998 | Takasu et al. | |
| 5,831,335 A | 11/1998 | Miyamoto | |
| 5,837,580 A | 11/1998 | Thakur et al. | |
| 5,879,459 A | 3/1999 | Gadgil et al. | |
| 5,904,565 A | 5/1999 | Nguyen et al. | |
| 5,916,365 A | 6/1999 | Sherman | |
| 5,933,761 A | 8/1999 | Lee | |
| 6,037,258 A | 3/2000 | Liu et al. | |
| 6,042,654 A | 3/2000 | Comita et al. | |
| 6,048,790 A | 4/2000 | Iacoponi et al. | |
| 6,069,068 A | 5/2000 | Rathore et al. | |
| 6,077,775 A | 6/2000 | Stumborg et al. | |
| 6,083,818 A | 7/2000 | Stumborg et al. | |
| 6,093,368 A | 7/2000 | Chu et al. | |
| 6,100,184 A | 8/2000 | Zhao et al. | |
| 6,139,700 A | 10/2000 | Kang et al. | |
| 6,146,517 A | 11/2000 | Hoinkis | |
| 6,159,828 A | 12/2000 | Ping et al. | |
| 6,181,012 B1 | 1/2001 | Edelstein et al. | |
| 6,184,128 B1 | 2/2001 | Wang et al. | |
| 6,188,134 B1 | 2/2001 | Stumborg et al. | |
| 6,197,666 B1 | 3/2001 | Schafer et al. | |
| 6,197,669 B1 | 3/2001 | Twu et al. | |
| 6,200,893 B1 | 3/2001 | Sneh | |
| 6,203,613 B1 | 3/2001 | Gates et al. | |
| 6,207,487 B1 | 3/2001 | Kim et al. | |
| 6,207,567 B1 | 3/2001 | Wang et al. | |
| 6,225,213 B1 | 5/2001 | Urabe | |
| 6,232,196 B1 | 5/2001 | Raaijmakers et al. | |
| 6,270,572 B1 | 8/2001 | Kim et al. | |
| 6,287,965 B1 | 9/2001 | Kang et al. | |
| 6,291,876 B1 | 9/2001 | Stumborg et al. | |
| 6,303,523 B2 | 10/2001 | Cheung et al. | |
| 6,340,619 B1 | 1/2002 | Ko | |
| 6,342,448 B1 | 1/2002 | Lin et al. | |
| 6,351,039 B1 | 2/2002 | Jin et al. | |
| 6,358,829 B2 | 3/2002 | Yoon et al. | |
| 6,368,954 B1 | 4/2002 | Lopatin et al. | |
| 6,380,065 B1 | 4/2002 | Komai et al. | |
| 6,391,785 B1 | 5/2002 | Satta et al. | |
| 6,437,071 B1 * | 8/2002 | Odaka et al. | 528/15 |
| 6,444,495 B1 | 9/2002 | Leung et al. | |
| 6,482,733 B2 | 11/2002 | Raaijmakers et al. | |
| 6,531,347 B1 * | 3/2003 | Huster et al. | 438/164 |
| 6,555,839 B2 | 4/2003 | Fitzgerald | |
| 6,583,015 B2 | 6/2003 | Fitzgerald et al. | |
| 6,583,048 B1 | 6/2003 | Vincent et al. | |
| 6,593,191 B2 | 7/2003 | Fitzgerald | |
| 6,716,713 B2 | 4/2004 | Todd | |
| 6,727,169 B1 | 4/2004 | Raaijmakers et al. | |
| 6,821,825 B2 | 11/2004 | Todd et al. | |
| 6,844,574 B1 * | 1/2005 | Hiramatsu et al. | 257/190 |
| 6,881,633 B2 | 4/2005 | Hokazono | |
| 6,900,115 B2 | 5/2005 | Todd | |
| 6,958,253 B2 | 10/2005 | Todd | |
| 6,962,859 B2 | 11/2005 | Todd et al. | |
| 6,969,875 B2 | 11/2005 | Fitzgerald | |
| 7,026,219 B2 | 4/2006 | Pomarede et al. | |
| 7,078,765 B2 | 7/2006 | Kurotani et al. | |
| 7,186,630 B2 | 3/2007 | Todd | |
| 7,288,791 B2 | 10/2007 | Umeno et al. | |
| 7,332,439 B2 | 2/2008 | Lindert | |
| 7,335,959 B2 | 2/2008 | Curello et al. | |
| 2001/0001742 A1 | 5/2001 | Huang et al. | |
| 2001/0034123 A1 | 10/2001 | Jeon et al. | |
| 2002/0023520 A1 | 2/2002 | Hu | |
| 2002/0168868 A1 | 11/2002 | Todd | |
| 2002/0173113 A1 | 11/2002 | Todd | |
| 2003/0047129 A1 | 3/2003 | Kawahara et al. | |
| 2003/0219981 A1 * | 11/2003 | Ammon et al. | 438/689 |
| 2004/0224089 A1 | 11/2004 | Singh et al. | |
| 2004/0224504 A1 * | 11/2004 | Gadgil | 438/680 |
| 2004/0262694 A1 | 12/2004 | Chidambaram | |
| 2005/0023520 A1 | 2/2005 | Lee et al. | |
| 2005/0042888 A1 * | 2/2005 | Roeder et al. | 438/780 |
| 2005/0079691 A1 | 4/2005 | Kim et al. | |
| 2005/0079692 A1 | 4/2005 | Samoilov et al. | |
| 2005/0121719 A1 * | 6/2005 | Mori | 257/336 |
| 2005/0250298 A1 | 11/2005 | Bauer | |
| 2006/0011984 A1 | 1/2006 | Currie | |
| 2006/0014366 A1 | 1/2006 | Currie | |
| 2006/0115933 A1 | 6/2006 | Ye et al. | |
| 2006/0115934 A1 * | 6/2006 | Kim et al. | 438/149 |
| 2006/0148151 A1 | 7/2006 | Murthy et al. | |
| 2006/0157683 A1 * | 7/2006 | Scheuerlein | 257/4 |
| 2006/0166414 A1 | 7/2006 | Carlson et al. | |
| 2006/0169668 A1 | 8/2006 | Samoilov | |
| 2006/0169669 A1 | 8/2006 | Zojaji et al. | |
| 2006/0205194 A1 | 9/2006 | Bauer | |
| 2006/0240630 A1 | 10/2006 | Bauer et al. | |
| 2006/0289900 A1 | 12/2006 | Thirupapuliyur et al. | |
| 2007/0161316 A1 | 7/2007 | Taguchi et al. | |
| 2007/0287272 A1 | 12/2007 | Bauer et al. | |
| 2008/0026149 A1 | 1/2008 | Tomasini et al. | |

FOREIGN PATENT DOCUMENTS

| | | |
|---|---|---|
| WO | WO 00/13207 | 3/2000 |
| WO | WO 00/15866 | 3/2000 |
| WO | WO 00/15881 | 3/2000 |
| WO | WO 00/16377 | 3/2000 |
| WO | WO 00/22659 | 4/2000 |
| WO | WO 00/55895 | 9/2000 |
| WO | WO 00/75964 A3 | 12/2000 |
| WO | WO 00/79576 A1 | 12/2000 |
| WO | WO 01/15220 A1 | 3/2001 |
| WO | WO 01/36702 A1 | 5/2001 |
| WO | WO 01/45149 A1 | 6/2001 |
| WO | WO 01/66832 | 9/2001 |
| WO | WO 01/78123 A1 | 10/2001 |
| WO | WO 01/78124 A1 | 10/2001 |
| WO | WO 01/99166 A1 | 12/2001 |

OTHER PUBLICATIONS

Bauer et al., "$Si_3H_8$ based epitaxy of biaxially stressed silicon films doped with carbon and arsenic for CMOS applications", in Semiconductor Defect Engineering—Materials, Synthetic Structures and Devices, edited by S. Ashok, J. Chevallier, B.L. Sopori, M. Tabe, and P. Kiesel (Mater. Res. Soc. Symp. Proc. 864, Warrendale, PA, 2005), E4.30.

Bauer et al., "Time resolved reflectivity measurements of silicon solid phase epitaxial regrowth", Thin Solid Films 364, pp. 228-232 (2000).

Eberl et al., "Structural properties of SiC and SiGeC alloy layers on Si", Chapter 2.5 in "Properties of Silicon Germanium and SiGe:Carbon", Institution of Electrical Engineers, pp. 75-77 (1999).

Feng et al., "Raman determination of layer stresses and strains for heterostructures and its application to the cubic SiC/Si system", J. Appl. Phys. 64 (12), pp. 6827-6835 (1988).

Hoyt, "Substitutional carbon incorporation and electronic characterization of $Si_{1-y}C_y$/Si and $Si_{1-x-y}Ge_xC_y$/Si heterojunctions", Chapter 3 in "Silicon-Germanium Carbon Alloy", Taylor and Francis (New York, NY), pp. 59-89 (2002).

Jorke, "Segregation of Ge and dopant atoms during growth of SiGe layers", Chapter 6.3 in "Properties of Silicon Germanium and SiGe:Carbon", Institution of Electrical Engineers, pp. 287-301 (1999).

Kouvetakis et al., "Synthesis and analysis of compounds and alloys in the GeC, SiC, and SiGeC systems", Chapter 2 in Series—Optoelectronic properties of semiconductors and superlattices; v. 15 Silicon-germanium carbon alloy / edited by S.T. Pantelides and S. Zollner; pp. 19-58.

MacKnight et al., "RTP applications and technology options for the sub-45 nm node", Proceedings, RTP2004 Conference (Portland, OR) (2004).

Meléndez-Lira et al., "Substitutional carbon in $Si_{1-y}C_y$ alloys as measured with infrared absorption and Raman spectroscopy", J. Appl. Phys. 82, pp. 4246-4252 (1997).

Oehme et al., "A novel measurement method of segregating adlayers in MBE", Thin Solid Films 369, pp. 138-142 (2000).

Oehme et al., "Carbon segregation in silicon", Thin Solid Films 380, pp. 75-77 (2000).

O'Neil et al., "Optimization of process conditions for selective silicon epitaxy using disilane, hydrogen, and chlorine", J. Electrochem. Soc. 144 (9), pp. 3309-3315 (1997).

Osten et al., "Substitutional carbon incorporation in epitaxial $Si_{1-y}C_y$ alloys on Si(001) grown by molecular beam epitaxy", Applied Physics Letters 74 (6), pp. 836-838 (1999).

Osten et al.. "Substitutional versus interstitial carbon incorporation during psuedomorphic growth of $Si_{1-y}C_y$ on Si(001)", J. Appl. Phys. 80 (12), pp. 6711-6715 (1996).

Strane et al., "Carbon incorporation into Si at high concentrations by ion implantation and solid phase epitaxy", J. Appl. Phys. 79 (2), pp. 637-646 (1996).

Strane et al., "Precipitation and relaxation in strained $Si_{1-y}C_y$ /Siheterostructures", J. Appl. Phys. 76 (6), pp. 3656-3668 (1994).

Van Zant, "Microchip Fabrication", 4th Ed., McGraw Hill (New York, NY), pp. 364-365 (2000).

Violette et al., "On the role of chlorine in selective silicon epitaxy by chemical vapor deposition", J. Electrochem. Soc. 143 (10), pp. 3290-3296 (1996).

Windl et al., "Theory of strain and electronic structure of $Si_{1-y}C_y$ and $Si_{1-x-y}C_y$ alloys", Phys. Rev. B57 (4), pp. 2431-2442 (1998).

Abeles et al.; *Amorphous Semiconductor Superlattices*; Physical Review Letters; Nov. 21, 1983; pp. 2003-2006; vol. 51; No. 21.

Bedair; *Selective area and sidewall growth by atomic layer epitaxy*; Semicond Sci. Technol; 1993; 1052-1062; vol. 8.

Düscö et al.; *Deposition of Tin Oxide into Porous Silicon by Atomic Layer Epitaxy*; J. Electrochem. Soc.; Feb. 1996; pp. 683-687; vol. 143, No. 2.

Fazan et al.;*A High-C Capacitor (20.4 Ff/μm2) with Ultrathin CVD—Ta2O5 Films Deposited on Rugged Poly-Si for High Density DRAMs*; IEEE; 1992; pp. IDEM 92-263-IDEM 92-266.

George et al.; *Nucleation and Growth During Tungsten Atomic Layer Deposition on Oxide Surfaces*; Mat. Res. Symp. Proc. vol. 672; Materials Research Society 2001; 07.7.1-07.7.7.

Haukka et al.; *Chemisorption of chromium acetylacetonate on porous high surface area silica*; Applied Surface Science; 1994; pp. 220-227.

Hiltunen et al.; *Nitrides of Titanium, Niobium, Tantalum and Molybdenum Grown as Thin Films by the Atomic Layer Epitaxy Method*; Thin Solid Films; 1988; pp. 149-154; vol. 166.

Horiike et al.; *Filling of Si Oxide into a Deep Trench using Digital CVD Method*; Applied Surface Science; 1990; pp. 168-174; vol. 46.

Jin et al.; *Porous Silica Xerogel Processing and Integration for ULSI Applications*; Materials Research Society Symposium Proceedings; 1998; pp. 213-222; vol. 511.

Juppo et al.; *Deposition of copper films by an alternate supply of CuCI and Zn*; J. Vac. Sci. Technol.; 1997; pp. 2003; Vol.-issue A 15(4).

Kaizuka et al.; *Conformal Chemical Vapor Deposition TiN(111) Film Formation as an Underlayer of Al for Highly Reliable Interconnects*; Jpn. J. Appl. Phys.; 1994; pp. 470-474; vol. 33.

Kikkawa et al.; *A Quarter-Micrometer Interconnection Technology Using a TiN/Al-Si-Cu/TiN/Al-SiCu/TiN/Ti Multilayer Structure*; IEEE Transactions on Electron Devices; Feb. 1993; pp. 296-302; vol. 40, No. 2.

Kikkawa et al.; *Al-Si-Cu/TiN multilayer interconnection and Al-Ge reflow sputtering technologies for quarter-micron devices*; SPIE; 1992; pp. 54-64; vol. 1805.

Kim et al.; *Applicability of ALE Tin films as Cu/Si diffusion barriers*; Thin Solid Films; 2000; pp. 276-283; 372(1).

Kim et al.; *Comparison of TiN and TiAlN as a Diffusion Barrier Deposited by Atomic Layer Deposition*; Journal of the Korean Physical Society; 2002; pp. 176-179; 40(1).

Klaus et al.; *Atomic Layer Deposition of SiO2 Using Catalyzed and Uncatalyzed Self-Limiting Surface Reactions*; Surface Review and Letters; 1999; pp. 435-448; vol. 6, Nos. 3 & 4.

Klaus et al.;*Atomic Layer Deposition of Tungsten Nitride Films Using Sequential Surface Reactions*; J. Electrochem Soc.; 2000; 1175-1181; 147(3).

Klaus et al.; *Atomically controlled growth of tungsten and tungsten nitride using sequential surface reactions*; Applied Surface Science; 2000; pp. 479-491; vols. 162-163.

Koo et al.; *Study on the,characteristics of Ti AlN thin film deposited by atomic layer deposition method*; Journal of Vacuum Science & Technology, A: Vacuum Surfaces, and Films; 2001; 2931-2834; 19(6).

Kukli et al.; *Atomic Layer Epitaxy Growth of Tantalum Oxide Thin Films from Ta(OC2H5)5 and H2O*; J. Electrochem. Soc.; May 1995; pp. 1670-1674; vol. 142, No. 5.

Leskelä et al.; *Atomic Layer Epitaxy in Deposition of Various Oxide and Nitride Thin Films*; Journal De Physique IV, Colloque C5, supplement au Journal de Physique II; Jun. 1995; pp. C5-937-05-951; vol. 5.

Martensson et al.; *Atomic layer epitaxy of copper an ab inition investigation of the CuCl/H2 process III. Reaction barriers*; Appl. Surf. Sci.; 2000; 92-100; 157(1).

Martensson et al.; *Atomic Layer Epitaxy of Copper on Tantalum*; Chemical Vapor Deposition; 1997; pp. 45-50; vol. 3, No. 1.

Martensson et al.; *Atomic Layer Epitaxy of Copper, Growth and Selectivity in the Cu(II)-2,2,6, 6-tetramethyl-3,5-heptanedionate/H2 Process*; J. Electrochem. Soc.; Aug. 1998; pp. 2926-2931; vol. 145, No. 8.

Martensson et al.; *Cu (THD )2 as Copper Source in Atomic Layer Epitaxy*; Proc. Electrochem. Soc.; 1997; 1529-1536; 97-25.

Martensson et al.; *Use of Atomic Layer Epitaxy for Fabrication of Si/TiN/Cu Structures*; J. Vac. Sci. Technol. B, Sep./Oct. 1999; pp. 2122-2128; vol. 17, No. 5.

Min et al.; *Atomic Layer Deposition of TiN Films by Alternate Supply of Tetrakis (ethylmethylamino )-Titanium and Ammonia*; Japanese Journal of Applied Physics; 1998; pp. 4999-5004; vol. 37.

Min et al.; *Chemical Vapor DepoSition of Ti-Si-N Films with Alternating Source Supply*; Mat. Res. Soc. Symp. Proc.; 1999; pp. 207-210; vol. 564; Materials Research Society.

Min et al.; *Metal-Organic Atomic-Layer Deposition of Titanium-Silicon-Nitride Films*; Applied Physics Letters; 1999; pp. 1521-1523; vol. 75, No. 11.

Min; *Atomic Layer Deposition of TiN Thin Films by Sequential Introduction of Ti Precursor and NH3*; Materials Research Society Symposium Proceedings; 1998; pp. 337-343; vol. 514.

Moller; *Copper and Nickel Ultrathin Films on Metal-Oxide Crystal Surfaces*Mater. Soc. Monogr.; 1994; 473-522; 81.

Niinistöet al.; *Synthesis of oxide thin films and overlayers by atomic layer epitaxy for advanced applications*; Materials Science and Engineering; 1996; pp. 23-29; vol. B41.

Ott et al.; *Modification of Porous Alumina membranes Using Al2O3 Atomic Layer Controlled Deposition*; Chem. Mater.; 1997; pp. 707-714; vol. 9.

PCT Search Report, PCT Application PCT/US2006/003333; Jun. 30, 2006.

PCT Search Report, PCT Application PCT/US2006/003465; Jul. 7, 2006.

Ritala et al.;*Atomic Layer Epitaxy Growth of TiN Thin Films from Tile and NH3*; J. Electrochem. Soc.; Aug. 1998; pp. 2914-2920; vol. 145; No. 8.

Ritala et al.; *Controlled Growth of TaN, Ta3N5, and TaOxNy Thin Films by Atomic Layer Deposition; Chem. Mater.*; 1999; pp. 1712-1718; vol. 11.

Ritala et al.; *Effects of intermediate zinc pulses on properties of TiN and NbN films deposited by atomic layer epitaxy*; Appl. Surf. Sci.; 1997; 199-212; 120.

Ritala et al.; *Perfectly Conformal TiN and Al2O3 Films Deposited by Atomic Layer Deposition; Chem Vap. Deposition*; 1999; pp. 7-9; vol. 5, No. 1.

Rossnagel et al.; *Plasma-enhanced atomic layer deposition of Ta and Ti for interconnect diffusin barriers*; J. Vac. Sci. Technol.; 2000; 2016-2020; 18(4).

Ryan et al.; *Material Property Characterization and Integration Issues for Mesoporous Silica*; IEEE, 1999, pp. IITC 99-187-IITC 99-189.

Sakaue et al.; *Digital Chemical Vapor Deposition of SiO2 Using a Repetitive Reaction of Triethylsilane/Hydrogen and Oxidation*; Japanese Journal of Applied Physics; Jan. 1990; pp. L124-L127; vol. 30, No. 1B.

Singer; *Atomic Layer Deposition Targets Thin Films*; Semiconductor International; Sep. 1999; pp. 40.

Sneh et al.; *Atomic layer growth of SiO2 on Si(100) using SiCl4 and H2O in a binary reaction sequence*; Surface Science; 1995; pp. 135-152; vol. 334.

Solanki et al.; *Atomic Layer Deposition of Copper Seed Layers*; Electrochem. And Solid State Lett.; 2000; 479-480; 3(10).

Tiitta et al.; *Preparation and Characterization of Phosphorus-Doped Aluminum Oxide Thin Films*; Materials Research Bulletin; 1998; pp. 1315-1323; vol. 33, No. 9.

U.S. Department of Commerce National Technical Information Service; *Ceramic Coatings on Metals Using Atomic Layer Controlled Chemical Vapor Deposition* (Assert-96); Feb. 16, 2000; Colorado University at Boulder.

Utriainen et al.; *Studies of metallic thin film growth in an atomic layer epitaxy reactor using M(ACAC)2 (M=Ni,Cu,Pt) precursors*; Appl. Surf. Sci.; 2000; 151-158; 157(3).

Wang; *Spin on Dielectric Films—A General Overview*; 1998 5th International Conference on Solid-State and Integrated Circuit Technology Proceedings; Oct. 21-23, 1998; p. 961; Beijing, China.

Wise et al.; *Diethyldiethoxysilane as a New Precursor for SiO2 Growth on Silicon*; Mat. Res. Soc. Symp. Proc.; 1994; pp. 37-43; vol. 334.

Wolf et al.; *Process and Equipment Simulation of Copper Chemical Vapor Deposition Using Cu(hfac)vtms*; Microelectronic Engineering; 1999; 15-27; 45.

Yagi et al; *Substitutional C incorporation into Si1-yCy alloys using novel carbon source, 1,3- disilabutane*; Japanese Journal of Applied Physics; 2004; pp. 4153-4154; vol. 43, No. 7A.

Aoyama, T., "Si Selective Epitaxial Growth Using Cl2 Pulsed Molecular Flow Method," Thin Solid Films 321 (1998) 256-260, © 1998 Elsevier Science S.A.

Zhang et al., "Selective epitaxial growth using dichlorosilane and silane by low pressure chemical vapor deposition," Microelectric Engineering 73-74, pp. 514-518 (2004).

\* cited by examiner

SELECTIVE DEPOSITION OF SILICON-CONTAINING FILMS

CROSS-REFERENCE TO RELATED APPLICATIONS

This application claims priority to U.S. Provisional Application No. 60/649,990, filed Feb. 4, 2005; U.S. Provisional Application No. 60/663,434, filed Mar. 18, 2005; and U.S. Provisional Application No. 60/668,420, filed Apr. 4, 2005; all of which are hereby incorporated by reference in their entireties.

This application is related to, and incorporates by reference in their entireties, the following U.S. patent applications: U.S. patent application Ser. No. 11/343,275, entitled "METHODS OF MAKING SUBSTITUTIONALLY CARBON-DOPED CRYSTALLINE SI-CONTAINING MATERIALS BY CHEMICAL VAPOR DEPOSITION ; and U.S. patent application Ser. No. 11/343,244, entitled "METHODS OF MAKING ELECTRICALLY DOPED CRYSTALLINE SI-CONTAINING FILMS, both of which are filed on even date herewith.

BACKGROUND OF THE INVENTION

1. Field of the Invention

This application relates generally to the deposition of silicon-containing materials in semiconductor processing. More particularly, this application relates to the selective deposition of silicon-containing films using trisilane.

2. Description of the Related Art

A variety of methods are used in the semiconductor manufacturing industry to deposit materials onto surfaces. For example, one of the most widely used methods is chemical vapor deposition ("CVD"), in which atoms or molecules contained in a vapor deposit on a surface and build up to form a film. Deposition of silicon-containing ("Si-containing") materials using conventional silicon sources and deposition methods is believed to proceed in several distinct stages, see Peter Van Zant, "Microchip Fabrication," 4$^{th}$ Ed., McGraw Hill, New York, (2000), pp. 364-365. Nucleation, the first stage, is very important and is greatly affected by the nature and quality of the substrate surface. Nucleation occurs as the first few atoms or molecules deposit onto the surface and form nuclei. During the second stage, the isolated nuclei form small islands that grow into larger islands. In the third stage, the growing islands begin coalescing into a continuous film. At this point, the film typically has a thickness of a few hundred angstroms and is known as a "transition" film. It generally has chemical and physical properties that are different from the thicker bulk film that begins to grow after the transition film is formed.

While trisilane has been long been known as a theoretical precursor for silicon, few studies have been performed on it and few advantages have been recognized. Accordingly, significant commercial sources of trisilane have not developed historically. Recently, however, a variety of advantages for trisilane have been discovered. U.S. Pat. No. 6,821,825, issued Nov. 23, 2004, for example, discloses superior film uniformity deposited from trisilane. U.S. Pat. No. 6,900,115, issued May 31, 2005, similarly discloses uniformity and throughput benefits from use of trisilane when simultaneously depositing over mixed substrates such as mixed semiconductor and insulating surfaces.

As disclosed in both of the above-referenced patents, it is often desirable to achieve uniform deposition over both insulating (e.g., silicon oxide) and semiconductor (e.g., silicon) surfaces. On the other hand, in other contexts it is desirable to deposit selectively within semiconductor windows exposed within fields of different materials, such as field isolation oxide. For example, heterojunction bipolar transistors are often fabricated using selective deposition techniques that deposit epitaxial (single-crystal) semiconductor films only on active areas. Other transistor designs benefit from elevated source/drain structures, which provide additional silicon that can be consumed by the source/drain contact process without altering shallow junction device performance. Selective epitaxy on source/drain regions advantageously reduces the need for subsequent patterning and etch steps.

Generally speaking, selectivity takes advantage of differential nucleation during deposition on disparate materials. Selective deposition can generally be explained by simultaneous etching and deposition of the material being deposited. The precursor of choice will generally have a tendency to nucleate and grow more rapidly on one surface and less rapidly on another surface. For example, silane will generally nucleate on both silicon oxide and silicon, but there is a longer nucleation phase on silicon oxide. At the beginning of a nucleation stage, discontinuous films on oxide have a high exposed surface area relative to merged, continuous films on silicon. Accordingly, an etchant added to the process will have a greater effect upon the poorly nucleating film on the oxide as compared to the rapidly nucleating film on the silicon. The relative selectivity of a process can thus be tuned by adjusting factors that affect the deposition rate (e.g., precursor flow rates, temperature, pressure) and the rate of etching (e.g., etchant flow rate, temperature, pressure). Changes in each variable will generally have different effects upon etch rate and deposition rate. Typically, a selective deposition process is tuned to produce the highest deposition rate feasible on the window of interest while accomplishing no deposition in the field regions. Known selective silicon deposition processes include reactants silane and hydrochloric acid with a hydrogen carrier gas.

While selective deposition processes are known in the art, continued scaling in pursuit of faster, less power-hungry circuitry has increased the demands on integrated circuit fabrication. Accordingly, selective deposition processes with improved uniformity, purity, deposition speed and repeatability are desired.

SUMMARY OF THE INVENTION

Deposition processes have now been discovered that are faster and result in higher quality deposited layers. Certain described processes employ trisilane ($H_3SiSiH_2SiH_3$) as a silicon source and a halogen-containing etchant gas such as chlorine gas ($Cl_2$) as a source of chlorine for providing selectivity to the deposition process of Si-containing films. Advantageously, the process works well with additive process gases, including carbon or germanium sources, for incorporation of strain into the deposited layer or adjacent structures, and/or dopant sources. For example, it has been found that selectively deposited crystalline silicon may be doped to contain relatively high levels of other elements (such as carbon, germanium and various electrically active dopants such as arsenic and phosphorous) by carrying out the deposition of the crystalline silicon using chlorine, trisilane (as a silicon source) and an additive process gas (such as a carbon source, germanium source and/or electrically active dopant precursor). Electrically active dopant precursors have been found to not only provide the desired conductivity in situ, obviating subsequent doping steps, but have also been found to independently improve surface quality of the deposited layer.

Particular advantages have been found for use of non-hydrogen carrier gases in conjunction with trisilane/chlorine deposition recipes.

An embodiment provides a method of selective deposition of a silicon-containing layer over a substrate, comprising:
   providing a substrate, the substrate comprising a first surface having a first surface morphology and a second surface having a second surface morphology different from the first surface morphology;
   intermixing trisilane and chlorine gas to thereby form a feed gas;
   introducing the feed gas to the substrate under chemical vapor deposition conditions; and
   selectively depositing a Si-containing layer onto the first surface without depositing on the second surface by said introducing.

Another embodiment provides a method of forming an integrated circuit, the method comprising:
   patterning a substrate to define exposed semiconductor surfaces and insulating regions; and
   providing trisilane and chlorine gas, thereby selectively depositing a Si-containing epitaxial film on the exposed semiconductor surfaces.

Another embodiment provides a method of depositing a silicon-containing layer over a substrate, comprising:
   providing a substrate disposed within a chamber;
   intermixing trisilane, a halogen-containing etchant gas and a non-hydrogen carrier gas to form a feed gas, and
   introducing the feed gas to the substrate, thereby depositing a silicon-containing layer on the substrate.

Another embodiment provides an apparatus for depositing semiconductor films, comprising:
   a trisilane vapor source;
   a chlorine gas source;
   a carrier gas source;
   a gas distribution network connecting the trisilane, chlorine and carrier gas sources to a chemical vapor deposition chamber; and
   a control system configured to deliver the trisilane and chlorine to the gas distribution network under conditions suited to selectively deposit a silicon-containing layer on portions of a substrate within the chamber without depositing on other portions of the substrate.

These and other embodiments are described in greater detail below.

BRIEF DESCRIPTION OF THE DRAWINGS

These and other aspects of the invention will be readily apparent from the following description and from the appended drawings (not to scale), which are meant to illustrate and not to limit the invention, and in which.

DETAILED DESCRIPTION OF THE PREFERRED EMBODIMENTS

Figure 1:
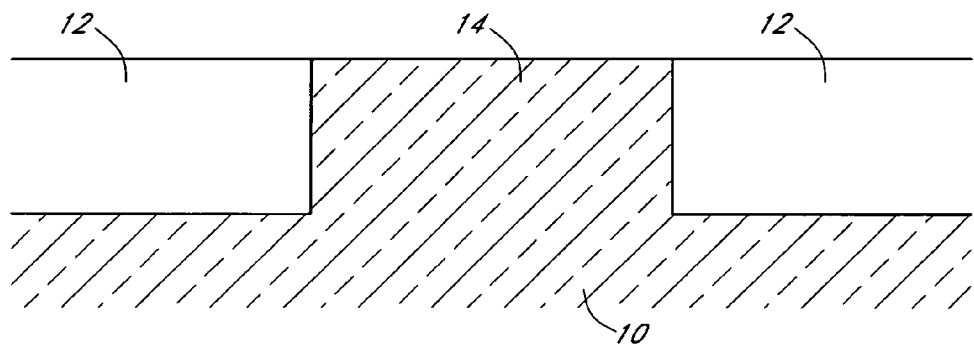
FIG. 1 is a schematic cross section of a semiconductor substrate after field oxide definition, leaving insulator and semiconductor surfaces exposed.

The term "Si-containing material" and similar terms are used herein to refer to a broad variety of silicon-containing materials including without limitation Si (including crystalline silicon), SiC (e.g., carbon-doped crystalline Si), SiGe and SiGeC (e.g., carbon-doped crystalline SiGe). As used herein, "carbon-doped Si", "SiC", "Si:C", "SiGe", "carbon-doped SiGe", "SiGeC" and similar terms refer to materials that contain the indicated chemical elements in various proportions and, optionally, minor amounts of other elements. For example, "SiGe" is a material that comprises silicon, germanium and, optionally, other elements, e.g., dopants such as carbon and electrically active dopants. Thus, carbon-doped Si may be referred to herein as SiC or vice versa. Terms such as "SiC", "SiGe", and "SiGeC" are not stoichiometric chemical formulas per se and thus are not limited to materials that contain particular ratios of the indicated elements. The percentage of a dopant (such as carbon, germanium or electrically active dopant) in a Si-containing film is expressed herein in atomic percent on a whole film basis, unless otherwise stated.

The terms "epitaxial", "epitaxially" "heteroepitaxial", "heteroepitaxially" and similar terms are used herein to refer to the deposition of a crystalline Si-containing material onto a crystalline substrate in such a way that the deposited layer adopts or follows the lattice constant of the substrate. Epitaxial deposition may be heteroepitaxial when the composition of the deposited layer is different from that of the substrate.

"Substrate," as that term is used herein, refers either to the workpiece upon which deposition is desired, or the surface exposed to the deposition gas(es). For example, the substrate may be a single crystal silicon wafer, or may be a semiconductor-on-insulator (SOI) substrate, or may be an epitaxial Si, SiGe or III-V material deposited upon such wafers. Workpieces are not limited to wafers, but also include glass, plastic, or any other substrate employed in semiconductor processing. As is well known, semiconductor processing is most commonly employed for the fabrication of integrated circuits, which entails particularly stringent quality demands, but such processing is also employed in a variety of other fields. For example, semiconductor processing techniques are often employed in the fabrication of flat panel displays using a wide variety of technologies and in the fabrication of microelectromechanical systems (MEMS).

The term "mixed substrate" is known to those skilled in the art, see U.S. Pat. No. 6,900,115 (issued May 31, 2005), entitled "Deposition Over Mixed Substrates," which is hereby incorporated herein by reference in its entirety and particularly for the purpose of describing mixed substrates. As discussed in U.S. Pat. No. 6,900,115, a mixed substrate is a substrate that has two or more different types of surfaces. In certain embodiments, Si-containing layers are selectively formed over single crystal semiconductor materials while minimizing and more preferably avoiding deposition over adjacent dielectrics. Examples of dielectric materials include silicon dioxide (including low dielectric constant forms such as carbon-doped or fluorine-doped), silicon nitride, metal oxide and metal silicate. There are various ways that the surfaces of a mixed substrate can be different from each other. For example, the surfaces can be made from different elements such as copper or silicon, or from different metals, such as copper or aluminum, or from different Si-containing materials, such as silicon or silicon dioxide. The electrical properties of surfaces can also make them different from each other.

Even if the materials are made from the same element, the surfaces can be different if the morphologies (crystallinity) of the surfaces are different. The processes described herein are useful for depositing Si-containing films on a variety of substrates, but are particularly useful for mixed substrates having mixed surface morphologies. Such a mixed substrate comprises a first surface having a first surface morphology and a second surface having a second surface morphology. In this context, "surface morphology" refers to the crystalline structure of the substrate surface. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order. Epitaxial films are characterized by a crystal structure and orientation that is identical to the substrate upon which they are grown, typically single crystal. The atoms in these materials are arranged in a lattice-like structure that persists over relatively long distances (on an atomic scale). Amorphous morphology is a non-crystalline structure having a low degree of order because the atoms lack a definite periodic arrangement. Other morphologies include microcrystalline and mixtures of amorphous and crystalline material. As used herein, "single-crystal" or "epitaxial" is used to describe a predominantly large crystal structure that may have a tolerable number of faults therein, as is commonly employed for transistor fabrication. The skilled artisan will appreciate that crystallinity of a layer generally falls along a continuum from amorphous to polycrystalline to single-crystal; the skilled artisan can readily determine when a crystal structure can be considered single-crystal or epitaxial, despite low density faults. Specific examples of mixed substrates include without limitation single crystal/polycrystalline, single crystal/amorphous, epitaxial/polycrystalline, epitaxial/amorphous, single crystal/dielectric, epitaxial/dielectric, conductor/dielectric, and semiconductor/dielectric. The term "mixed substrate" includes substrates having more than two different types of surfaces, and thus the skilled artisan will understand that methods described herein for depositing Si-containing films onto mixed substrates having two types of surfaces may also be applied to mixed substrates having three or more different types of surfaces.

Exemplary Process Integration

FIG. 1 shows a mixed substrate 10 comprising a silicon wafer in the illustrated embodiment. As noted above, the mixed substrate 10 can include an epitaxial layer formed over a wafer or an SOI substrate. Field isolation regions 12 have been formed by conventional shallow trench isolation (STI) techniques, defining single crystal active areas 14 in windows among the STI elements. Alternatively, any suitable method can be used to define field insulating material, including local oxidation of silicon (LOCOS) and a number of variations on LOCOS or STI. It will be understood that several active areas are typically defined simultaneously by STI across the substrate 10, and that the STI often forms a web separating transistor active areas 14 from one another. The substrate is preferably background doped at a level suitable for channel formation.

Figure 2:
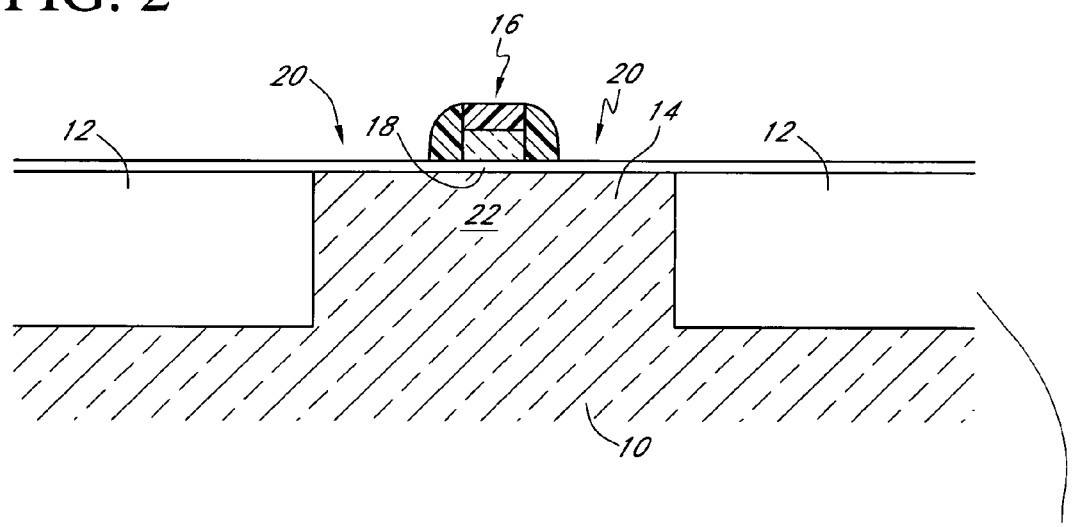
FIG. 2 shows the structure of FIG. 1 after formation of a transistor gate electrode within an active area window.

FIG. 2 illustrates the mixed substrate 10 after formation of a gate electrode 16 over the active area 14. While illustrated as a traditional silicon electrode, surrounded by insulating spacers and cap layers, and separated from the underlying substrate 10 by a gate dielectric layer 18, it will be understood that the transistor gate stack can have any of a variety of configurations. In some process flows, for example, the spacers can be omitted. In the illustrated embodiment, the placement of the gate electrode 16 defines source and drain regions 20 on either side of the transistor gate electrode 16 within the active area 14. The gate electrode 16 also defines a channel region 22 under the gate electrode 16 and between the source and drain regions 20.

Figure 3:
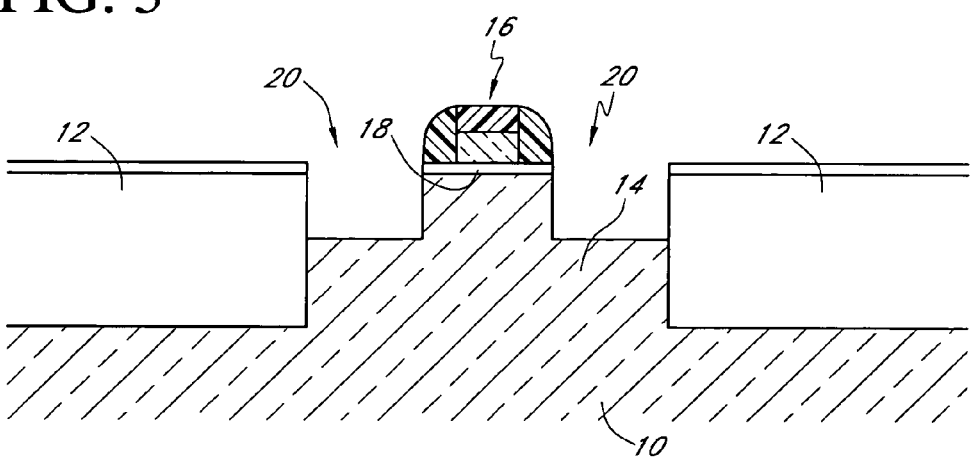
FIG. 3 shows the structure of FIG. 2 after recessing source and drain regions on either side of the gate electrode.

FIG. 3 illustrates the result of an etch step that selectively removes exposed silicon from the source and drain regions 20. Preferably a reactive ion etch (RIE) is employed to ensure vertical sidewall definition and minimal damage to exposed oxide and nitride materials. Preferably the depth of the recesses is less than the critical thickness of the layer to be deposited in the recess although strain on the channel can also be obtained by deposition greater than the critical thickness. As the exposed silicon is essentially the source and drain (S/D) regions 20 of the active area 14, the etch is referred to as a source/drain recess. It will be understood that, in some arrangements, a first step of clearing the thin dielectric over the source/drain regions may be employed.

Figure 4:
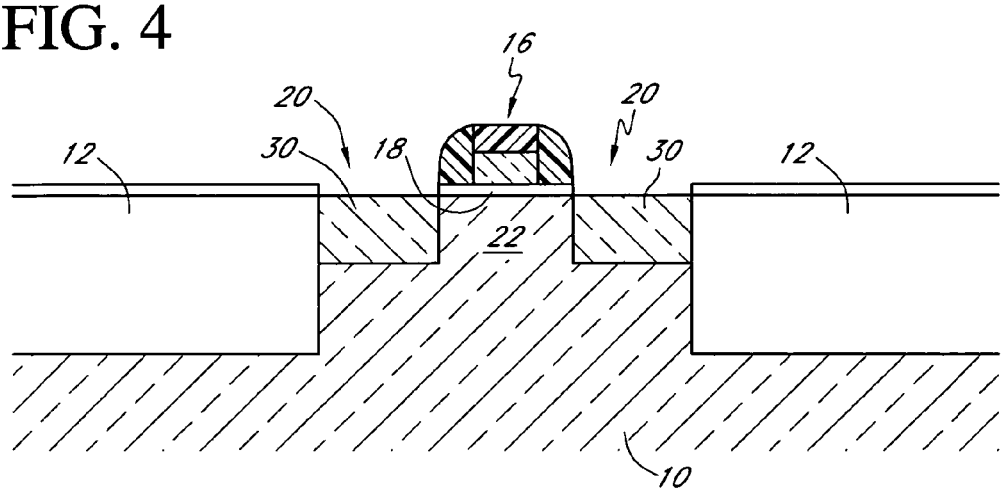
FIG. 4 shows the structure of FIG. 3 after selective deposition of a semiconductor film within the recessed regions, in accordance with a preferred embodiment of the invention.

FIG. 4 shows the result of selectively depositing a crystalline Si-containing material 30 into the recessed S/D regions 20 using a trisilane/chlorine selective deposition process as described herein. Prior to deposition, the exposed semiconductor surfaces are preferably cleaned, such as with an HF vapor or HF last dip, leaving a pristine surface for epitaxy thereover. In the illustrated embodiment, the trisilane/chlorine selective deposition process comprises introducing a feed gas to the surface of the mixed substrate 10 under chemical vapor deposition conditions. Trisilane and chlorine are intermixed to form the feed gas. Preferably, for the embodiments of FIGS. 1-5, germanium or carbon sources are also included in the feed gas in order to deposit a Ge-doped or carbon-doped Si-containing film to create strain on the channel region 20, as described in greater detail below. Preferably a dopant precursor such as a dopant hydride is included in the feed gas. A Si-containing epitaxial layer 30 grows selectively in the S/D regions 20. Advantageously, the layer 30 is a doped heteroepitaxial film (e.g., SiC or SiGe) that fills the S/D regions 20 and exerts strain on the channel region 22. In the illustrated embodiment, the heteroepitaxial film 30 is approximately flush with the surface of the channel region 22.

As illustrated, the selective deposition minimizes or avoids deposition over the amorphous regions, e.g., over the insulators include field isolation regions 12 (generally a form of silicon oxide) and the spacers cape on the gate electrode 16 (typically silicon nitride).

Figure 5:
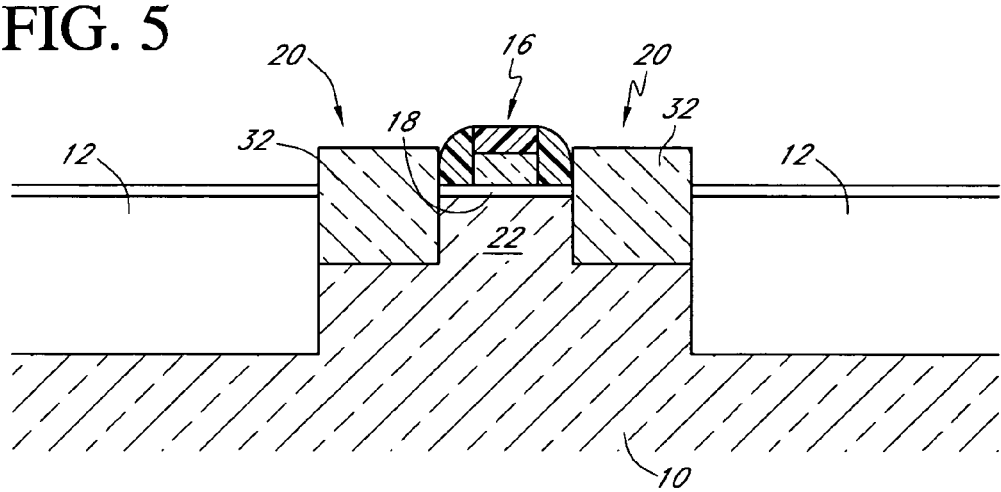
FIG. 5 shows the structure of FIG. 4 after optional continued selective deposition, forming elevated source/drain structures.

FIG. 5 illustrates an optional extension of the selective deposition to form elevated S/D regions 20 with the extended heteroepitaxial film 32. As the portion of the extended film 32 below the surface of the channel region 22 exerts lateral stress on the channel region 22, the portion above the surface of the substrate need not include as much or any lattice deviation from the natural silicon lattice constant. Accordingly, any germanium or carbon source gases, as the case may be, can be tapered or halted for the portion of the selective deposition above the surface of the channel region 22, and trisilane and chlorine flows continued. Electrical dopant source gases, particularly dopant hydrides such as arsine, phosphine or diborane, are preferably continued.

The elevated S/D structure 32 of FIG. 5 advantageously provides additional silicon material above the surface of the substrate 10. As is known in the art, through subsequent processing, insulating layers are deposited and contacts are made through the insulating film to the source and drain regions 20. The additional silicon material facilitates formation of silicide contacts, which reduce contact resistance (form ohmic contacts). Accordingly, nickel, cobalt or other metal is deposited into the contact hole and allowed to consume the excess silicon without disturbing electrical properties of shallow junctions for the underlying source/drain regions.

Figure 6:
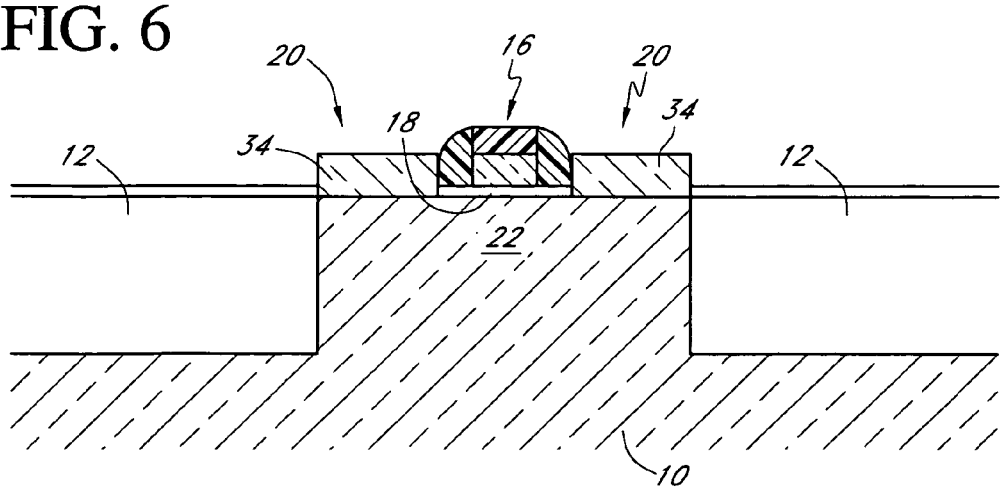
FIG. 6 shows the structure of FIG. 2 after exposing the semiconductor window and conducting a selective deposition to form elevated source/drain structures, in accordance with another preferred embodiment of the present invention.

FIG. 6 shows another embodiment, in which the structure of FIG. 2 is subjected to the selective deposition using trisilane and chlorine, without the intervening S/D recess step. In this case, the selective deposition serves only to raise the source and drain regions, providing excess silicon 34 to permit consumption by contact silicidation without destroying shallow junctions. The deposition can optionally include dopant precursors to deposit doped silicon, e.g., silicon doped with an electrically active dopant. Dopants are unnecessary, however, if the entire excess silicon structure 34 is to be consumed by contact silicidation.

In another arrangement (not shown), the selective deposition using trisilane and chlorine gas is used to selectively form a silicon contact plug. For example, a relatively thick insulating layer, such as BPSG or TEOS, is patterned and contact vias are opened to expose a single-crystal semiconductor surface. The selective deposition is employed to grow an epitaxial plug from the surface up through the contact hole.

Advantageously, the selective nature of the trisilane/chlorine process obviates subsequent pattern and etch steps to remove excess deposition from over field regions. Even imperfect selectivity can advantageously permit use of a timed wet etch to remove unwanted deposition over insulating surfaces, rather than requiring an expensive mask step. Furthermore, superior film quality is obtained at relatively high deposition rates, improving throughput. For example, certain process embodiments may be used to selectively deposit boron-doped SiGeC using trisilane, germane, methylsilane, $B_2H_6$, and chlorine to form, e.g., a base structure of a heterobipolar transistor (HBT). In an embodiment, a deposition process using trisilane, an n-dopant precursor (such as arsine or phosphine) and chlorine as described herein may be used to selectively deposit n-doped silicon layer to form, e.g., an epitaxial emitter of an HBT. Other selective deposition process embodiments may be used to form an elevated source/drain (ESD) structure, a contact plug for DRAM and/ or SRAM, using e.g., trisilane and chlorine at a deposition temperature of about 550° C. In some embodiments, intrinsic silicon is selectively deposited using trisilane and chlorine, in the substantial absence of a dopant precursor, e.g., in the substantial absence of a carbon source, germanium source or source of electrically active dopant. Various deposition parameters and operational details for the trisilane/chlorine selective deposition process are described in greater detail below.

Trisilane/Chlorine Selective Deposition

An embodiment provides a method of selective deposition of a silicon-containing layer over a substrate. The method preferably includes: providing the substrate disposed within a chamber, where the substrate comprises a first surface having a first surface morphology and a second surface having a second surface morphology different from the first surface morphology. The method preferably includes intermixing trisilane, chlorine gas and, optionally, one or more of a carrier gas and a dopant gas, to thereby form a feed gas; introducing the feed gas to the substrate under chemical vapor deposition conditions; and selectively depositing a Si-containing film onto the first surface while minimizing deposition on the second surface by or during the introducing of the trisilane and chlorine.

In addition to the uniformity and high quality films obtained by use of trisilane, as disclosed, e.g., in U.S. Pat. No. 6,821,825, issued Nov. 23, 2004, it has been found that excellent selectivity can be obtained by use of trisilane in combination with chlorine gas. In fact, experiments have shown that selectivity is typically 99% or better and can be 100% (i.e., with zero deposition on surrounding insulators such as silicon oxide and silicon nitride). Thus, in preferred embodiments, there is substantially no deposition on the second surface by or during the introducing of the trisilane and chlorine.

Moreover, this selectivity is obtained without the addition of additional etchant species. Typically HCl is provided to selective silicon-based deposition processes, where the etch effect upon slow-nucleating deposition on amorphous (typically insulating) surfaces is greater than the etch effects on exposed semiconductor surfaces. HCl, however, is notoriously difficult to purify and typical commercial sources of HCl introduce excessive moisture into the deposition process. Such moisture can lower conductivity of deposited films, and cause unacceptable levels of defects in epitaxial deposition. Accordingly, trisilane and chlorine reactions advantageously achieve high levels of selectivity without added etchants, and particularly without HCl.

The use of trisilane for selective deposition processes as described herein is surprising in view of the known non-selectivity of trisilane for the deposition of Si-containing layers over mixed substrates. For example, U.S. Pat. No. 6,900,115, entitled "Deposition Over Mixed Substrates," discloses that trisilane depositions conducted under the CVD conditions described therein tends to produce a Si-containing films having a thickness that is relatively independent of underlying surface morphology. Thus, for example, FIG. 2 of U.S. Pat. No. 6,900,115 shows that the thickness of a Si-containing film 210 deposited over a mixed substrate using a trisilane deposition process is relatively uniform, despite the variations in crystallinity across the surface of the underlying substrate. The trisilane deposition conditions taught in U.S. Pat. No. 6,900,115 include a preferred deposition temperature in the range of about 400° C. to about 750° C. Thus, U.S. Pat. No. 6,900,115 shows that trisilane is regarded by those skilled in the art as a non-selective silicon source for depositions over mixed substrates.

Certain conditions for selective deposition using disilane/chlorine are known. In this regard, FIGS. 7-10 illustrate various background principles of selective deposition using disilane/chlorine, as disclosed in Violette et al., *J. Electrochem. Soc.*, Vol. 143 (1996), pp. 3290-3296 ("Violette") and O'Neill et al., *J. Electrochem. Soc.*, Vol. 144 (1997), pp. 3309-3315 ("O'Neill"), both of which are hereby incorporated by reference in their entireties.

Figure 7:
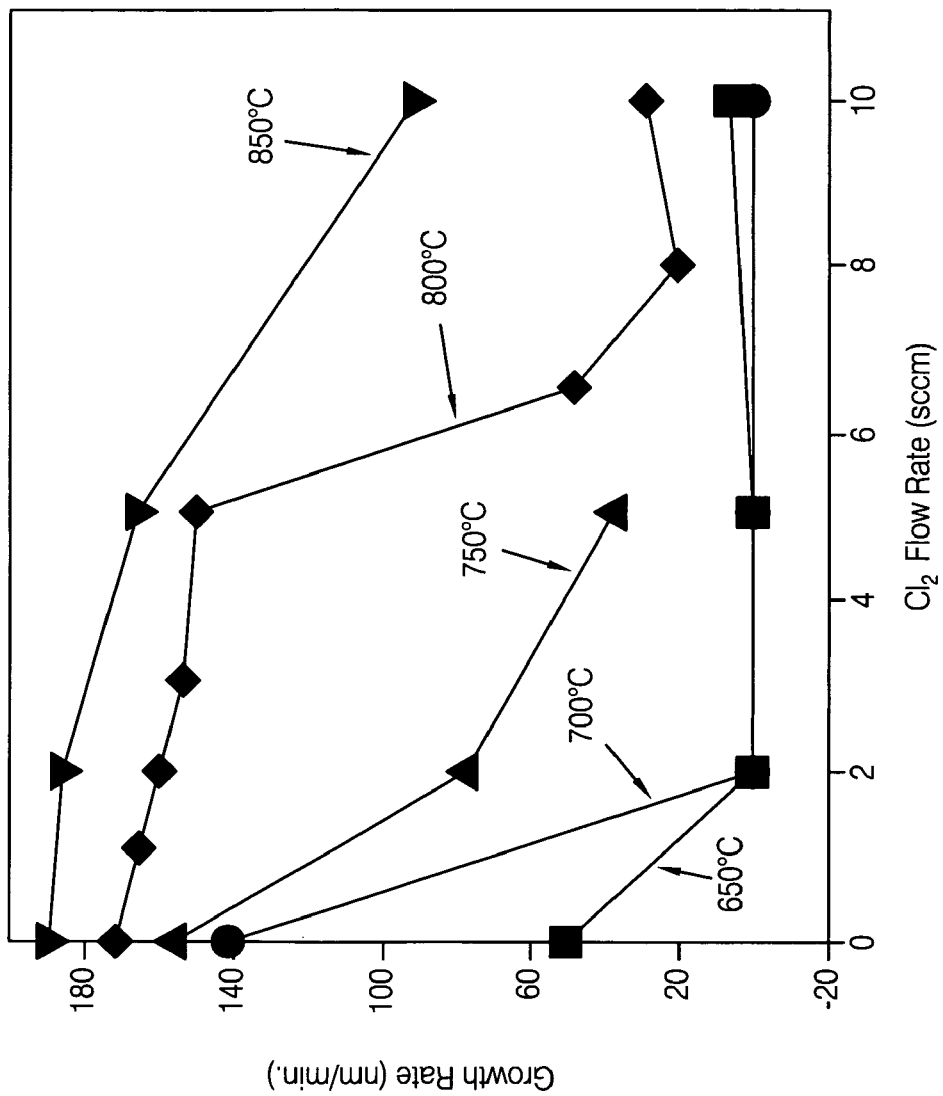
FIG. 7 is a graph showing deposition rate on silicon as a function of chlorine flow rate at a number of temperatures for a fixed disilane flow rate.

FIG. 7 is a plot of Si growth rate as a function of $Cl_2$ flow rate for various deposition temperatures, with 10% disilane flow in $H_2$ carrier gas at 100 sccm and total pressure at 22-24 mTorr, modulating $Cl_2$ flow at each temperature (see Violette FIG. 6). Under those conditions, temperatures greater than about 700° C., and $Cl_2$ flow rates less than 2 sccm maintain high growth rates. At $Cl_2$ flow rates of 2 sccm or higher, significant negative impacts on growth rate are observed. According to Violette, at the lower temperatures silicon growth rates are limited by Cl passivation and not Si etching.

Figure 8:
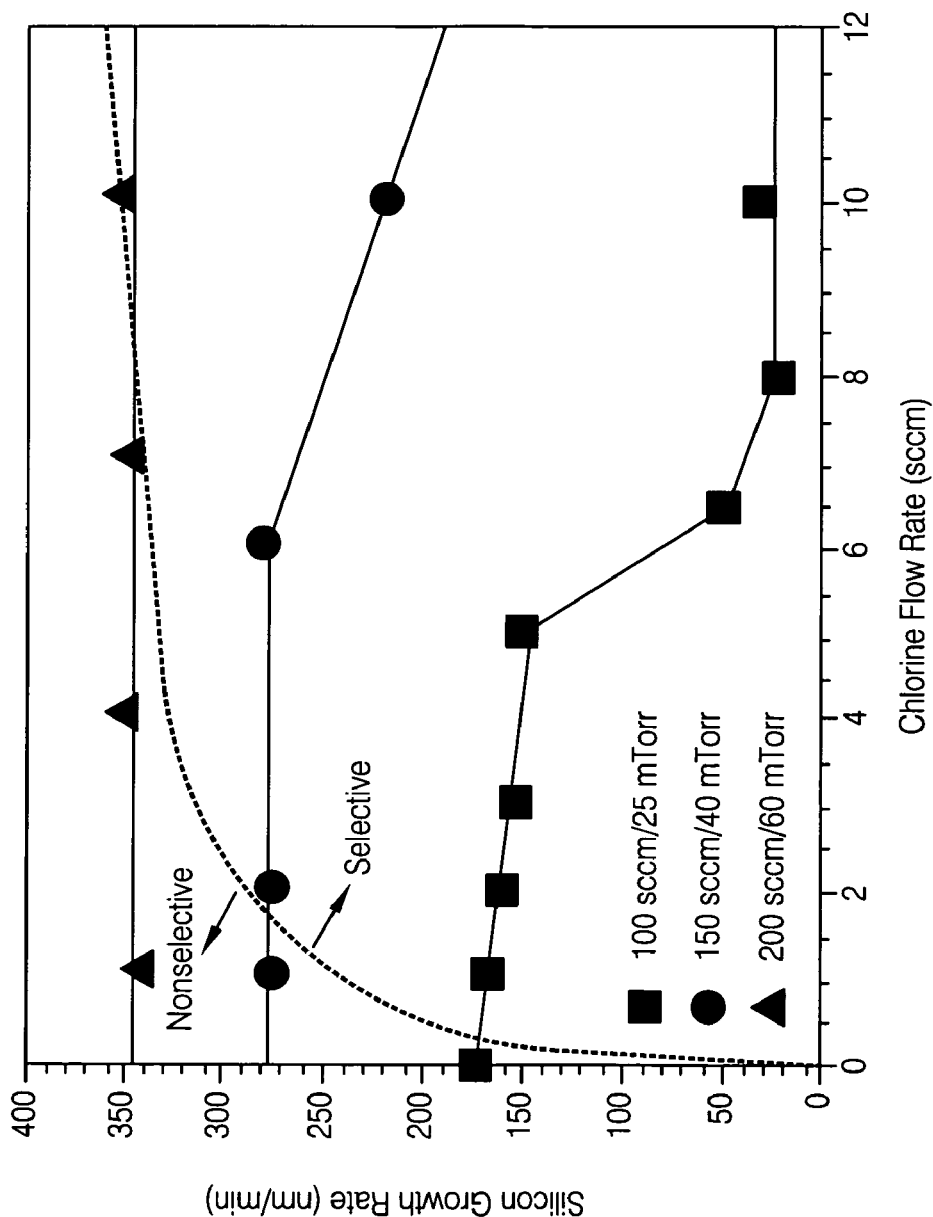
FIG. 8 is a graph showing deposition rate as a function of chlorine flow rate, illustrating selectivity thresholds for the disilane/chlorine deposition under a variety of conditions.
Figure 9:
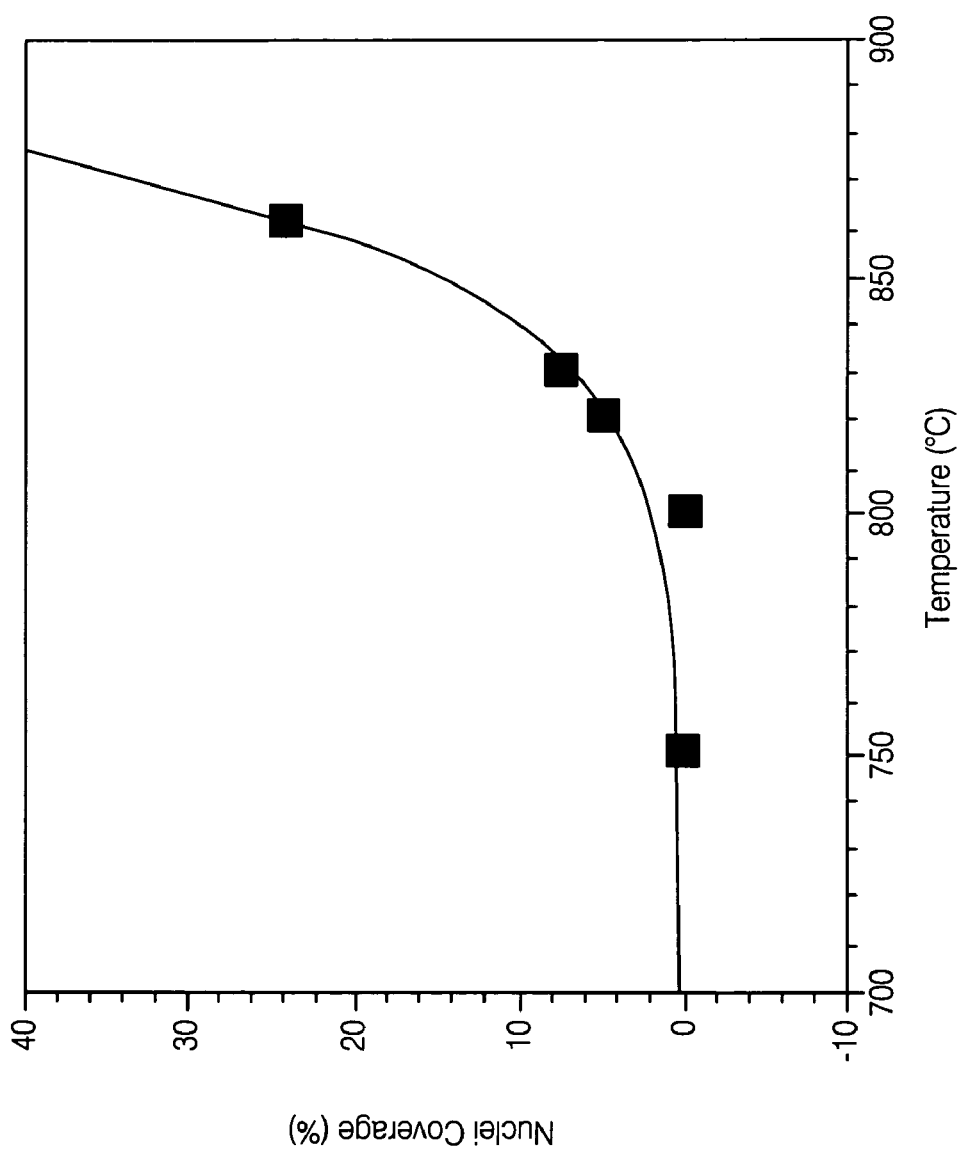
FIG. 9 is a graph showing nuclei surface coverage on insulating surfaces as a function of temperature, for depositions employing disilane and chlorine process gases.
Figure 10:
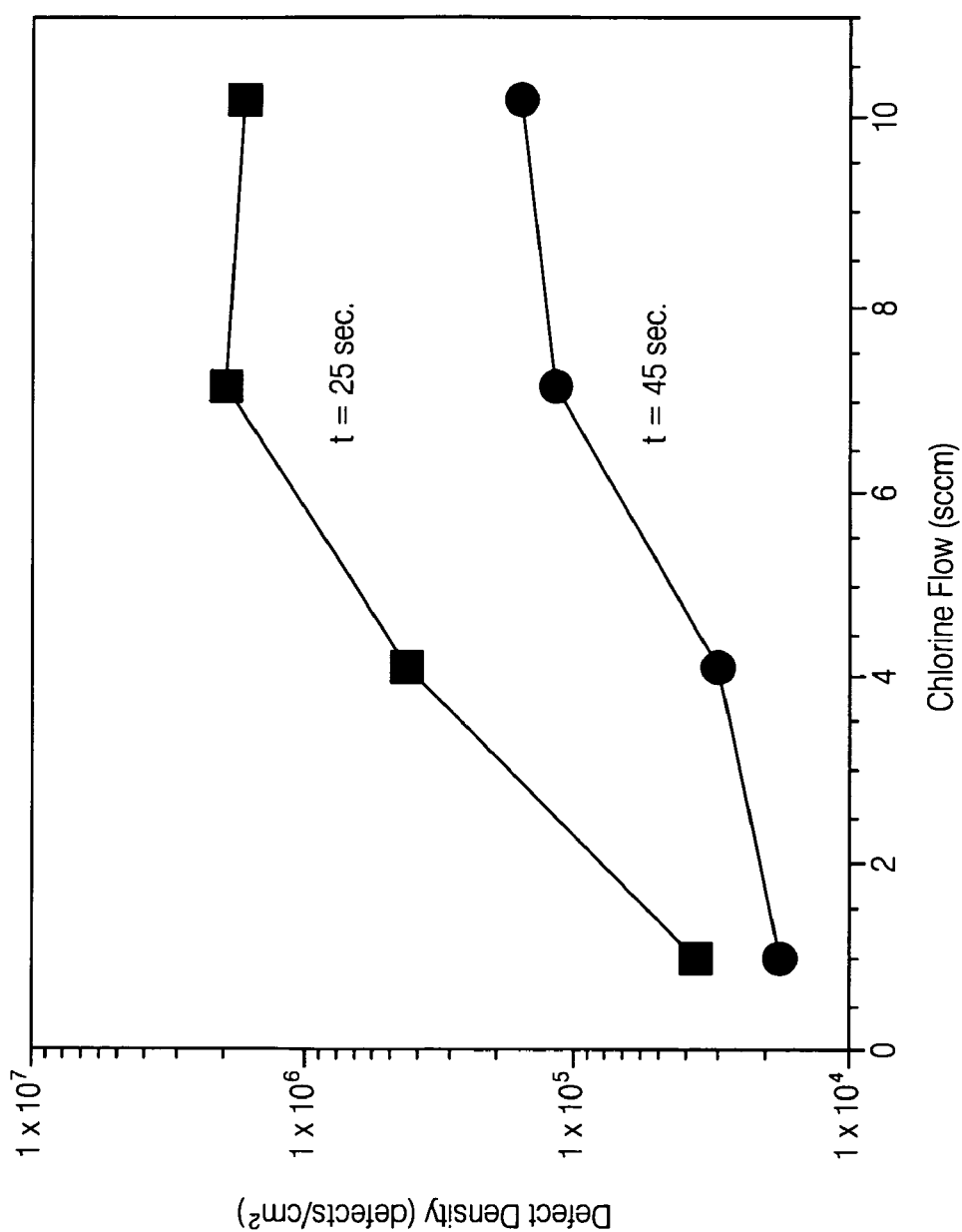
FIG. 10 is a graph showing defect density as a function of chlorine flow for depositions employing disilane and chlorine process gases.

FIG. 8 is a graph of deposition rate vs. chlorine flow rates, illustrating selectivity thresholds for disilane/chlorine deposition under a variety of conditions (see O'Neill FIG. 1). FIG. 9 is a graph showing nuclei surface coverage on insulating surfaces as a function of temperature (see O'Neill FIG. 3). Under the tested conditions for FIGS. 8 and 9, temperatures less than 750° C. maintain selectivity. Accordingly, for the single wafer tool employed for the experiments, optimal selectivity is expected at 700° C. to 750° C., for pressures in the range of about 25-40 mTorr, using 50-200 sccm of 10% $Si_2H_6$ in $H_2$ and 1-2 sccm $Cl_2$. FIG. 10 illustrates that defect density was found generally to decrease with decreasing $Cl_2$ flow for Si deposited using disilane/chlorine (see O'Neill FIG. 6). Accordingly, chlorine levels are preferably maintained at the lowest levels possible that still obtain the desired selectivity.

It is apparent from FIGS. 7-10 that in the Violette/O'Neill disilane/chlorine system, a combination of higher deposition temperatures and lower $Cl_2$ flow rates favors higher growth rates, but that the opposite combination (lower deposition temperatures and higher $Cl_2$ flow rates) favors selectivity, and that lower $Cl_2$ flow rates also favor low defect densities. Those skilled in the art recognize that these results (along with other knowledge known to the skilled artisan) may be used to develop a processing window for disilane/chlorine. Thus, with reference to the results shown in FIG. 7, it is only at temperatures above 750° C. and at $Cl_2$ flows below 5 sccm that Violette considers the use of disilane/chlorine to be suitable for highly selective deposition in single wafer manufacturing (see Violette p. 3294). Likewise, while O'Neill recognizes that reducing deposition temperature may increase selectivity, O'Neill also realizes that Si growth may become inadequate at such lower temperatures due to the presence of Cl surface passivation, and teaches an optimum deposition temperature of "around 800° C." (see O'Neill p. 3312).

Prior to the inventions described herein, those skilled in the art would not have considered trisilane to be an appealing candidate for use in selective depositions because trisilane depositions are known to be advantageous for non-selective processes, due to excellent nucleation uniformity across mixed substrates. In addition, modifying the Violette/O'Neill disilane/chlorine process by replacing disilane with trisilane would have been considered problematic because trisilane depositions are generally conducted at temperatures below those considered optimal by Violette and O'Neill (see U.S. Pat. No. 6,900,115). For example, as noted above, Violette teaches that silicon growth rates are limited by Cl passivation at the lower temperatures that are typically used for trisilane depositions.

Surprisingly, it has also been found that embodiments of the trisilane/chlorine process described herein may be used to selectively deposit Si-containing materials while simultaneously achieving two or more performance goals that were previously considered impractical, difficult or impossible to achieve by other selective deposition processes. For example, in various embodiments, a trisilane/chlorine process may be used to selectively deposit a Si-containing material while simultaneously achieving two or more of the following: a relatively high deposition rate (e.g., greater than about 5 nm/min, preferably greater than about 10 nm/min); high selectivity (e.g., greater than about 99%), and a relatively low deposition temperature (e.g., lower than about 750° C., preferably lower than about 725° C.). In embodiment, selective deposition may be achieved at deposition temperatures about 700° C. or less, preferably about 650° C. or less, more preferably about 600° C. or less, even more preferably about 550° C. or less.

Under the chemical vapor deposition (CVD) conditions taught herein, the delivery of trisilane and chlorine gas to a reactor housing the surface of a substrate preferably results in the formation of an epitaxial Si-containing film selectively over single crystal substrates. Preferably, delivery of the trisilane and chlorine gas to a reactor housing the substrate surface is accomplished by introducing trisilane and chlorine gas, either individually or after intermixing to form a feed gas, to a suitable deposition chamber having the substrate disposed therein. Deposition may be suitably conducted according to the various CVD methods known to those skilled in the art, but the greatest benefits are obtained when deposition is conducted according to the CVD methods taught herein. The disclosed methods may be suitably practiced by employing CVD, including plasma-enhanced chemical vapor deposition (PECVD) or thermal CVD, utilizing trisilane vapor and chlorine gas to selectively deposit an epitaxial Si-containing film onto exposed windows of the substrate within a CVD chamber. In some embodiments, the selectively deposited Si-containing film is a carbon-doped epitaxial Si film. In other embodiments, a germanium source is introduced to the reactor in conjunction with the trisilane and chlorine to thereby selectively deposit a single crystalline SiGe film as the Si-containing film. In some embodiments, a dopant source is introduced to the CVD reactor in conjunction with the trisilane and chlorine to thereby selectively deposit a doped single crystalline Si-containing film. Reference may be made herein to the use of trisilane and chlorine to selectively deposit certain kinds of Si-containing films (e.g., epitaxial Si films). It will be recognized that those descriptions are also generally applicable to other Si-containing films, e.g., to the deposition of SiGe films (e.g., involving the use of a germanium source), to the deposition of SiC and SiGeC films, and to the deposition of electrically doped SiGe, SiC and SiGeC films (e.g., involving the use of a dopant precursor for an electrically active dopant), unless otherwise stated. Thermal CVD is preferred, as selective deposition can be achieved effectively without the risk of damage to substrates and equipment that attends plasma processing.

Trisilane and chlorine are preferably introduced to the chamber in the form of gases or by intermixing to form a feed gas. The intermixing to form the feed gas may take place in the chamber or prior to introduction of the feed gas to the chamber. The total pressure in the CVD chamber is preferably in the range of about 0.001 Torr to about 1000 Torr, more preferably in the range of about 0.1 Torr to about 350 Torr, most preferably in the range of about 0.25 Torr to about 100 Torr. Experiments were conducted with pressures ranging from 0.25 Torr to 100 Torr. Chamber pressures of about at least about 500 mTorr were suitable in single wafer, single pass, laminar horizontal flow reactor in which the experiments were conducted, as described below. The chamber pressure may be referred to herein as a deposition pressure. The partial pressure of trisilane is preferably in the range of about 0.0001% to about 100% of the total pressure, more preferably about 0.001% to about 50% of the total pressure. The feed gas can also include a gas or gases other than trisilane, such as other silicon sources, carbon source(s), dopant precursor(s) and/or inert carrier gases, but preferably trisilane is the sole source of silicon. The term "dopant precursor(s)" is used herein to refer in a general way to various materials that are precursors to various elements (e.g., carbon, germanium, boron, gallium, indium, arsenic, phosphorous, and/or antimony) that may be incorporated into the resulting deposited film in relatively minor amounts (as compared to silicon). It will be recognized that silicon sources may also be considered dopant precursors for the deposition of SiGe films that contain relatively minor amounts of silicon. He, Ar, $H_2$, $N_2$ are possible carrier gases for the methods described herein. In certain embodiments, the carrier gas is a non-hydrogen carrier such as He, Ar and/or $N_2$ as described in greater detail below. Preferably, trisilane is introduced to the chamber by way of a vaporizer such as a bubbler used with a carrier gas to entrain trisilane vapor, more preferably by way of a delivery system comprising a bubbler and a gas concentration sensor that measures the amount of trisilane in the carrier gas flowing from the bubbler. Such sensors are commercially available, e.g., Piezocon® gas concentration sensors from Lorex Industries, Poughkeepsie, N.Y., U.S.A.

Examples of suitable carbon sources that may be included in the feed gas include without limitation silylalkanes such as monosilylmethane, disilylmethane, trisilylmethane, and tetrasilylmethane and/or alkylsilanes such as monomethyl silane (MMS), and dimethyl silane. In some embodiments, a carbon source comprises $H_3Si-CH_2-SiH_2-CH_3$ (1,3-disilabutane).

The feed gas may also contain other materials known by those skilled in the art to be useful for doping or alloying Si-containing films, as desired, such as a supplemental silicon source, germanium source, supplemental chlorine source, boron source, gallium source, indium source, arsenic source, phosphorous source, and/or antimony source. Specific examples of such sources include: silane, disilane and tetrasilane as supplemental silicon sources; germane, digermane and trigermane as germanium sources; monosilylmethane, disilylmethane, trisilylmethane, tetrasilylmethane, monomethyl silane (MMS) and dimethyl silane as sources of both carbon and silicon; and various dopant precursors as sources of electrically active dopants (both n-type and p-type) such as antimony, arsenic, boron, gallium, indium and phosphorous. Chlorosilylmethanes of the general formula $(SiH_{3-z}Cl_z)_x$ $CH_{4-x-y}Cl_y$, where x is an integer in the range of 1 to 4 and where y and z are each independently zero or an integer in the range of 1 to 3, with the provisos that $x+y \leq 4$ and at least one of y and z is not zero, have been found to be particularly useful as sources of carbon, silicon and chlorine. Alkylhalosilanes of the general formula $X_aSiH_b(C_nH_{2n+1})_{4-a-b}$ are also particularly useful as sources of carbon, silicon and chlorine, where X is a halogen (e.g., F, Cl, Br); n is 1 or 2; a is 1 or 2; b is 0, 1 or 2; and the sum of a and b is less than 4. Methyldichlorosilane ($Cl_2SiH(CH_3)$) is an example of an alkylhalosilane of the formula $X_aSiH_b(C_nH_{2n+1})_{4-a-b}$.

Incorporation of electrically active dopants into Si-containing films by CVD using trisilane is preferably accomplished by in situ doping using dopant sources or dopant precursors in the feed gas. Preferred precursors for electrically active dopants are dopant hydrides, including p-type dopant precursors such as diborane, deuterated diborane, and n-type dopant precursors such as phosphine, arsenic vapor, and arsine. Silylphosphines, e.g., $(H_3Si)_{3-x}PR_x$, and silylarsines, e.g., $(H_3Si)_{3-x}AsR_x$, where x=0-2 and $R_x$=H and/or deuterium (D), are alternative precursors for phosphorous and arsenic dopants. $SbH_3$ and trimethylindium are alternative sources of antimony and indium, respectively. Such dopant precursors are useful for the preparation of preferred films as described below, preferably boron-, phosphorous-, antimony-, indium-, and arsenic-doped silicon, Si:C, SiGe and SiGe:C films and alloys.

The amount of dopant precursor in the feed gas may be adjusted to provide the desired level of dopant in the Si-containing film and/or for the desired surface quality in the selectively deposited layer. Preferred concentrations in the feed gas are in the range of about 1 part per billion (ppb) to about 20% by weight based on the weight of total reactive gas (excluding inert carrier and diluent gases), preferably between about 0.1 sccm to 5 sccm of pure phosphine (or equivalent diluted phosphine) or arsine or diborane although higher or lower amounts are sometimes preferred in order to achieve the desired property in the resulting film. In the preferred Epsilon™ series of single wafer reactors, dilute mixtures of dopant precursor in a carrier gas can be delivered to the reactor via a mass flow controller with set points ranging from about 10 to about 1000 standard cubic centimeters per minute (sccm), depending on desired dopant concentration and dopant gas concentration. Dilution of dopant gases can lead to factors of $10^{-7}$ to $10^{-2}$ to arrive at equivalent pure dopant flow rates. Typically commercially available dopant sources are dopant hydrides diluted in $H_2$. However, as described below with respect to FIGS. 26-27, in some embodiments dopant precursors are diluted in a non-hydrogen gas. The dilute mixture is preferably further diluted by mixing with trisilane, chlorine, any suitable carrier gas, and any desired dopant precursor for substitutional doping, such as a strain-influencing precursor (e.g., a germanium source such as germane or a carbon source such as monomethyl silane). Since typical total flow rates for deposition in the preferred Epsilon™ series reactors often range from about 20 standard liters per minute (slm) to about 180 slm, the concentration of the dopant precursor used in such a method is generally small relative to total flow.

A suitable manifold may be used to supply feed gas(es) to the CVD chamber. The CVD chamber is preferably a single wafer reactor, e.g., a single wafer, horizontal gas flow CVD chamber as described in the illustrated embodiments. Most preferably, the CVD chamber is a single-wafer, single pass, laminar horizontal gas flow reactor, preferably radiantly heated. Suitable reactors of this type are commercially available, and preferred models include the Epsilon™ series of single wafer reactors commercially available from ASM America, Inc. of Phoenix, Ariz. While the methods described herein can also be employed in alternative reactors, such as a showerhead arrangement, benefits in increased uniformity and deposition rates have been found particularly effective in the horizontal, single-pass laminar gas flow arrangement of the Epsilon™ chambers, employing a rotating substrate, particularly with low process gas residence times. CVD may be conducted by introducing plasma products (in situ or downstream of a remote plasma generator) to the chamber, but as noted above, thermal CVD is preferred.

Preferably, chlorine and trisilane are introduced to the deposition reactor along with a hydrogen carrier gas, using a relatively high trisilane flow rate and a relatively low hydrogen flow rate, as compared to standard use of silane as the sole silicon precursor. For example, in a preferred embodiment thermal CVD is carried out in an Epsilon E2500™, E3000™ or E3200™ reactor system (available commercially from ASM America, Inc., of Phoenix, Ariz.) using a trisilane flow rate of about 5 mg/min to about 2,000 mg/min, more preferably between about 10 mg/min and about 200 mg/min. The hydrogen flow rate may be about 40 standard liters per minute (slm) or less, preferably about 10 slm or less, more preferably about 5 slm or less, and the deposition temperature may be in the range of about 450° C. to about 700° C., more preferably about 500° C. to about 650° C. As discussed in more detail below with respect to FIGS. 26-27, in one embodiment hydrogen gas is preferably minimized during selective deposition with trisilane/chlorine gas. Chlorine flow rates are preferably about 20 to about 200 sccm. Experiments were carried out with trisilane flows of 25-400 mg/min, $H_2$ carrier flow rates of 0-4 slm, and chlorine flow rates of 25-200 sccm. Dopant precursor (e.g., carbon source, germanium source and/or electrically active dopant precursor) flow rates are typically in the range of from about 5 sccm to about 500 sccm, depending on the nature of the dopant source and the relative flow rates of the other components. For example, for phosphorus doping, dopant hydride (precursor) flow rates are preferably from 10-200 sccm of phosphine (1% $PH_3$ in $H_2$).

Thermal CVD is preferably conducted at a substrate temperature that is effective to selectively deposit a crystalline Si-containing film over the substrate. Preferably, thermal CVD is conducted at a temperature in the range of about 350° C. to about 900° C., more preferably about 500° C. to about 800° C., even more preferably in the range of about 500° C. to about 700° C. In a preferred low temperature trisilane/chlorine deposition embodiment, thermal CVD is conducted at a temperature in the range of about 500° C. to about 600° C., more preferably about 525° C. to about 575° C. In a preferred intermediate temperature trisilane/chlorine deposition embodiment, thermal CVD is conducted at a temperature in the range of about 700° C. to about 800° C. In an embodiment, the chemical vapor deposition conditions comprise a temperature that is at about a transition temperature between substantially mass-transport controlled deposition conditions and substantially kinetically controlled deposition conditions for trisilane. Such trisilane deposition conditions are described in U.S. Pat. No. 6,821,825, which is hereby incorporated by reference and particularly for the purpose of describing trisilane deposition conditions. PECVD is preferably conducted at a temperature in the range of about 300° C. to about 700° C. Those skilled in the art can adjust these temperature ranges to take into account the realities of actual manufacturing, e.g., preservation of thermal budget, deposition rate, different sizes of chambers, including single wafer and batch reactors, preferred total pressures and partial pressures etc. In general, higher partial pressures entail lower temperatures for a given desired result, whether it be deposition rate, layer quality or a combination of the two. The substrate can be heated by a variety of methods known in the art, e.g., resistive heating and lamp heating.

The relative amounts of the various feed gas components may be varied over a broad range depending on the composition desired for the resulting Si-containing film and the deposition conditions employed (e.g., temperature, pressure, deposition rate, etc.), and may be determined by routine experimentation in view of the guidance provided herein. The feed gas components may be intermixed and then delivered to the chamber or substrate, or the feed gas may be formed by mixing the components at or near the substrate, e.g., by supplying the feed gas components to the CVD chamber separately.

FIGS. 11-16 summarize the results of deposition experiments conducted with trisilane. Those skilled in the art will find the data shown in FIGS. 11-16 to be useful for guiding the selection of various deposition parameters for particular trisilane/chlorine selective deposition applications.

Figure 11:
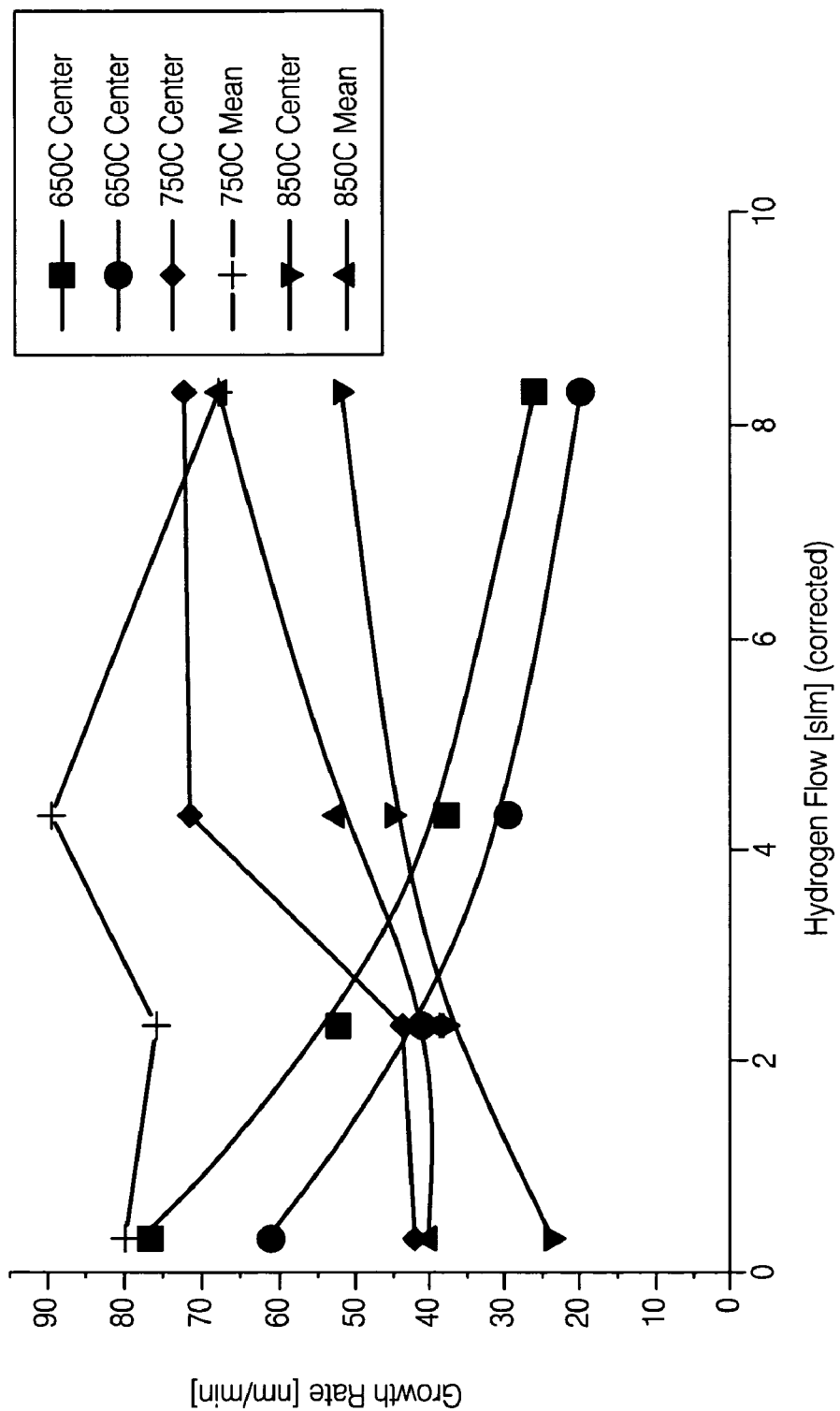
FIG. 11 is a graph showing deposition rate on silicon as a function of hydrogen flow for depositions employing trisilane, chlorine and hydrogen carrier gas, in accordance with preferred embodiments of the present invention.

FIG. 11 is a plot illustrating that, at temperatures of about 650° C. and lower, deposition (growth) rates decrease with increasing $H_2$ carrier gas flow. In contrast, at higher than about 750° C., deposition rates tend to increase with increasing $H_2$ carrier gas flow, as increased $H_2$ carrier gas flows and/or reduced pressures tend to reduce depletion effects. As explained in more detail below with respect to FIGS. 26-27, in some embodiments it is desirable to minimize hydrogen gas in the system, and preferably replace hydrogen gas with non-hydrogen inert gas as a carrier gas and/or dopant gas diluent.

Figure 12:
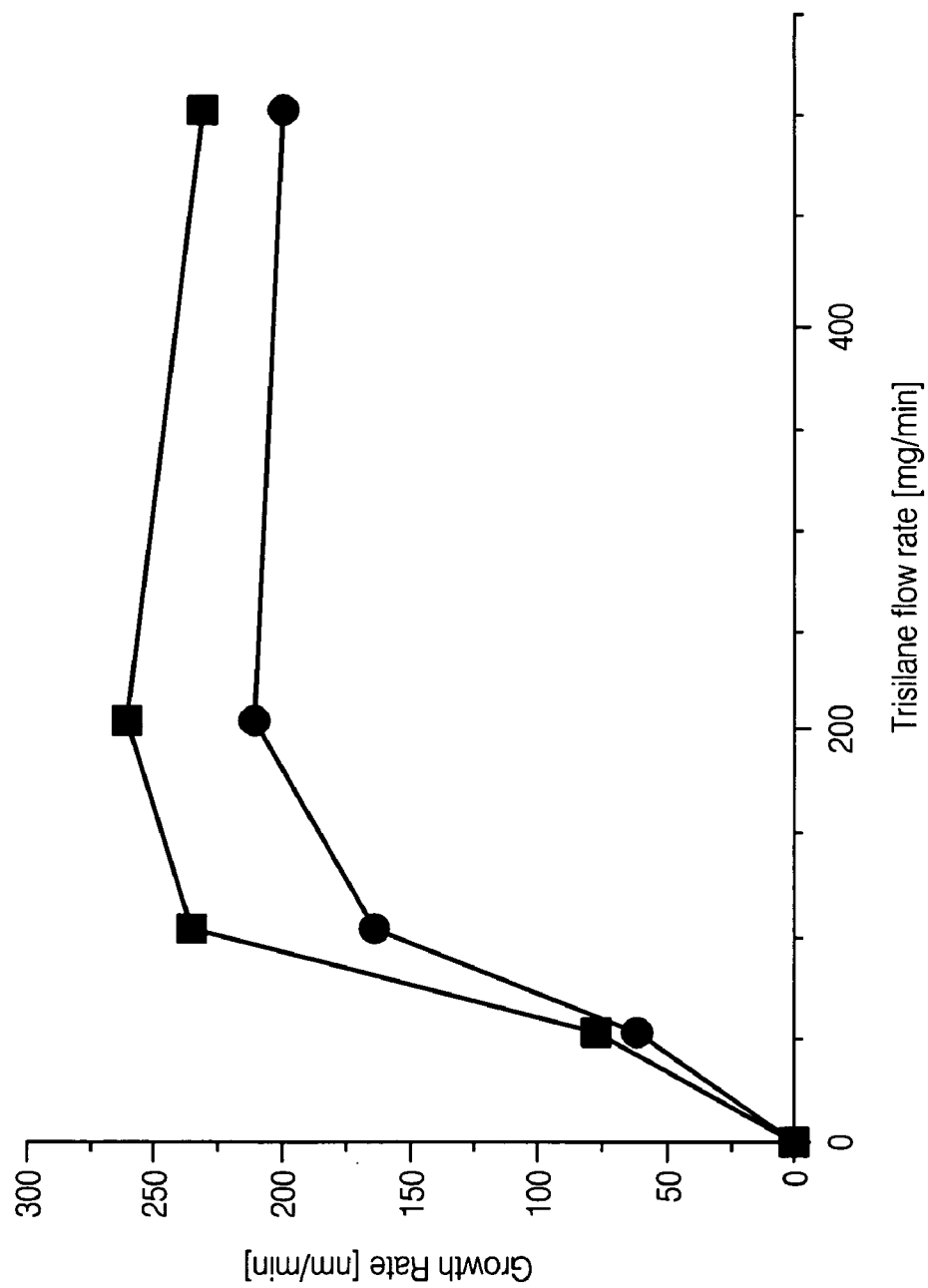
FIG. 12 is a graph showing deposition rate on silicon as a function of trisilane flow.
Figure 13:
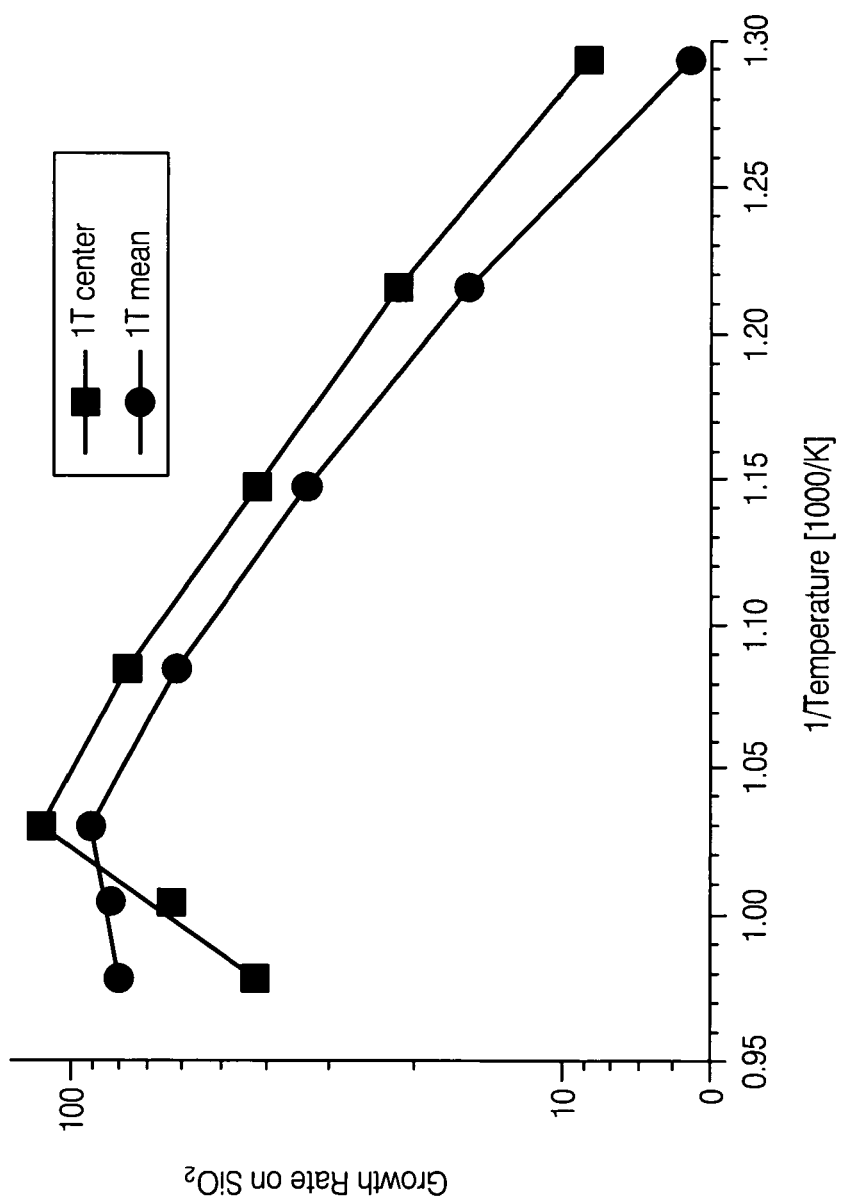
FIG. 13 is a graph showing deposition rate on silicon oxide as a function of inverse temperature (deposition pressure=IT=1 Torr).
Figure 14A:
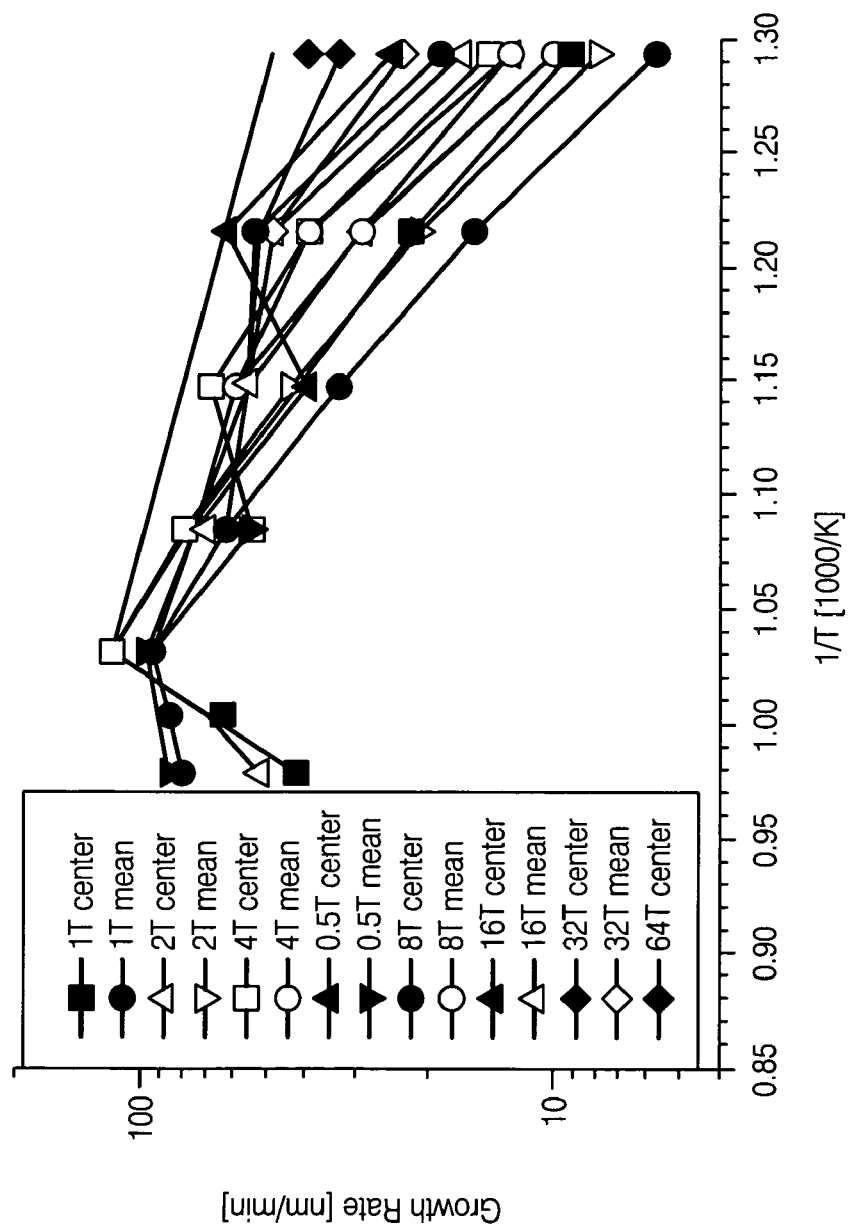
FIGS. 14A-D are a series of graphs illustrating deposition rate on silicon as function of inverse temperature and pressure (T=Torr) for depositions employing trisilane, chlorine and hydrogen carrier gas.
Figure 14B:
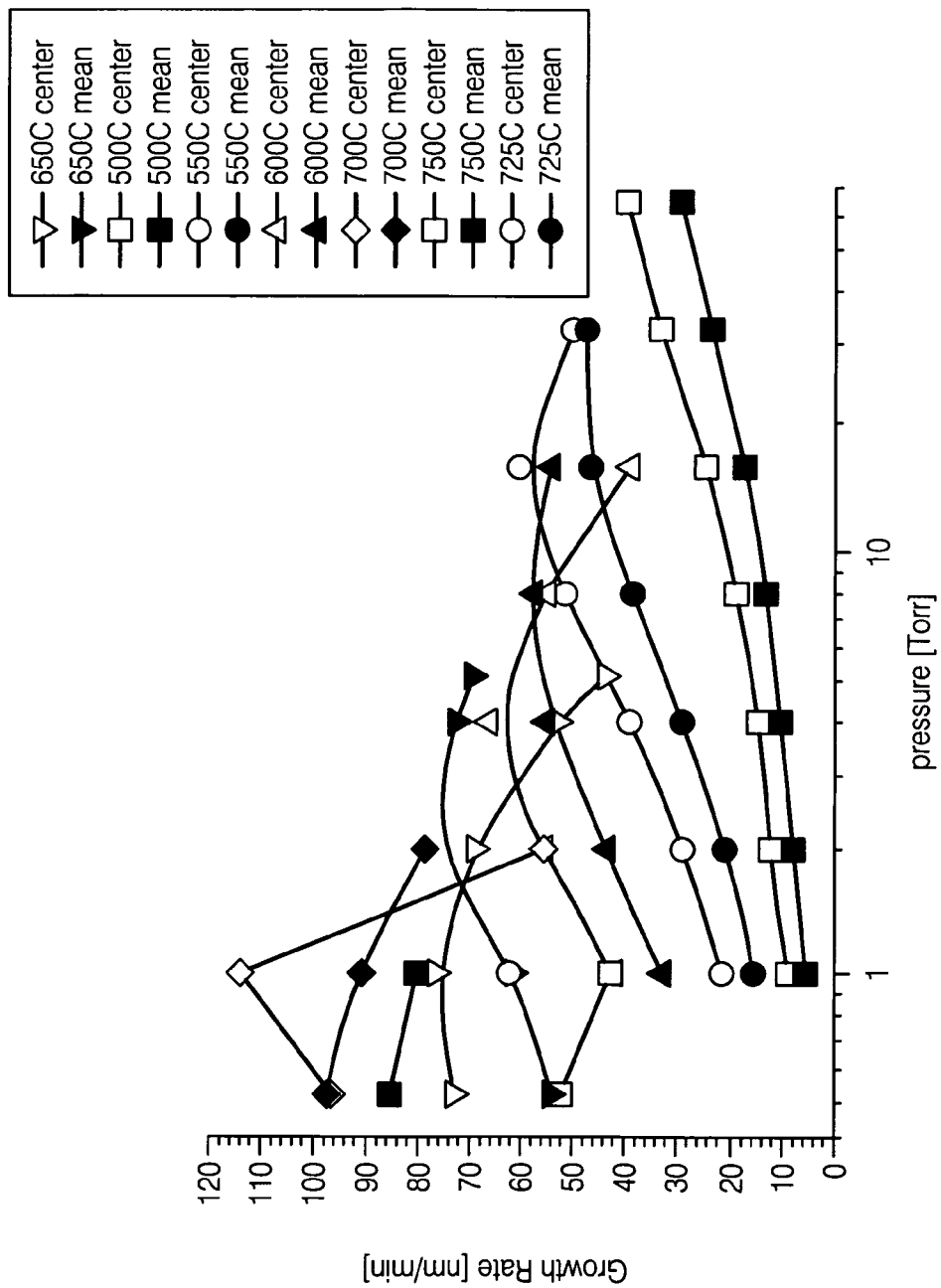
Figure 14C:
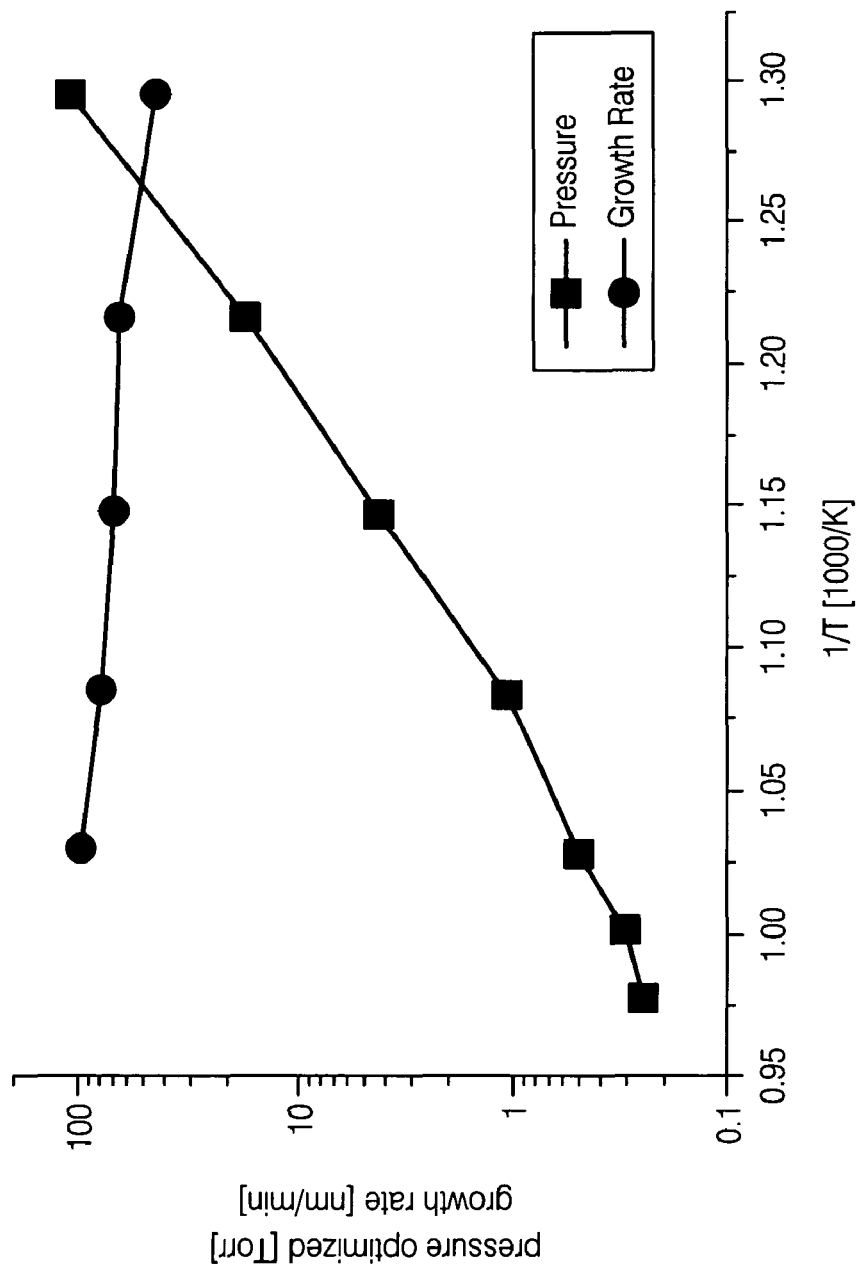
Figure 14D:
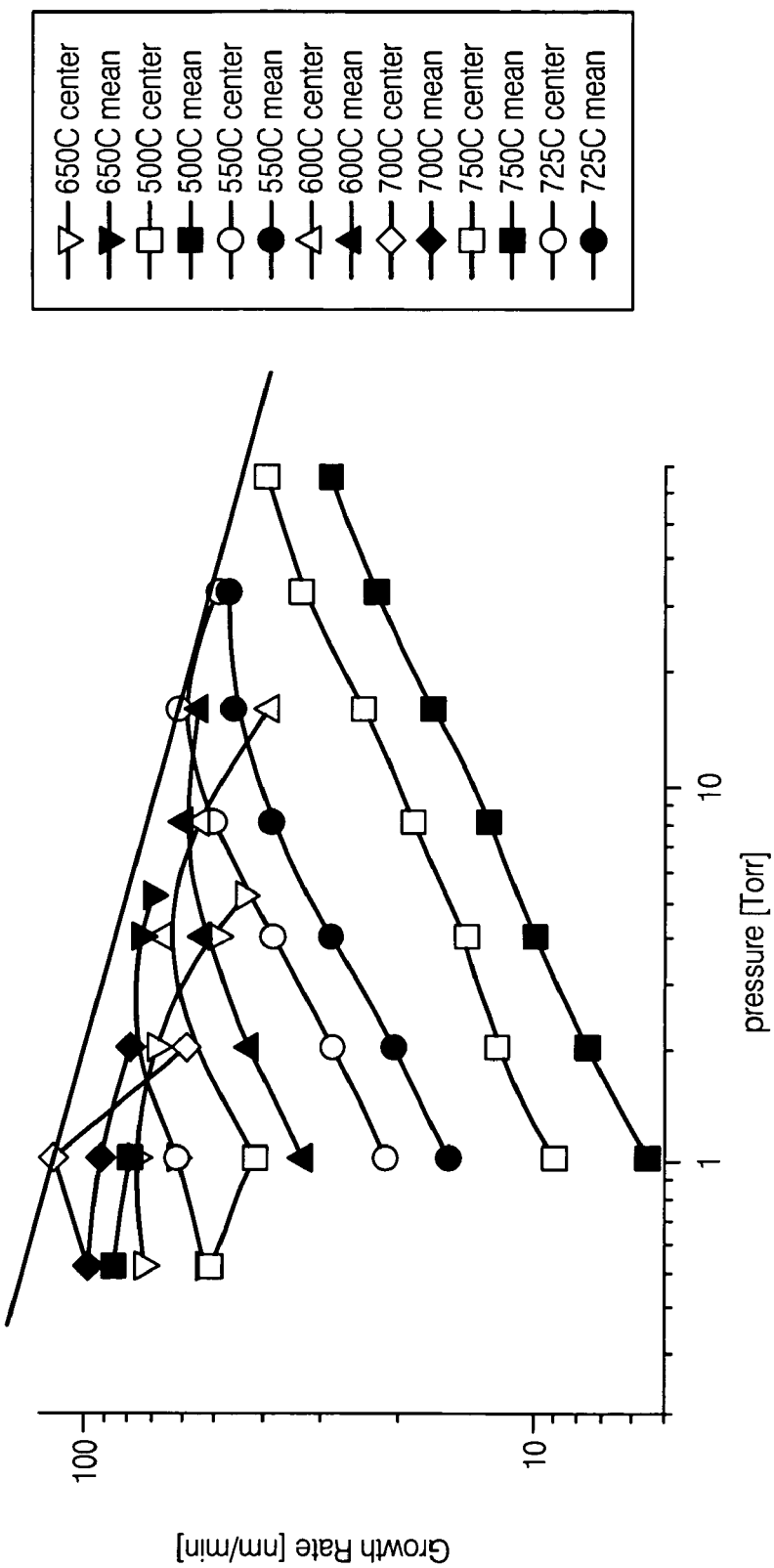

FIG. 12A is a plot illustrating that increased trisilane flow increases deposition rates (data obtained at 1 Torr, 650° C., 0.33 to 3.3 slm $H_2$ carrier gas, without chlorine). Deposition rates of about 150 nm/min or greater were obtained at trisilane flow rates of about 100 mg/min or higher. FIG. 12 B is a plot illustrating that FIG. 13 is a plot illustrating that trisilane deposition rates on $SiO_2$ (non-single crystalline) in the absence of chlorine are significant and increase with increasing temperature (data obtained at 1 Torr deposition pressure, 50 mg/min trisilane flow, 0.33 slm $H_2$ carrier gas, without chlorine; growth rate in units of nm/min).

FIGS. 14A-D are plots illustrating that trisilane deposition rates generally increase with increasing chamber pressure, for a given temperature, and that the deposition is less sensitive to pressure changes at particular temperature ranges.

Figure 15:
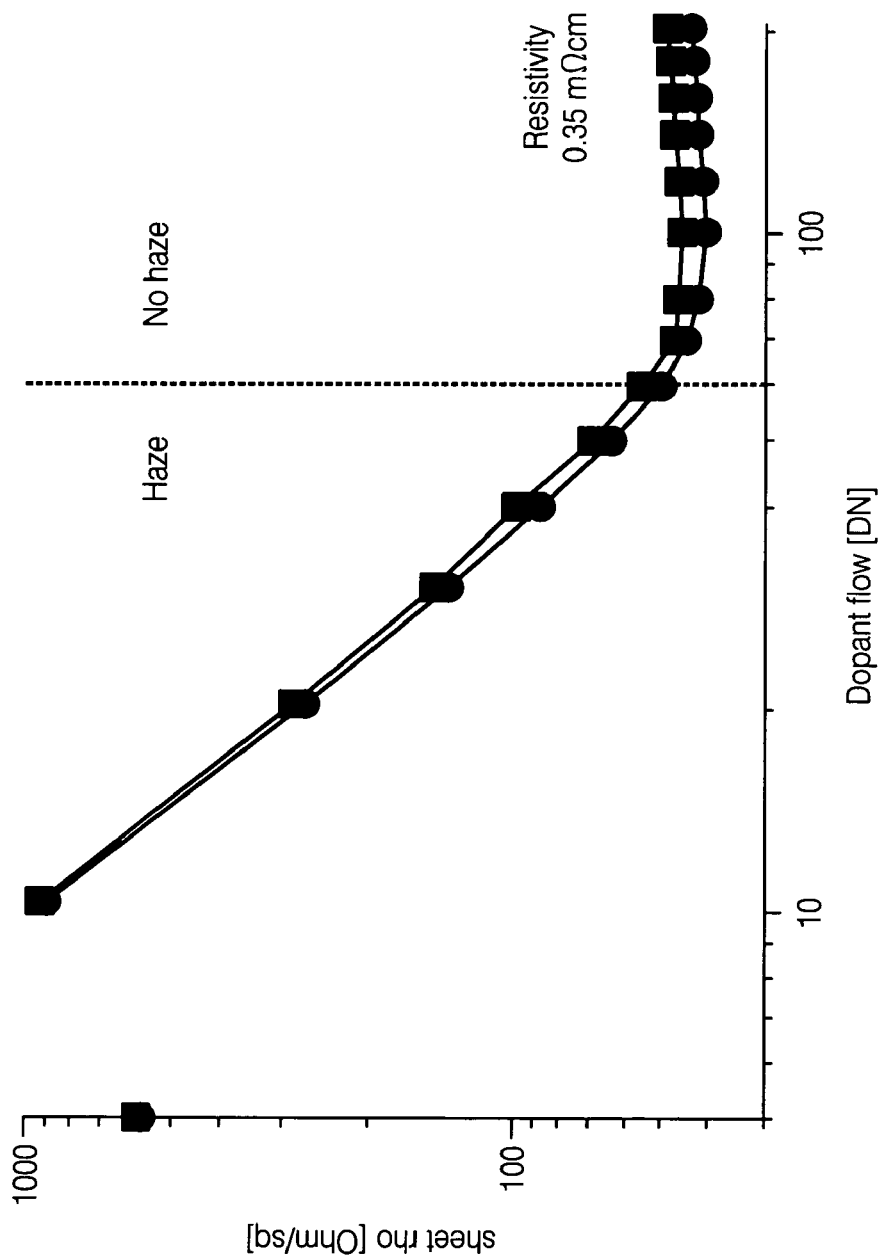
FIG. 15 is a graph showing sheet resistance as a function of dopant flow rates for depositions employing trisilane, chlorine and hydrogen carrier gas.

FIG. 15 is a plot illustrating that higher dopant flow decreases resistivity. The data was generated using trisilane and phosphine at 550° C. and 16 Torr. The phosphine flow rate on the x-axis is in units of standard cubic centimeters per minute (sccm) for 1% phosphine in $H_2$ (referred to as "dopant number" or "DN" herein). The extremely low resistivities obtained indicate that extraordinarily high dopant incorporation levels may be obtained by in situ selective deposition employing trisilane and chlorine. No haze was observed at flow rates of about 50 DN or greater.

Figure 16A:
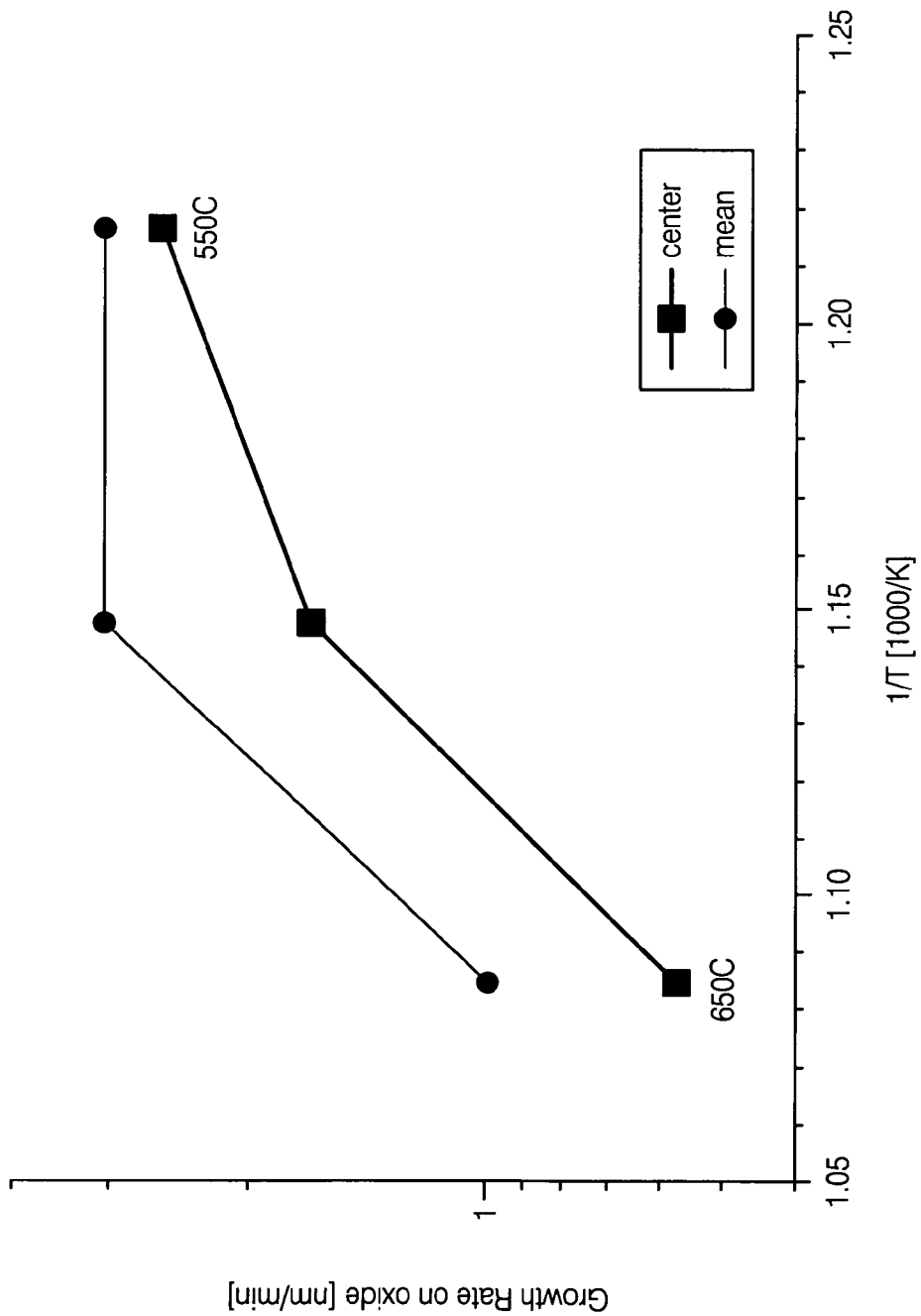
FIG. 16A is a graph showing the deposition rate of silicon on silicon oxide as a function of inverse temperature, using trisilane and chlorine gas without a hydrogen carrier gas.
Figure 16B:
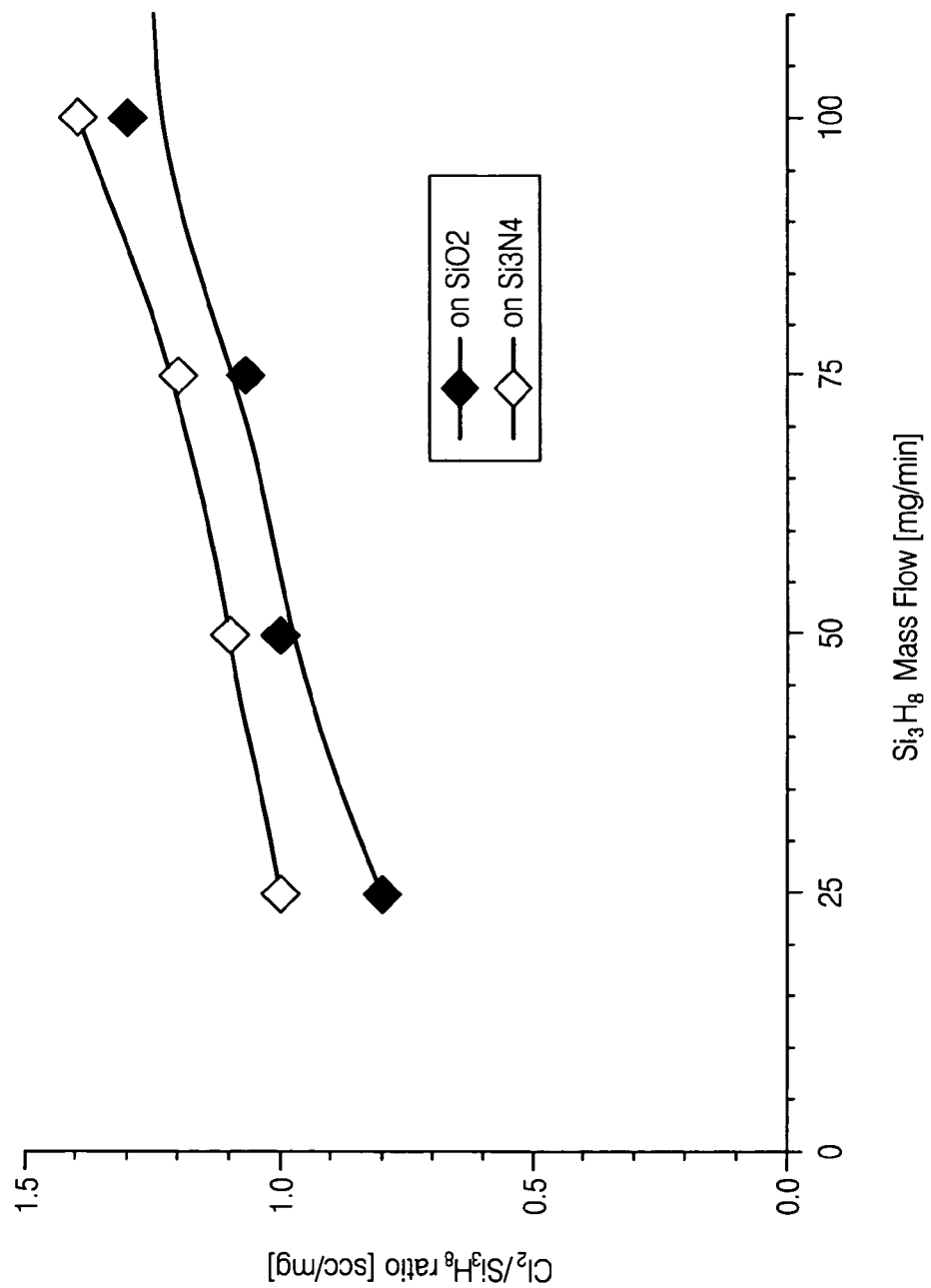
FIG. 16B is a plot illustrating the $Cl_2$/trisilane flow rate ratios at which deposition on single crystal silicon is substantially 100% selective against silicon oxide ($SiO_2$) and silicon nitride ($Si_3N_4$), under the deposition conditions used in this set of experiments (550° C., 16 Torr, no main carrier gas flow).

FIG. 16A is a plot illustrating that increased deposition temperatures tend to reduce deposition rates on oxide (data obtained at 8 Torr deposition pressure, 50 mg/min trisilane flow, no $H_2$ carrier gas, 200 sccm chlorine; growth rate on oxide substrate in units of nm/min). Since trisilane deposition rates generally tend to increase with increasing temperature (see FIG. 14A), the data shown in FIG. 16A indicate that trisilane/chlorine deposition selectivity increases with increasing deposition temperature. FIG. 16B is a plot illustrating the $Cl_2$/trisilane flow rate ratios at which deposition on single crystal silicon is substantially 100% selective against silicon oxide ($SiO_2$) and silicon nitride ($Si_3N_4$), under the deposition conditions used in this set of experiments (550° C., 16 Torr, no main carrier gas flow). Helium was used as a carrier gas to vaporize trisilane supplied in a bubbler (60 sccm He at 25 mg/min trisilane, 120 sccm He at 50 mg/min trisilane, and 240 sccm He at 100 mg/min trisilane). Deposition was substantially 100% selective on single crystalline silicon against silicon oxide and silicon nitride at the higher $Cl_2$/trisilane flow rate ratio conditions indicated above the lines plotted in FIG. 16B, and less than 100% selective under the lower $Cl_2$/trisilane flow rate ratio conditions indicated below the lines plotted in plotted in FIG. 16B. FIG. 16B shows that higher relative chlorine flow rates are preferred as trisilane flow rates are increased in order to achieve a given level of selectivity.

Doped Si-Containing Films

Figure 17A:
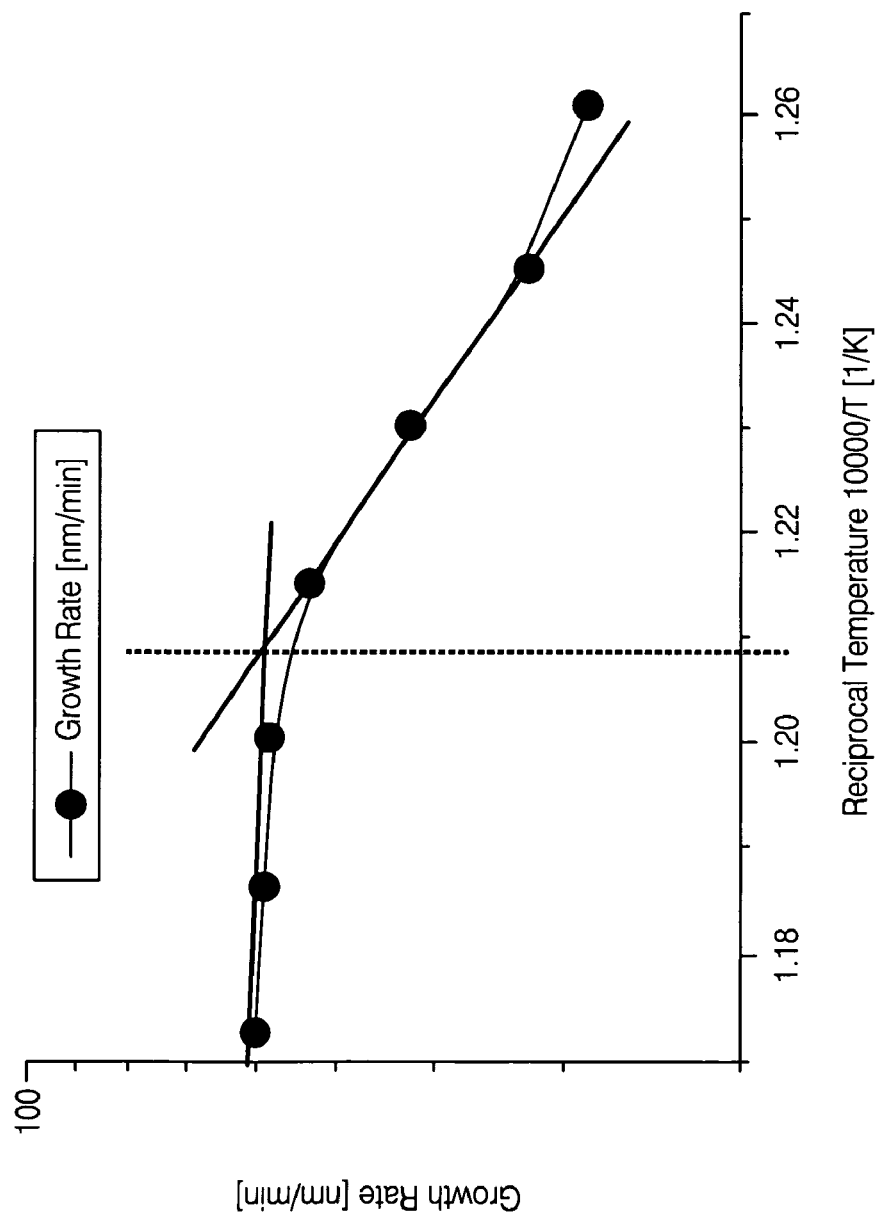
FIGS. 17A-D are a series of graphs illustrating growth rates, carbon incorporation into deposited films and resistivities for films deposited in accordance with preferred embodiments.
Figure 17B:
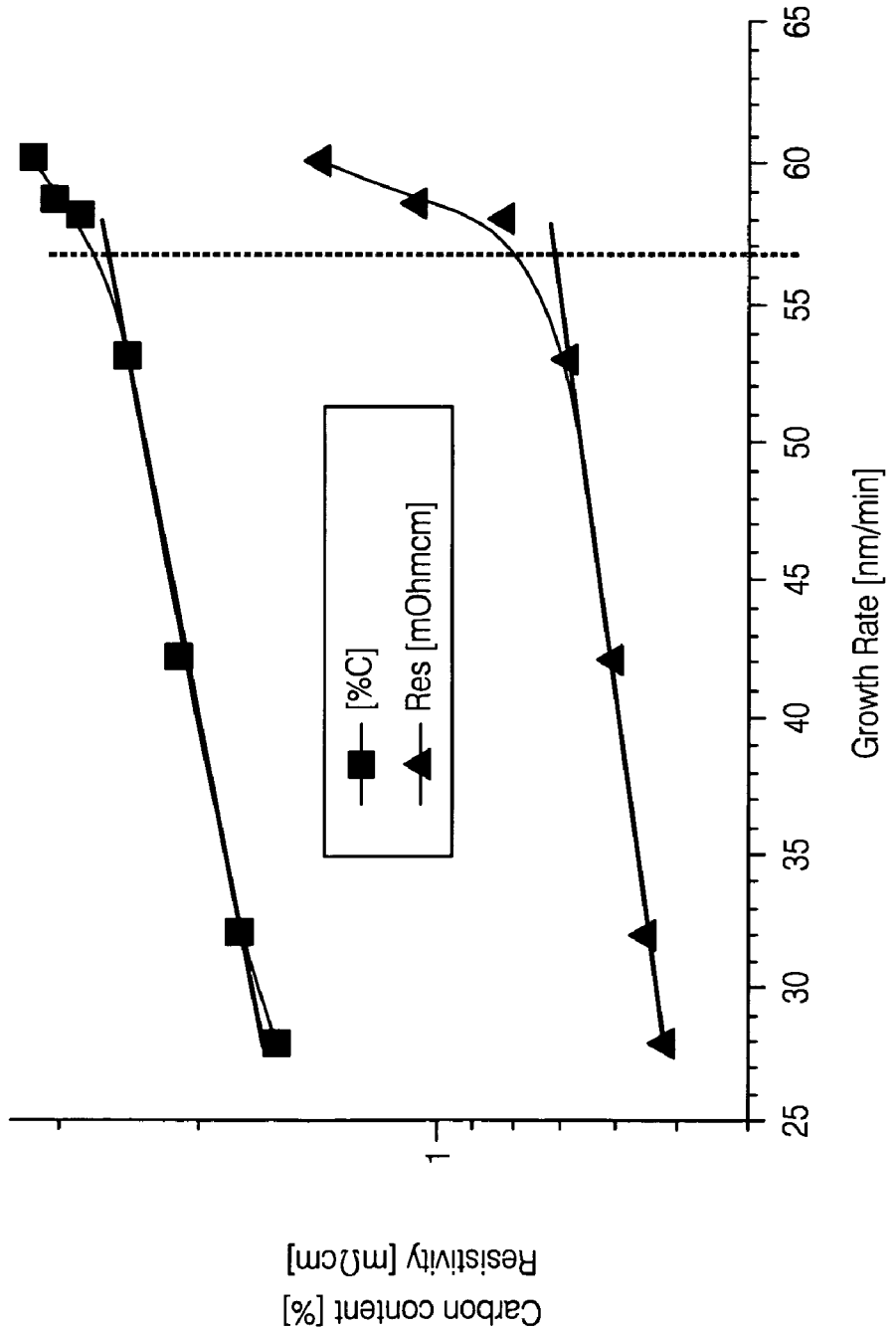
Figure 17C:
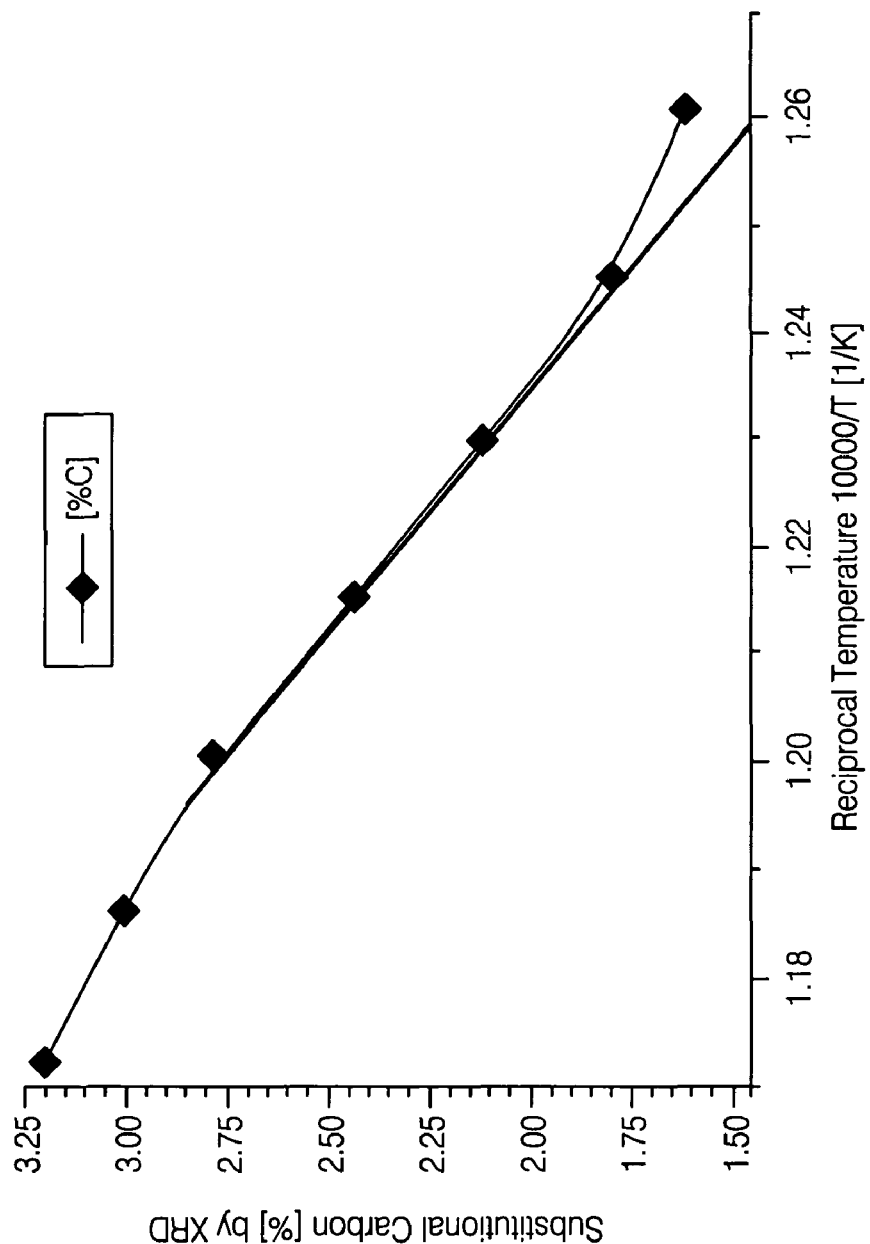
Figure 17D:
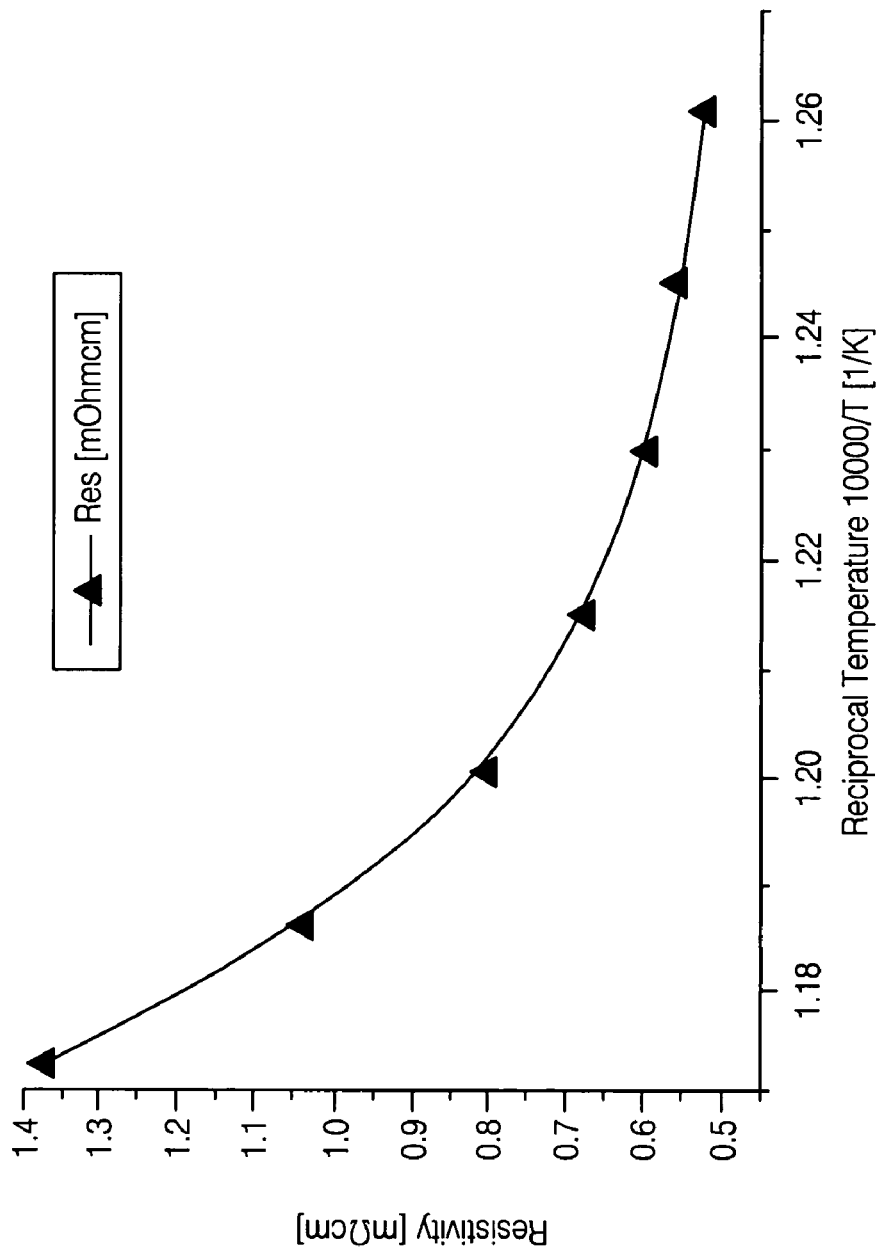

Advantageously, deposition from trisilane, whether or not selective, can also enable extremely high levels of carbon. High levels of substitutional carbon incorporation into the silicon may also be obtained by conducting the deposition at a relatively high growth rate using trisilane and a carbon source (and, in some embodiments, an optional dopant precursor for an electrically active dopant), whether or not selective. FIGS. 17A-D illustrate the effects of temperature and growth rate on the properties of electrically doped SiC films deposited using trisilane, a carbon source (MMS in the illustrated embodiments) and a Group III/V dopant source (arsine in the illustrated embodiments). FIGS. 17A-D illustrate carbon incorporation in a non-selective process; however, similar results may be obtained with selective processes upon addition of chlorine, particularly in combination with dopant hydrides. FIG. 17A is an Arrhenius plot illustrating the effect of temperature on film growth rate. FIG. 17B is another Arrhenius plot illustrating the effect of deposition temperature on substitutional carbon content, showing that higher levels of substitutional carbon are generally obtained at higher deposition temperatures. Under preferred deposition conditions, substitutional carbon incorporation levels can be in the range of about 1.0 atomic % to about 3.5 atomic %. FIG. 17C is a plot illustrating the effect of growth rate (a function of deposition temperature, see FIG. 17A) on substitutional carbon content and resistivity, showing that higher levels of substitutional carbon and higher resistivities are generally obtained at higher growth rates. FIG. 17D is another Arrhenius plot illustrating the effect of temperature on resistivity, showing that higher levels of resistivity are generally obtained at higher deposition temperatures.

As is known in the art, the lattice constant for single crystal silicon is about 5.431 Å, whereas single crystal carbon in the form of diamond has a lattice constant of 3.567 due to the small size of the carbon atoms. Accordingly, tensile strain may be introduced into single crystalline silicon by substitutional doping with carbon, because carbon atoms are smaller than the silicon atoms that they replace. The amount of carbon substitutionally doped into silicon may be determined by measuring the perpendicular lattice spacing of the doped silicon by x-ray diffraction, then applying Vegard's law (linear interpolation between single crystal silicon and single crystal carbon). Those skilled in the art are aware of Vegard's law and the relationships between substitutional carbon level, lattice spacing and strain. See, e.g., Judy L. Hoyt, "Substitutional Carbon Incorporation and Electronic Characterization of $Si_{1-y}C_y$/Si and $Si_{1-x-y}Ge_xC_y$/Si Heterojunctions," Chapter 3 in "Silicon-Germanium Carbon Alloy," Taylor and Francis, N Y, pp. 59-89, 2002, the disclosure of which is incorporated herein by reference. As illustrated in FIG. 3.10 at page 73 of the aforementioned article by Hoyt, prior deposition methods have provided silicon having a substitutional carbon content of up to 2.3%, which corresponds to a lattice spacing of over 5.4 Å and a tensile stress of less than 1.0 GPa. FIG. 3.10 also illustrates that the total carbon content in the doped silicon may be determined by SIMS, and thus that the non-substitutional carbon content may be determined by subtracting the substitutional carbon content from the total carbon content.

A carbon-doped single crystalline Si-containing films may further comprise an electrically active dopant, e.g., a dopant selected from the group consisting of phosphorous and arsenic. In general, the presence of substitutional carbon results in scattering that tends to increase resistivity, as compared to an otherwise similar electrically-doped single crystalline Si-containing film that does not contain substitutional carbon. However, when deposited using trisilane as described herein, it has been found that such electrically-doped single crystalline Si-containing films may still have surprisingly low resistivities, despite the presence of the carbon. For example, when doped (preferably substitutionally doped) with an electrical dopant, the single crystalline Si-containing film comprising substitutional carbon may have a resistivity of about 1.0 mΩ·cm or less, preferably about 0.7 mΩ·cm or less. In experiments, a lattice spacing of about 5.323 Å (as measured by X-ray diffraction) has now been achieved for SiC (silicon substitutionally doped with carbon) deposited from trisilane, arsine and monomethyl silane. This lattice spacing of 5.323 Å corresponds to a substitutional carbon level of about 3.25%. When constrained to an underlying silicon template (e.g., lattice spacing about 5.43 Å), the tensile stress in such SiC layers amounts to 2.06 GPa. More generally, the stress produced is preferably between 1 GPa and 3 GPa. The deviation from silicon's natural lattice constant introduces stress and a corresponding strain that advantageously improves electrical carrier mobility in semiconductors, improving device efficiency. When the SiC is deposited to less than the critical thickness of the material, the deposited layer remains tensile stressed. In an embodiment, an electrically doped Si:C or SiGe film is configured to exert a strain on an adjacent layer. For example, a compressive strain may be exerted on a silicon film that is deposited onto an electrically doped relaxed Si:C layer. In an embodiment, an electrically doped Si:C film that is selectively formed in a recessed source/drain region exerts a tensile strain on a silicon channel formed between the source and drain, as described in greater detail below. Such configurations may be used in various applications, e.g., to improve electron mobility for NMOS devices.

In the embodiments of FIGS. 1-5, the SiC layer is selectively formed in recessed source/drain regions 20, and is preferably deposited under conditions (thickness, temperature) that maintain stress. The smaller lattice constant of the SiC material filling the S/D recesses exerts tensile strain on the channel region 22 therebetween. Preferably a dopant hydride is added to the feed gas, in addition to the trisilane, chlorine and carbon source. Preferably arsine or phosphine are employed. An embodiment provides a method of forming an integrated circuit, the method comprising: patterning a substrate to define exposed semiconductor surfaces and insulating regions; and providing trisilane and chlorine gas, thereby selectively depositing an epitaxial film on the exposed semiconductor surfaces. The trisilane and chlorine gas may be intermixed to form a feed gas that is contacted with the substrate to deposit the film, e.g., under chemical vapor deposition conditions. Two or more of the various components of the feed gas may be mixed together in any order, simultaneously or in stages, and the mixing may occur prior to or after introducing the feed gas to the chamber. Thus, for example, providing chlorine gas and trisilane may involve intermixing at the substrate or prior intermixing to form a feed gas that is then carried to the substrate, e.g., using a carrier gas. Other additive gases such as a dopant source (e.g., a carbon source, a germanium source and/or electrically active dopant precursor) may also be intermixed to form the feed gas. The dopant source may be provided along with the trisilane and chlorine to selectively deposit a doped epitaxial film on the exposed semiconductor surfaces. For example, in the embodiments of FIGS. 1-5, a carbon or germanium source is provided along with the trisilane and chlorine.

Figure 18A:
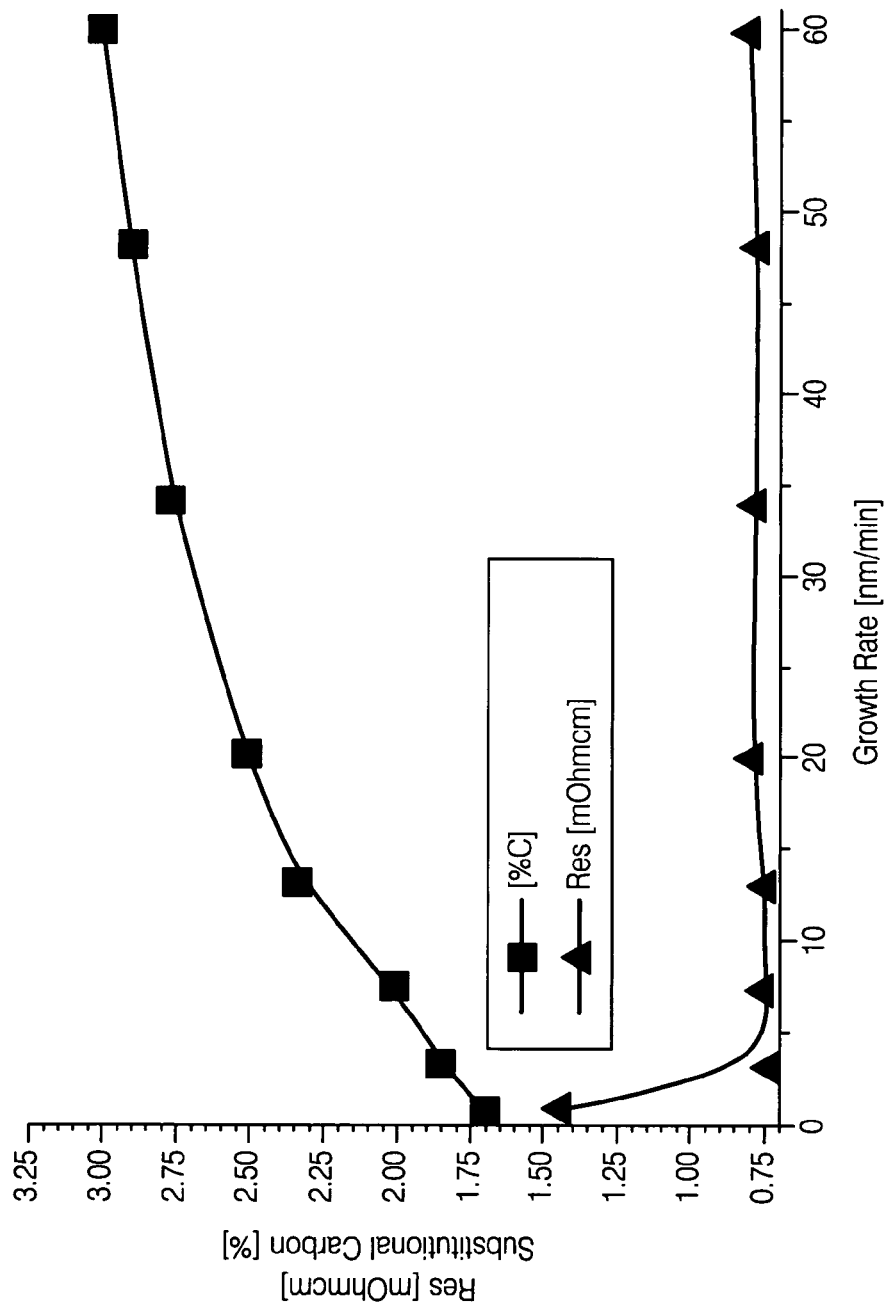
FIG. 18A is a graph showing percent substitutional carbon as a function of growth rate (nanometers per minute, nm/min) for silicon films substitutionally doped with both carbon and arsenic. The graph in FIG. 18A also shows the resistivity of those films (units of mΩ·cm, also left axis).
Figure 18B:
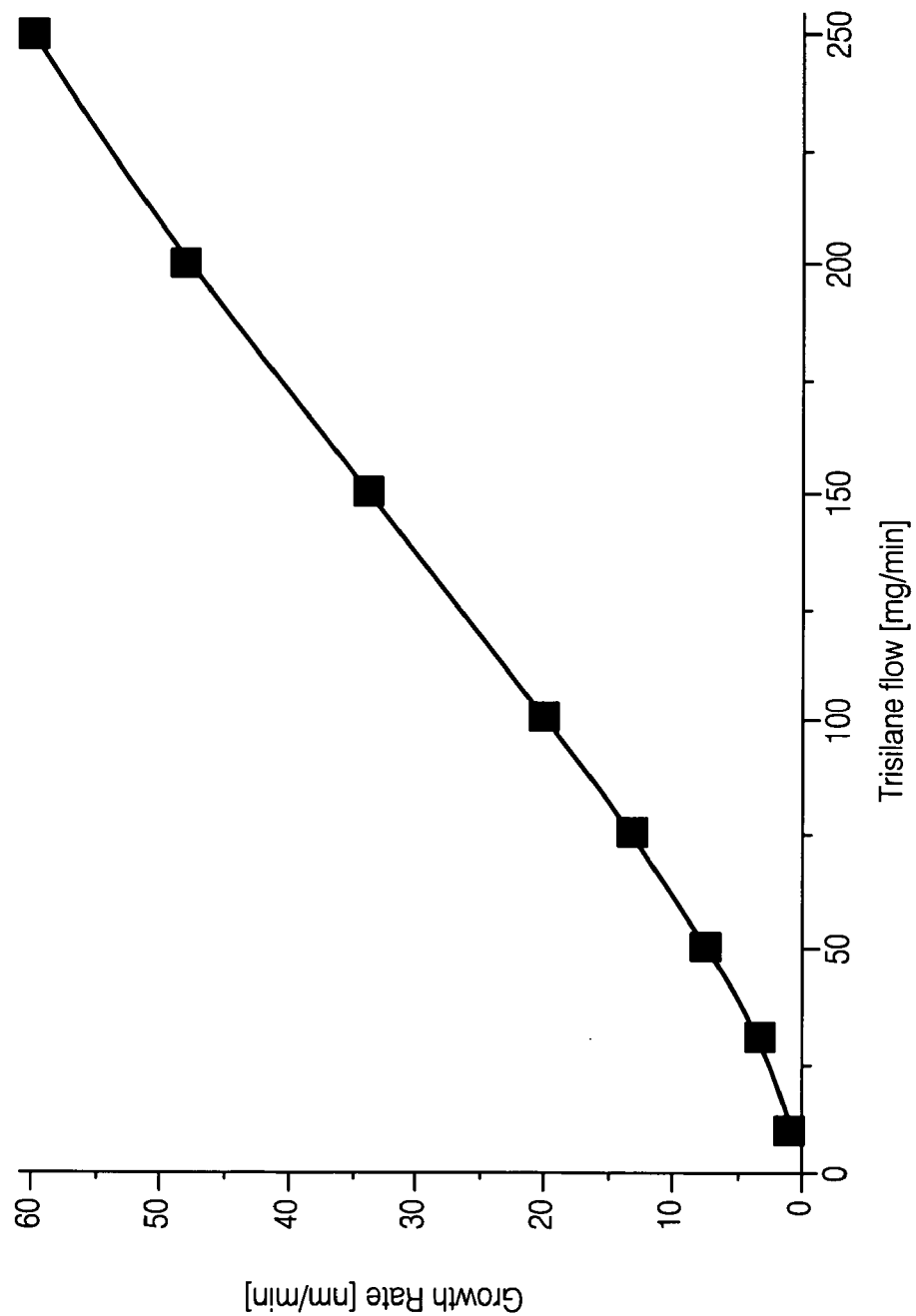
FIG. 18B is a graph showing the growth rate of those films as a function of trisilane flow (units of milligrams per minute).

In an embodiment, a carbon source is provided to the substrate along with trisilane and chlorine to selectively deposit a Si-containing film that comprises substitutional carbon. The amount of substitutional carbon is preferably about 1.0 atomic % or greater, more preferably about 1.5 atomic % or greater. The selectively deposited carbon- and Si-containing film may be a single crystalline silicon film having a lattice spacing of 5.38 Å or less, preferably about 5.36 Å or less, more preferably about 5.34 Å or less. Such single crystalline silicon films may further comprise an electrically active dopant (such as phosphorous or arsenic). When doped (preferably substitutionally doped) with an electrically active dopant, the selectively deposited single crystalline silicon film comprising substitutional carbon may have having a resistivity of about 1.0 mΩ·cm or less, preferably about 0.7 mΩ·cm or less. Such single crystalline silicon films comprising substitutional carbon may be selectively deposited by a relatively high rate deposition process using chlorine, trisilane, a carbon precursor and, optionally, a dopant precursor for an electrically active dopant. FIG. 18A is a plot showing percent substitutional carbon as a function of growth rate (nanometers per minute, nm/min) for silicon films substitutionally doped with both carbon and arsenic. The plot also shows the resistivity of those films (units of mΩ·cm, also left axis). FIG. 18B shows the growth rate of those films as a function of trisilane flow (units of milligrams per minute, mg/min).

The plots shown in FIGS. 18A and 18B indicate that high levels of substitutional carbon may be achieved using trisilane and chlorine by carrying out the selective depositions at a relatively high deposition or growth rate, e.g., at least about 5 nm/min. Carbon content and resistivity both improve with increased deposition rate, which in turn is improved by use of trisilane. As illustrated in FIGS. 18A and 18B, the growth rates may be controlled, e.g., by controlling the trisilane flow rates and temperatures, to produce single crystalline films that comprise various levels of carbon, e.g., 2.5% or greater substitutional carbon, preferably 2.6% or greater substitutional carbon, more preferably 2.7% or greater substitutional carbon. In some embodiments, the single crystalline films may comprise even higher levels of carbon, e.g., 2.8% or greater substitutional carbon, preferably 2.9% or greater substitutional carbon, more preferably 3.0% or greater substitutional carbon, as indicated in FIGS. 18A and 18B.

Figure 19:
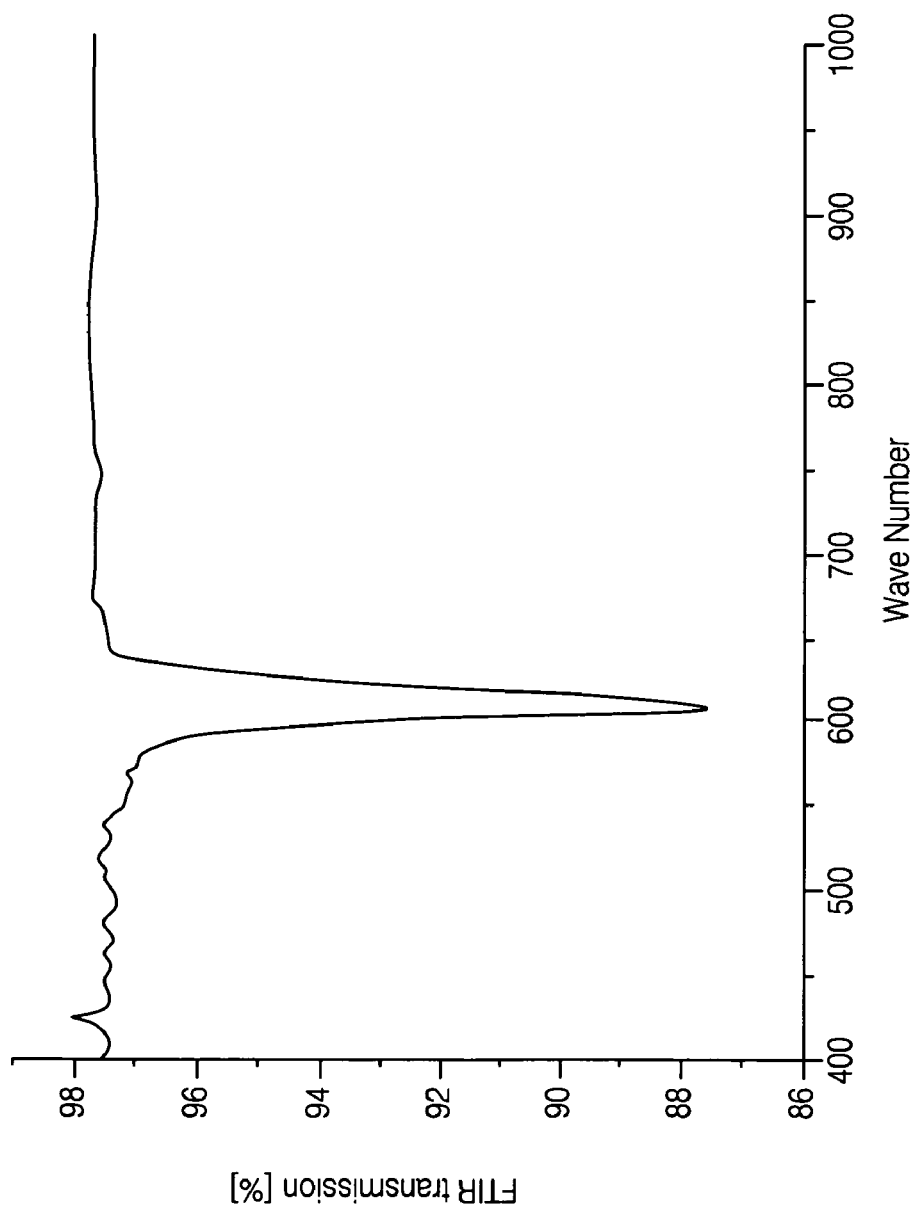
FIG. 19 shows a portion of a Fourier Transform Infrared (FTIR) spectrum for a silicon film substitutionally doped with carbon in accordance with preferred embodiments.

FIG. 19 shows a portion of an FTIR spectrum for a crystalline silicon film (200 nm thick) substitutionally doped with 1.8% carbon. The strong absorption at about 605 wavenumbers demonstrates the presence of substitutional carbon in the silicon film. The lack of a broad absorption band at about 450 to 500 wavenumbers demonstrates that the silicon film contains little (if any) non-substitutional carbon. Thus, an embodiment provides a selectively deposited single crystalline silicon film comprising 2.4% or greater substitutional carbon, the film comprising less than about 0.3% non-substitutional carbon, preferably less than about 0.25% non-substitutional carbon, more preferably less than about 0.20% non-substitutional carbon, even more preferably less than about 0.15% non-substitutional carbon. As indicated above, the percentage of a dopant (such as carbon, germanium or electrically active dopant) in the single crystalline film is expressed herein in atomic percent on a whole film basis, unless otherwise stated.

The thickness of a selectively deposited single crystalline silicon film comprising substitutional carbon as described herein is preferably less than a critical film thickness. Those skilled in the art understand that a critical film thickness is a film thickness at which a strained film relaxes under a particular set of conditions. As the concentration of substitutional dopant increases, the critical thickness generally decreases. Films having a thickness less than the critical thickness typically remain strained under those conditions. For example, a single crystalline silicon film comprising about 1.8% substitutional carbon may have a critical thickness of about 200 nm at about 500° C., whereas an otherwise similar film comprising 3.5% substitutional carbon may have a critical thickness of about 25-30 nm at that temperature. Films having a thickness that is less than a critical thickness for that film will tend to remain strained unless or until sufficiently perturbed (e.g., exposed to sufficient heat to cause relaxation).

As discussed above and illustrated in FIGS. 18A and 18B, it has been discovered that relatively high levels of substitutional carbon may be incorporated into a selectively deposited silicon film by depositing the film using chlorine and trisilane with a carbon source at a deposition rate of at least about 5 nm per minute, preferably at least about 10 nm per minute. Various deposition parameters may be used to control the selectivity, deposition rate and the level of substitutional carbon incorporated into the resulting silicon film, as discussed herein and illustrated in FIGS. 17 and 20-24.

Figure 20B:
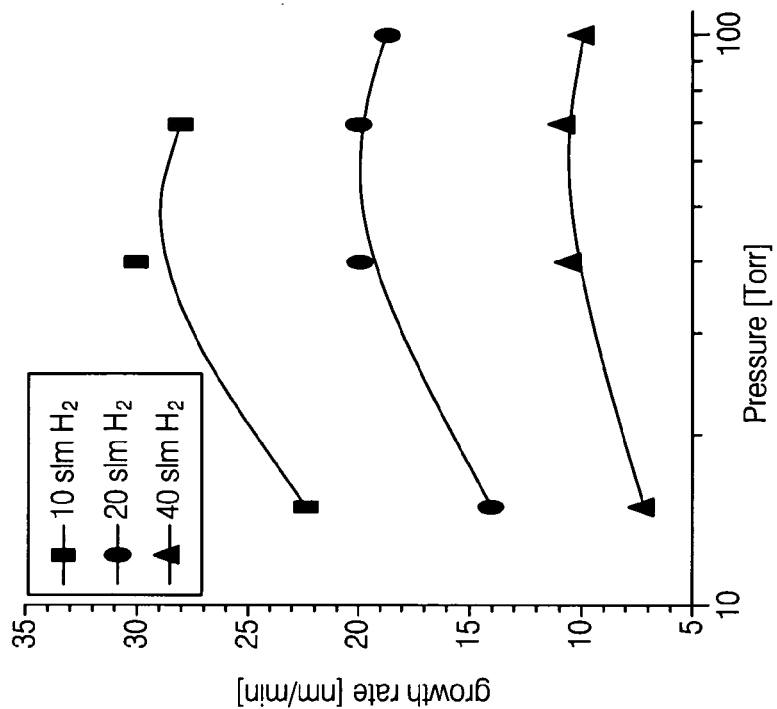
FIG. 20B shows a graph of growth rate as a function of chamber pressure for three different carrier gas ($H_2$) flow rates.
Figure 20A:
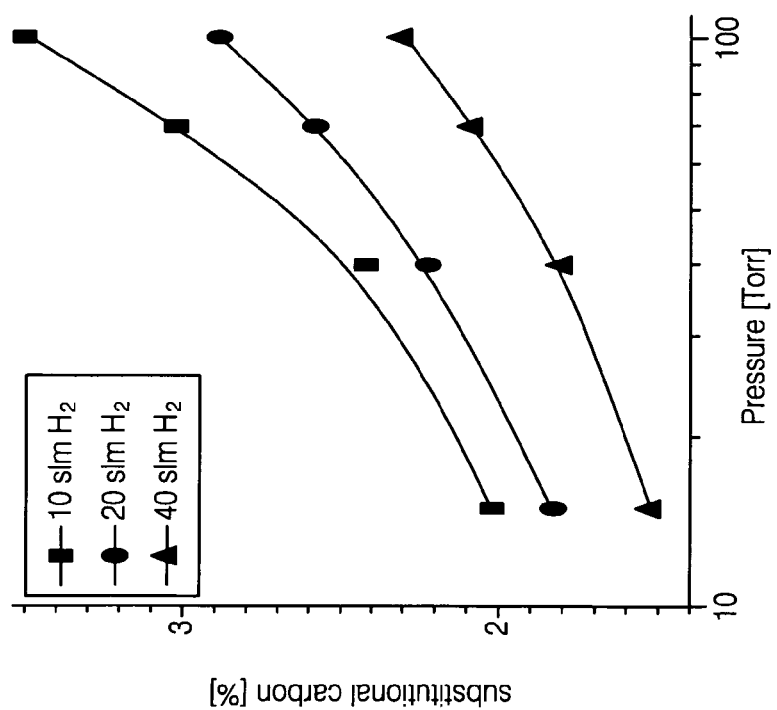
FIG. 20A shows a graph of substitutional carbon content in a silicon film as a function of chamber pressure for three different carrier gas ($H_2$) flow rates.

FIG. 20A shows a graph of substitutional carbon content in a silicon film as a function of chamber pressure for three different carrier gas ($H_2$) flow rates. The data shown in FIGS. 20A and 20B were obtained at a deposition temperature of 550° C., a trisilane flow rate of 200 mg/min., and an MMS (carbon source) flow rate of 180 sccm. FIG. 20A shows that higher levels of substitutional carbon may be achieved at relatively higher chamber pressures and relatively lower $H_2$ carrier gas flows, under these conditions. FIG. 20B shows a graph of growth rate as a function of chamber pressure for three different carrier gas ($H_2$) flow rates, showing that the highest growth rates were achieved at chamber pressures in the range of about 40 Torr to about 70 Torr and higher growth rates were obtained with lower $H_2$ carrier gas flow rates, under these conditions.

Figure 21A:
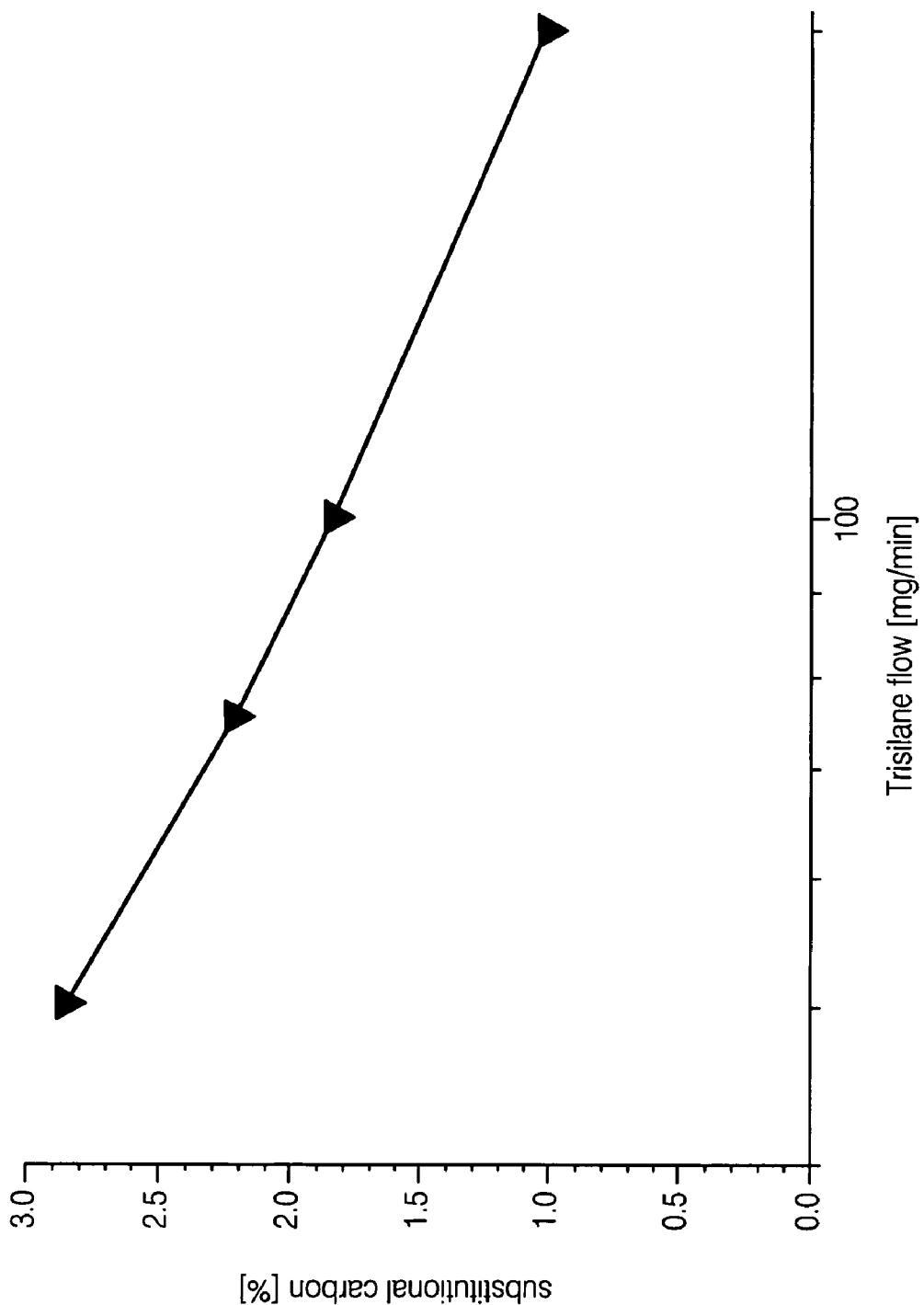
FIG. 21A shows a graph of substitutional carbon content in a silicon film as a function of trisilane flow rate, at a constant MMS (monomethylsilane or methylsilane) flow rate.

FIG. 21A shows a graph of substitutional carbon content in a silicon film as a function of trisilane flow rate. The data shown in FIGS. 21A and 21B were obtained at a deposition temperature of 550° C., a chamber pressure of 15 Torr, a carrier gas ($H_2$) flow rate of 20 slm, and a MMS flow rate of 180 sccm. Because the MMS flow rate was constant and the trisilane flow rate was varied, FIG. 21A illustrates the effect on substitutional carbon content of varying the flow rate ratio of trisilane to MMS. As the flow rate ratio of trisilane to carbon source increased, the amount of substitutional carbon in the resulting film decreased.

Figure 21B:
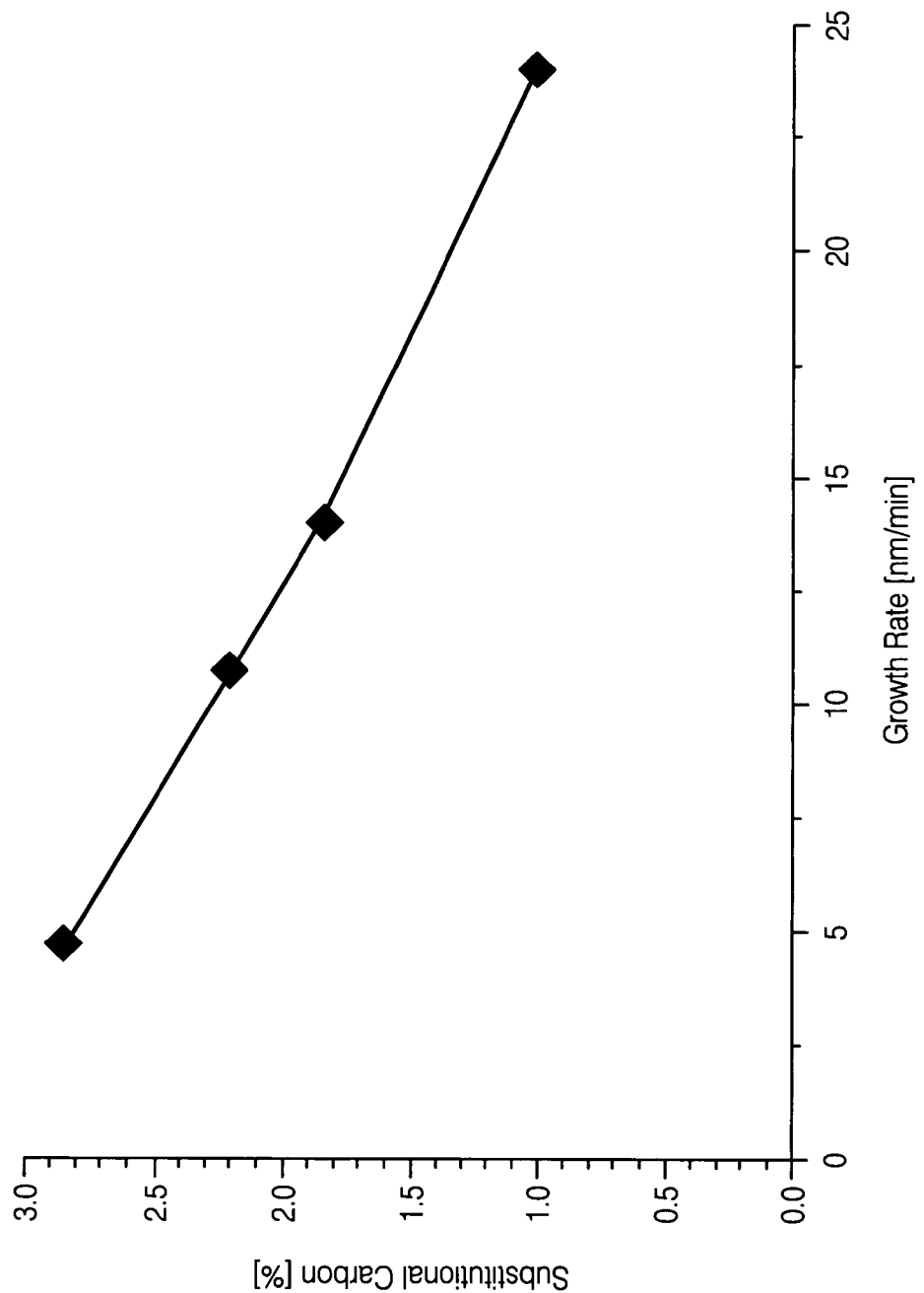
FIG. 21B shows the substitutional carbon content in the silicon films as a function of deposition rate (growth rate).

FIG. 21B shows the substitutional carbon content in the silicon films as a function of deposition rate (growth rate). FIG. 21B illustrates that relatively high levels of substitutional carbon may be achieved at a growth rate of 5 nm per minute under these conditions. Higher growth rates (resulting from higher trisilane flow rates) did not result in higher substitutional carbon under these conditions (compare to FIG. 18A) because the flow rate ratio of trisilane to carbon source increased (thereby decreasing the relative amount of carbon available for incorporation into the film).

Figure 22:
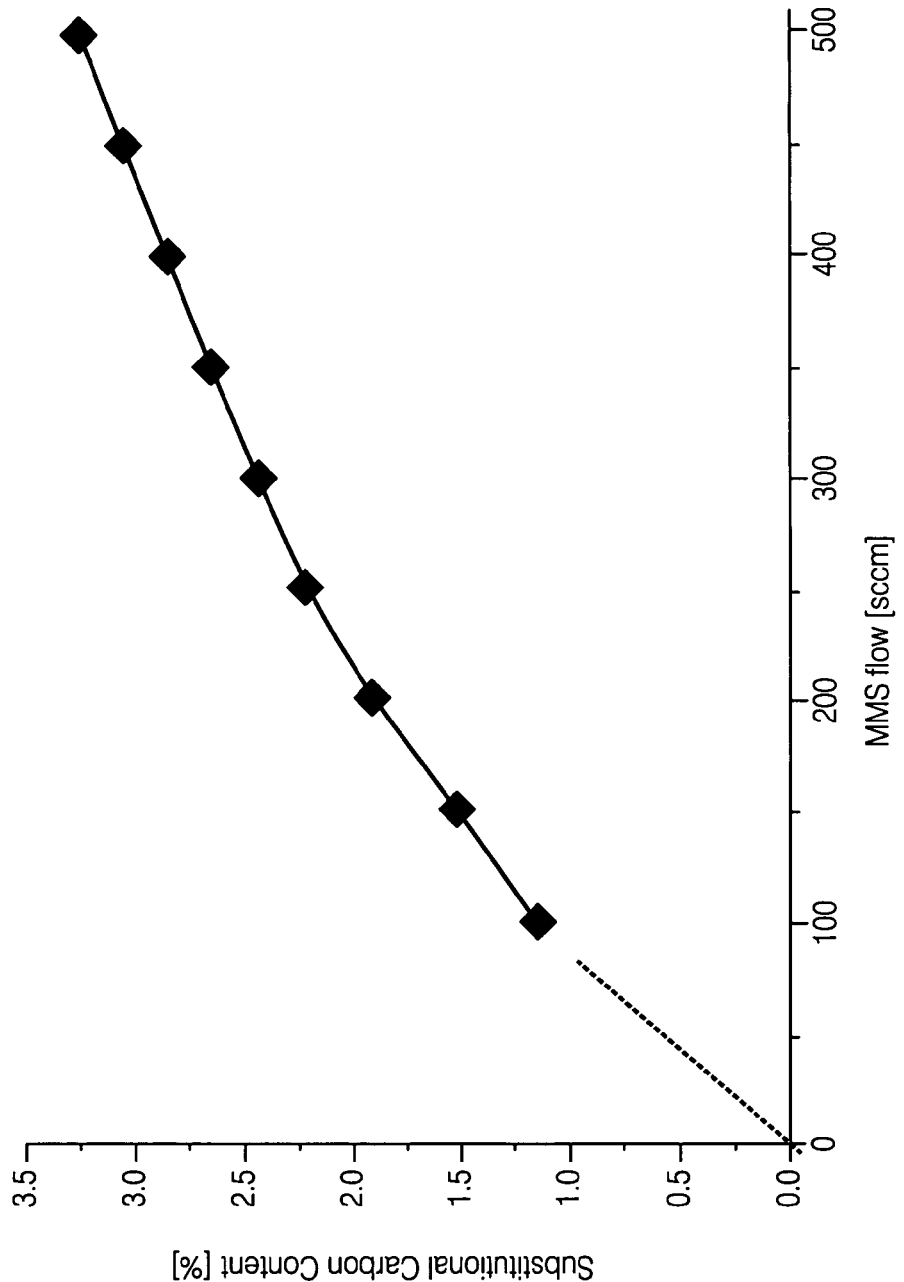
FIG. 22 shows a graph of substitutional carbon content in a silicon film as a function of MMS flow rate, at a constant trisilane flow rate.

FIG. 22 shows a graph of substitutional carbon content in a silicon film as a function of MMS flow rate, at a constant trisilane flow rate (compare to FIG. 21, discussed above). The data plotted in FIG. 22 shows that higher substitutional carbon levels are obtained at higher MMS flow rates under these conditions. Because the trisilane flow rate was constant and the MMS flow rate was varied, FIG. 22 illustrates the effect on substitutional carbon content of varying the flow rate ratio of carbon source (MMS) to trisilane. As the flow rate ratio of MMS to trisilane increased, the amount of substitutional carbon in the resulting film increased relatively linearly, in accordance with the results shown in FIG. 21.

Figure 23B:
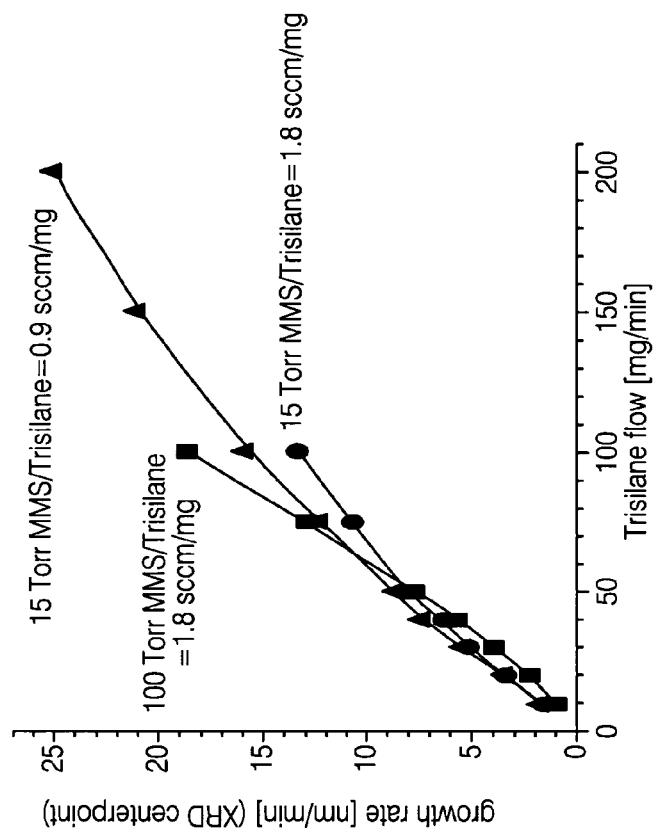
FIG. 23B shows a graph of growth rate as a function of trisilane flow rate.
Figure 23A:
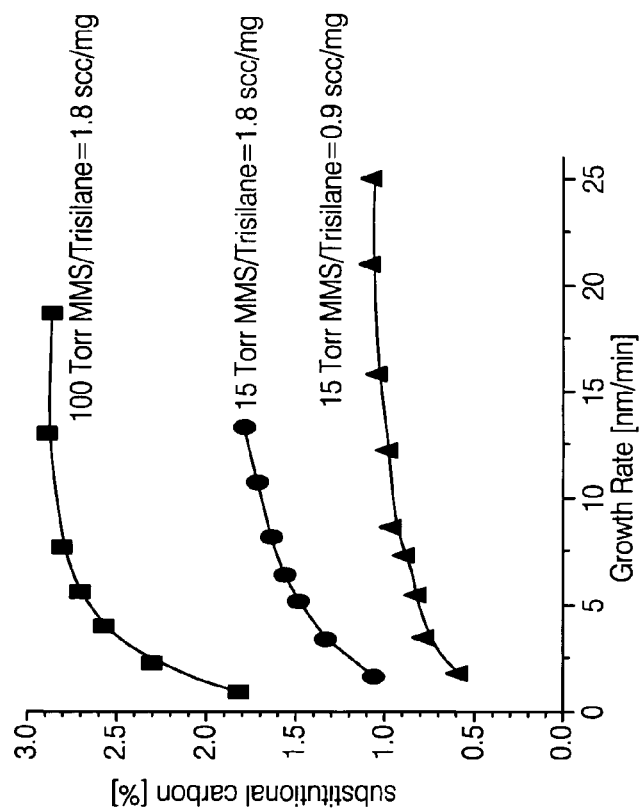
FIG. 23A shows a graph of substitutional carbon content in a silicon film as a function of film growth rate, at a constant trisilane to MMS flow ratio.

FIG. 23A illustrates the effect of maintaining a constant trisilane to carbon source ratio while increasing the growth rate by simultaneously increasing the flow rates of both gases. The data shown in FIG. 23A were obtained at a deposition temperature of about 550° C. and a carrier gas ($H_2$) flow rate of 20 slm. FIG. 23A demonstrates that higher levels of substitutional carbon are achieved at higher growth rates, and that higher growth rates are obtained at higher chamber pressures and higher overall flow rates and that higher substantial carbon can be obtained with higher growth rates at a given ratio of trisilane:carbon precursor. FIG. 23B shows that growth rate is a strong positive function of trisilane flow rate, and that chamber pressure has a relatively modest effect. Thus, taken together, FIGS. 20-23 illustrate various conditions under which high deposition rates may be used to achieve high levels of substitutional carbon in single crystalline silicon.

The chemical vapor deposition conditions used to selectively deposit a single crystalline silicon film that comprises at least 2.4% substitutional carbon preferably include a deposition temperature that is at about a transition temperature between substantially mass-transport controlled deposition conditions and substantially kinetically controlled deposition conditions. Such a deposition temperature is illustrated by the vertical dashed line in FIG. 17A. The graph shown in FIG. 17A is a plot of growth rate as a function of reciprocal deposition temperature. The transition temperature indicated by the dashed line is about 550° C., under the deposition conditions used to generate the data shown in the graph. At temperatures higher than the transition temperature indicated by the dashed line (i.e., to the left of the dashed line), the deposition conditions are substantially mass-transport controlled. In some cases, at deposition temperatures higher than about 550° C., certain aspects of film quality may be reduced. At temperatures lower than the transition temperature indicated by the dashed line (i.e., to the right of the dashed line), the deposition conditions are substantially kinetically controlled, and relatively higher carbon source flow rates may be used. The position of the transition temperature may be changed by manipulating the deposition conditions, e.g., by varying the chamber pressure and carrier gas flow rate. In some embodiments, the chemical vapor deposition conditions comprise a temperature in the range of about 500° C. to about 600° C. In some embodiments, the chemical vapor deposition conditions comprise a chamber pressure of at least about 500 mTorr, preferably at least about 30 Torr, e.g., in the range of about 30 Torr to about 200 Torr.

The methods described above for the incorporation of substitutional carbon into selectively deposited Si-containing films may also be used for substitutional doping using other dopants, such as electrically active dopants. High levels of substitutional doping may be used to selectively deposit silicon films having low resistivity, particularly when the silicon films are also substitutionally doped with carbon.

Advantageously, selective deposition from trisilane and chlorine is also effective for incorporating germanium substitutionally into epitaxial films, for creating strain with SiGe layers. Under preferred deposition conditions, germanium incorporation levels can be between about 1% and 99%, typically between 17% and 50%, often between about 20% and about 50%, and more particularly between about 20% and 40%, e.g., to exert a stress on a channel.

As is known in the art, the lattice constant for single crystal silicon is about 5.431 Å, whereas single crystal germanium has a lattice constant of 5.657 due to the larger size of the germanium atoms. The deviation from silicon's natural lattice constant introduces strain that advantageously improves electrical carrier mobility in semiconductors, improving device efficiency. When the SiGe is deposited to less than the critical thickness of the material, the deposited layer remains compressively strained and hole mobility is improved for PMOS devices. In this case, the deposited SiGe layer can be selectively formed over the entire active area and can define the channel, or it can act as a relaxed template for forming a tensile strained Si layer thereover, which can then itself serve as a channel region.

The methods described above for the incorporation of substitutional carbon into SiGe may also be used to reduce compressive strain in SiGe or to produce an unstrained ternary SiGeC alloy, e.g. an alloy consisting essentially of about 3.5 atomic % substitutional carbon, about 35 atomic % Ge, and about 61.5 atomic % silicon.

In the embodiments of FIGS. 1-5, the SiC layer is selectively formed in recessed source/drain regions 20, and is preferably deposited under conditions (thickness, temperature) that maintain stress. The smaller lattice constant of the SiC material filling the S/D recesses exerts tensile strain on the channel region 22 therebetween. However, in an embodiment, a SiGe layer is selectively deposited in recessed source/drain regions 20 instead of the SiC. The larger lattice constant of the SiGe material filling the S/D recesses exerts a compressive strain on the channel region 22 therebetween. Preferably arsine or phosphine are also employed. As discussed above, an embodiment provides a method of forming an integrated circuit, the method comprising: patterning a substrate to define exposed semiconductor surfaces and insulating regions; and providing a feed gas to the substrate, thereby selectively depositing an epitaxial film on the exposed semiconductor surfaces, wherein the feed gas is formed by intermixing trisilane, chlorine, and a dopant source (and optionally other gases, such as a carrier gas). In a preferred embodiment, the dopant source is a germanium source and optionally an electrically active dopant precursor that is provided to the substrate along with the trisilane and chlorine gas to selectively deposit a doped epitaxial film on the exposed semiconductor surfaces.

In another embodiment, trisilane and chlorine are provided to a substrate along with an electrical dopant to thereby deposit an electrically doped silicon film on the substrate. Thus, an embodiment provides a method for selectively depositing a single crystalline silicon film, comprising providing a substrate disposed within a chamber; introducing chlorine, trisilane and a dopant precursor to the chamber under chemical vapor deposition conditions, the dopant precursor comprising an electrically active dopant; and depositing a single crystalline silicon film onto the substrate at a deposition rate of at least about 5 nm per minute. The selectively deposited single crystalline silicon film preferably has a resistivity of about 1.0 mΩ·cm or less and comprising at least about $3\times10^{20}$ cm$^{-3}$ of a substitutional dopant, preferably at least about $4\times10^{20}$ cm$^{-3}$ of a substitutional dopant, more preferably at least about $5\times10^{20}$ cm$^{-3}$ of a substitutional dopant. The level and type of electrically active dopant may be varied to produce resistivity values in the resulting doped silicon that are 1.0 mΩ·cm or less, e.g., 0.9 mΩ·cm or less, preferably 0.8 mΩ·cm or less, more preferably 0.7 mΩ·cm or less, as desired for a particular application. By using the appropriate dopant precursor, the method may be used to produce silicon films that contain n-type dopants or p-type dopants. Preferably, n-type dopants are employed with carbon-doped silicon films. Examples of suitable dopant precursors and dopants are discussed above. The deposition rate may also be increased, e.g., to at least about 10 nm per minute, to at least about 20 nm per minute, etc., as illustrated in FIG. 25 (discussed below).

Chemical vapor deposition conditions suitable for selectively depositing a silicon film that is substitutionally doped with germanium or an electrically active dopant are generally compatible with the CVD conditions described above for the deposition of silicon films substitutionally doped with carbon. Thus, an embodiment provides a selectively deposited single crystalline silicon film that is doped with carbon and with an electrically active dopant. Another embodiment provides a selectively deposited single crystalline silicon films that is doped with germanium and with an electrically active dopant.

Figure 24:
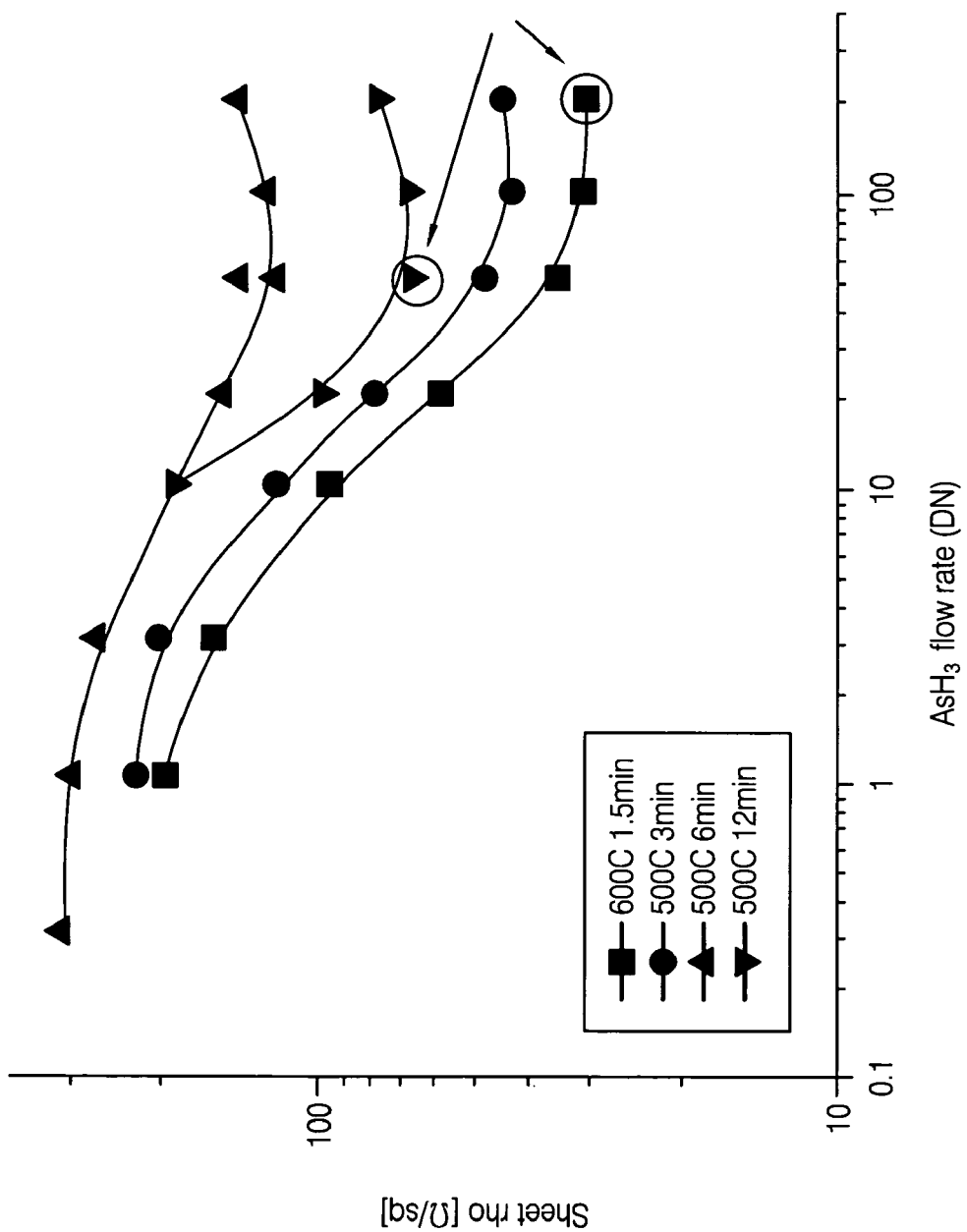
FIG. 24 is a graph of doped silicon film resistivity as a function of dopant precursor (arsine) flow for a series of films deposited using trisilane.

FIG. 24 is a plot of doped silicon film resistivity as a function of dopant precursor (arsine) flow for a series of films deposited using trisilane. FIG. 24 illustrates the general proposition that film resistivity as a function of arsine flow goes through a minimum, and thus that decreases in resistivity are not necessarily achieved by merely increasing the flow rate of the dopant precursor. This invention is not bound by theory, but it is believed that the increasing resistivity may be due to the incorporation of an increasing fraction of electrically inactive dopant.

Figure 25A:
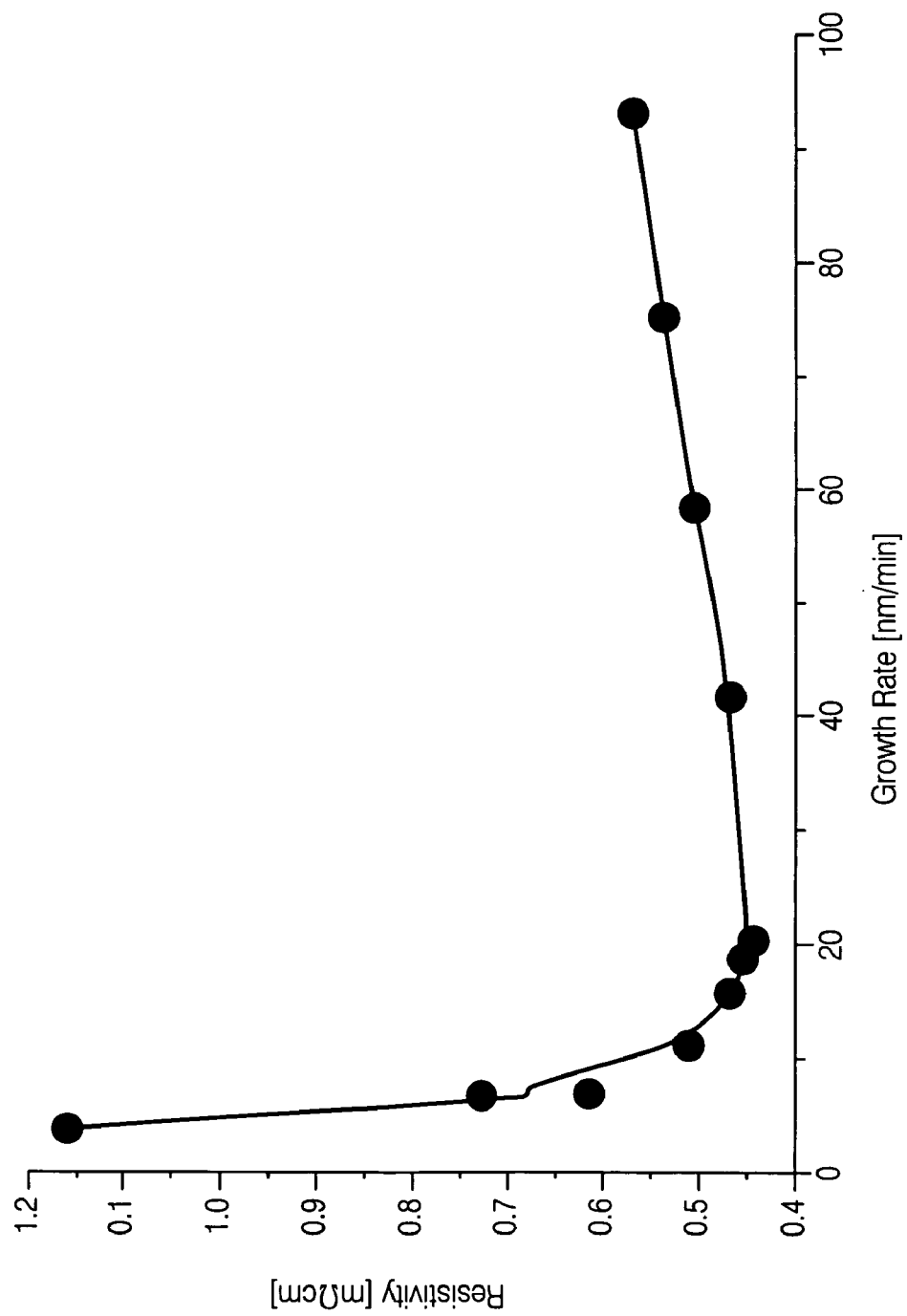
FIG. 25A is a graph of doped silicon film resistivity as a function of growth rate for a series of films deposited at a constant flow rate ratio of trisilane to arsine.
Figure 25B:
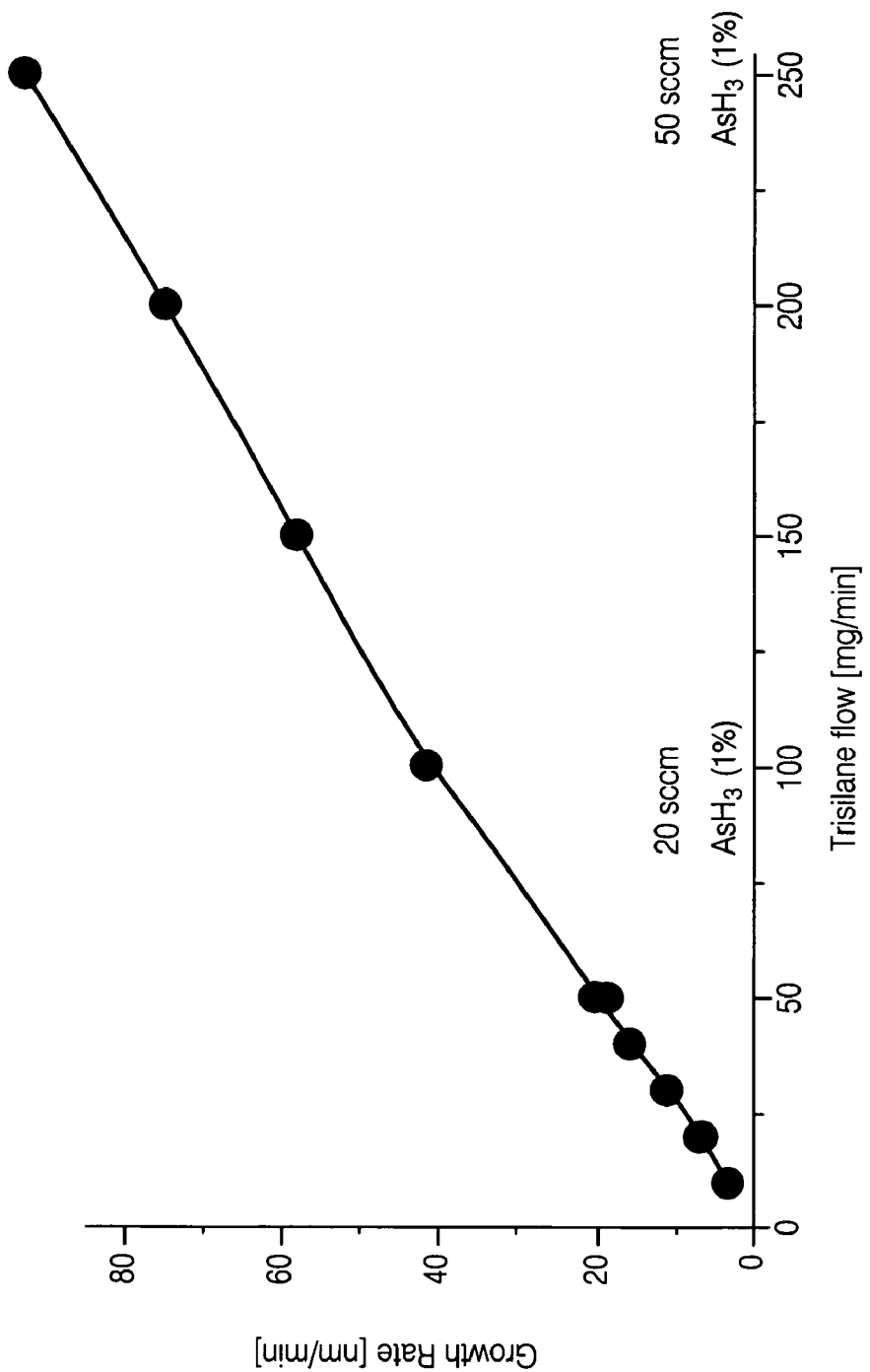
FIG. 25B is a plot of film deposition rate as a function of trisilane and arsine flow rate.

FIG. 25A is a plot of doped silicon film resistivity as a function of growth rate for a series of films deposited at a constant flow rate ratio of trisilane to arsine (see also FIG. 15). FIG. 25B is a plot of film deposition rate as a function of trisilane and arsine flow rate. FIG. 25 is similar to FIG. 23 in the sense that, within a particular set of data, a constant flow rate ratio of trisilane to substitutional dopant precursor was used (MMS in FIG. 23, AsH$_3$ in FIG. 25). FIG. 25A demonstrates that silicon film resistivity values of about 1.0 mΩ·cm or less may be achieved using trisilane by conducting the depositions at a relatively high rate, e.g., at least about 5 nm per minute, more preferably at least about 10 nm per minute. As illustrated in FIG. 25B, the growth rate of doped silicon films is a substantially linear function of the flow rate of trisilane.

FIGS. 15, 23 and 25 demonstrate that the use of trisilane enables relatively high rate depositions that in turn enable surprisingly high levels of substitutional doping. The similarities among FIGS. 15, 23 and 25, despite the known differences among phosphorous, carbon and arsenic, demonstrate that deposition methods using trisilane as taught herein are relatively insensitive to the nature of the dopant or dopant precursor. Thus, the selective deposition methods using trisilane that are described herein are applicable to a wide variety of dopants (such as substitutional carbon and electrically active dopants), and to the incorporation of those dopants into a wide variety of Si-containing materials (such as Si, SiC, SiGe, SiGeC, etc.). Routine experimentation may be used to deposition conditions applicable to a particular Si-containing material.

Dopant Hydride Gettering of Chlorine

In situ doping is often avoided, particularly in single wafer processing, due to unwanted contamination of the CVD chamber. Economies can be achieved by depositing intrinsic semiconductors that are useful for both p-type (e.g., boron-doped) or n-type (e.g., phosphorus-doped or arsenic-doped) applications. The layers are simply doped in separate process tools by implantation or diffusion. Furthermore, batch processing can be employed for dopant diffusion, such that throughput is not greatly affected by the additional doping step.

For the preferred selective processes employing chlorine gas, however, improved layer surface quality was found from the addition of dopant hydrides to the process flow. It is believed that dopant hydrides serve as excellent getters for the chlorine at the surface, forming (pure) HCl and dopant chlorides, enabling access of the precursor gases to the surface for high quality epitaxial deposition.

Deposition of Si-containing films using trisilane and chlorine can offer significant advantages over the use of conventional silicon sources when conducted as described herein. For example, at a given deposition temperature, deposition of Si-containing films using trisilane preferably proceeds at a rate that is significantly faster than when silane is used instead of trisilane. A preferred embodiment provides a high rate deposition method in which trisilane is delivered to the substrate surface at a delivery rate of about 50-200 mg/min. Under thermal CVD conditions, preferably at a deposition temperature in the range of about 500° C. to about 800° C., practice of this embodiment results in relatively fast deposition of the Si-containing material (as compared to other silicon sources), preferably at a rate of about 50 Å per minute or higher, more preferably about 100 Å per minute or higher, most preferably about 200 Å per minute or higher. Preferably, a dopant hydride source is also delivered to the surface along with the trisilane and chlorine to improve surface quality and to provide in situ doping.

Preferred Si-containing films have a thickness that is highly uniform across the surface of the film. When deposition is conducted using trisilane and chlorine over patterned or mixed substrates (particularly over semiconductor and either silicon oxide or silicon nitride) as described herein (e.g., in the presence of a dopant hydride getter) the percent thickness non-uniformity for the resulting Si-containing films is preferably about 2% or less. Depending on the mean thickness of the film, additional values for percent thickness non-uniformity may be preferred as shown in Table 1 below. Each value for % thickness non-uniformity shown in Table 1 is to be understood as if preceded by the word "about."

TABLE 1

| Mean Film Thickness | Preferred Range of % Thickness Non-Uniformity | More Preferred Range of % Thickness Non-Uniformity | Most Preferred Range of % Thickness Non-Uniformity |
| --- | --- | --- | --- |
| >150 Å | <10 | <6 | <2 |
| 100-150 Å | <10 | <7 | <3 |
| 50-99 Å | <15 | <8 | <4 |
| <50 Å | <20 | <10 | <5 |

In general, measurements of film thickness uniformity for a film deposited under a particular set of process conditions can be made by depositing the film on a uniform or mixed substrate having a diameter in the range of about 200 mm to about 300 mm. Film thickness uniformity is determined by making multiple-point thickness measurements along a randomly selected diameter (with no measurements being taken within a 3 mm exclusion zone at the wafer periphery), determining the mean thickness by averaging the various thickness measurements, and determining the root mean square (rms) variability. A preferred instrument for measuring film thickness utilizes an Optiprobe™ from Thermawave, and a preferred measurement method involves using such an instrument to measure the film thickness at 49 points along a randomly selected wafer diameter. In practice, thickness variability is typically obtained directly from the instrument following such a measurement, and thus need not be calculated manually. To enable comparisons, the results can be expressed as percent non-uniformity, calculated by dividing the rms thickness variability by the mean thickness and multiplying by 100 to express the result as a percentage. When measuring thickness uniformity of a film having a surface that is not accessible to such a measurement, e.g., a film onto which one or more additional layers have been applied, or a film contained within an integrated circuit, the film is cross sectioned and examined by electron microscopy. The film thickness is measured at the thinnest part of the cross sectioned film and at the thickest part, and the range in thickness measurements (e.g., ±6 Å) between these two points is then divided by the sum of the two measurements. This non-uniformity is expressed as a percentage herein.

In addition, the compositional uniformity of preferred crystalline Si-containing films that contain other elements (e.g., doped silicon, Si-containing SiC and SiGe alloys, and doped Si-containing alloys) made in accordance with the methods described herein (e.g., in the presence of a dopant hydride getter) is materially improved as compared to corresponding films made without the use of trisilane. This invention is not bound by any theory of operation, but it is believed that the Si-containing films have a degree of compositional uniformity that is better than corresponding Si-containing films deposited using conventional precursors such as silane, DCS or TCS. Furthermore, crystalline Si-containing alloys containing relatively high levels of non-silicon element(s) can be prepared by the methods described herein. For example, crystalline SiGe preferably contains about 10 atomic % Ge or greater, more preferably about 20 atomic % Ge or greater, even more preferably about 30 atomic % Ge or greater. Si:C preferably contains between about 1% and 3.5% of carbon.

Non-Hydrogen Carrier Gas

In accordance with another aspect of the invention, a non-hydrogen carrier gas is preferably employed in combination with a halogen-containing etchant gas and trisilane gas. The halogen-containing etchant gas may be a chlorine-containing etchant gas such as hydrogen chloride (HCl), hexachlorodisilane ($Si_2Cl_6$) and/or chlorine. Hydrogen gas ($H_2$) is the most popular carrier gas employed in vapor deposition for semiconductor processing, and particularly in epitaxial deposition. There are several reasons for the popularity of $H_2$. $H_2$ can be provided with a high degree of purity. Furthermore, the thermal properties of hydrogen are such that it does have as great a thermal effect on the wafer as other inert gases might. Additionally, hydrogen has a tendency to act as a reducing agent, such that it combats the formation of native oxide that results from less than perfect sealing of the reaction chamber.

However, the inventors have found particular advantages from employing a non-hydrogen carrier gas in a trisilane/halogen-containing etchant gas deposition system such as the trisilane/chlorine deposition system described above. Preferably helium (He), argon (Ar), neon (Ne), xenon (Xe) or nitrogen gas ($N_2$), or a combination of such inert gases, is employed in place of hydrogen. Hydrogen chloride may be used as a carrier gas in certain selective deposition embodiments, e.g., using deposition conditions that include a trisilane flow rate of about 5 mg/min, a deposition temperature in the range of about 675° C. to about 700° C., a hydrogen chloride flow rate of about 2.2 slm, a deposition pressure of about 4 Torr, a diluted phosphine flow rate of about 200 sccm, and an MMS (undiluted) flow rate of about 6 sccm. In the illustrated embodiment, He is employed, as it has thermal behavior close to that of $H_2$ and thus entails less tuning of the reactor for the adjustment from use of $H_2$ carrier gas.

There are a number of possible reaction mechanisms in the trisilane/chlorine/hydrogen system described hereinabove, including the following:

(1) $Si\ (s) + Cl_2\ (g) \rightarrow SiCl_2\ (g)$ etching
(2) $Si_3H_8\ (g) \rightarrow H_3SiSiH:\ (g) + SiH_4\ (g)$ trisilane dissociation
(3) $H_3SiSiH:\ (g) \rightarrow H_2Si\!\!=\!\!SiH_2\ (g)$
(4) $SiH_2\ (g) + SiCl_2\ (s) \rightarrow 2Si\ (s) + 2HCl\ (g)$ deposition
(5) $Si\ (s) + 2HCl \leftrightarrow SiCl_2\ (g) + H2\ (g)$ balance of deposition and etching
(6) $2PH_3\ (g) \rightarrow 2P\ (s) + 3H_2\ (g)$ doping
(7) $PH_3\ (g) + 6Cl(s) \rightarrow PCl_3\ (g) + 3HCl\ (g) +$ free surface sites
(8) $Cl_2\ (g) + H_2\ (g) \rightarrow 2HCl\ (g)$
Comparison: $SiH_2Cl_2\ (g) \rightarrow SiCl_2\ (g) + H_2\ (g)$ DCS decomposition Equation (1) represents an etching reaction in the system. In addition to providing etching (which is needed for selectivity to be maintained), equation (1) also produces a reactant for equation (5) that will tend to produce silicon deposition. Equation (5) represents a balance between reaction to the right (etching) and reaction to the left (deposition). Preferably conditions are such that etching dominates over insulating surfaces while deposition dominates over semiconductor windows. Without wanting to be limited by theory, it is desirable to provide a sufficient concentration of chlorine gas to produce etching for selectivity, while producing $SiCl_2$ that provides for deposition.

However, when free $H_2$ is present as a carrier gas (i.e., in large quantities), reaction (8) will take place, generating HCl. Increasing the concentration of HCl in the system drives both deposition/etch equations (4) and (5) in the direction of etching, thus driving down deposition rates for any given "tuned" process. A tuned process represents one in which the reactant concentrations have been tuned to achieve selective deposition.

Equation (7) illustrates yet another desirable reaction that is depressed by generation of HCl due to the presence of $H_2$ carrier gas. Equation (7) illustrates gettering of chloride adsorbed on the wafer surface. Dopant hydrides, such as arsine, phosphine and diborane (phosphine shown) tend to react with surface chlorine atoms and form volatile byproduct, such that surface reaction sites are freed for depositions. As with equations (4) and (5), however, increasing the HCl concentration tends to depress the desirable gettering reaction by shifting the equilibrium for equation (7) to the left.

Figure 26:
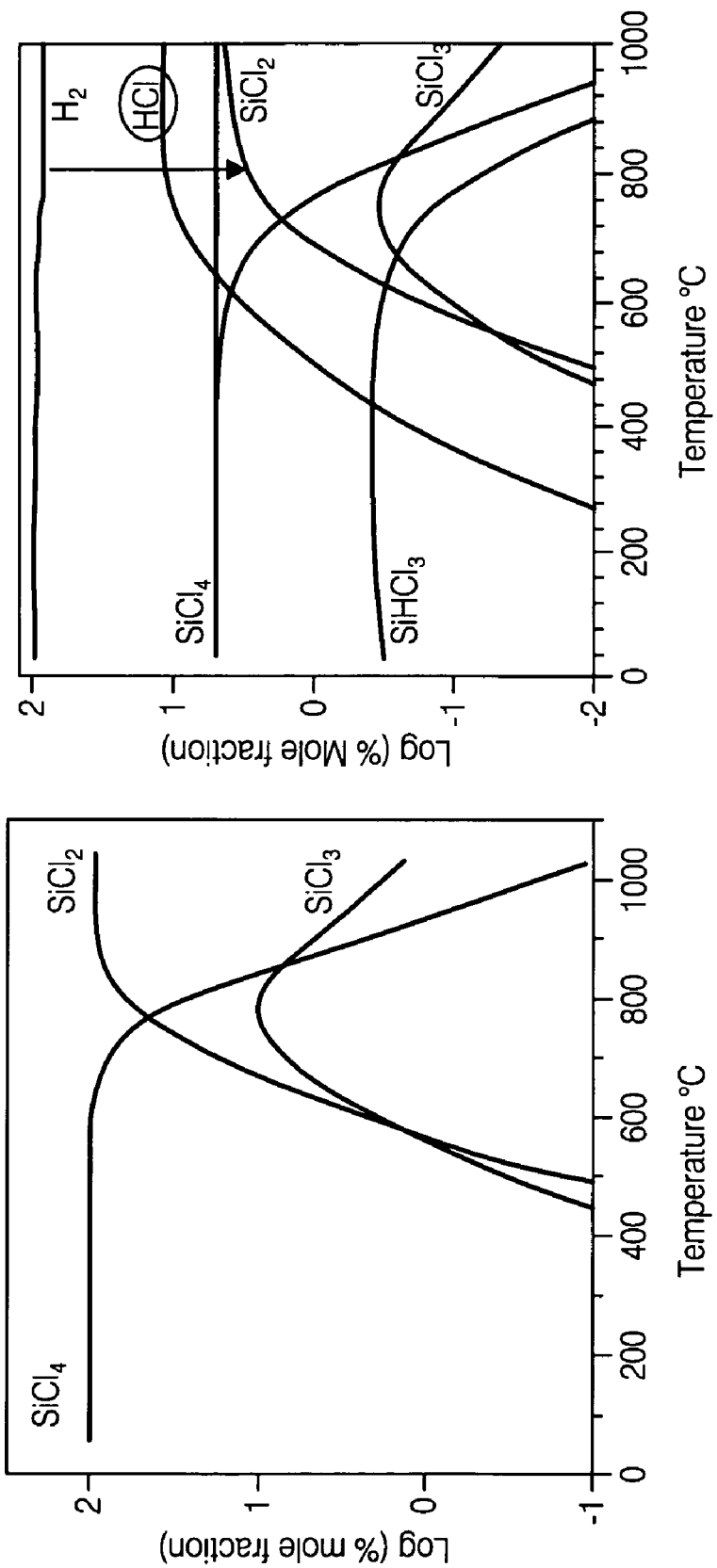
FIG. 26 shows two graphs illustrating the thermodynamic equilibria of various reactants as a function of temperature for a system including various chlorinated silicon species, with and without the addition of hydrogen carrier gas.

Accordingly, the use of a non-hydrogen carrier gas (which is generally the dominant gas in the system) will: avoid the consumption of $Cl_2$ by equation (8) and thereby avoiding depressing the deposition reactions (4), (5) and the gettering reaction (7). FIG. 26, reproduced from the Violette article (incorporated by reference above), illustrates how the addition of $H_2$ carrier gas depresses the concentration of deposition reactant $SiCl_2$ in the Si/Cl of their studies. Note that, while the process preferably employs no $H_2$, the benefits of minimizing $H_2$ can be obtained without total exclusion. Preferably the main carrier gas, representing the largest source of gas in the system is non-hydrogen. Preferably, dopant precursors (such as a carbon source, germanium source and/or electrical dopant precursor) are diluted in a non-hydrogen carrier gas (e.g., 1% arsine in He, 1% phosphine in He). Preferably, relatively high deposition temperatures (e.g., above about 550° C., more preferably in the range of about 550° C. to about 650° C.) are employed in combination with minimizing or eliminating $H_2$, as deposition selectivity tends to increase with increasing deposition temperature (see FIG. 16A).

Figure 27:
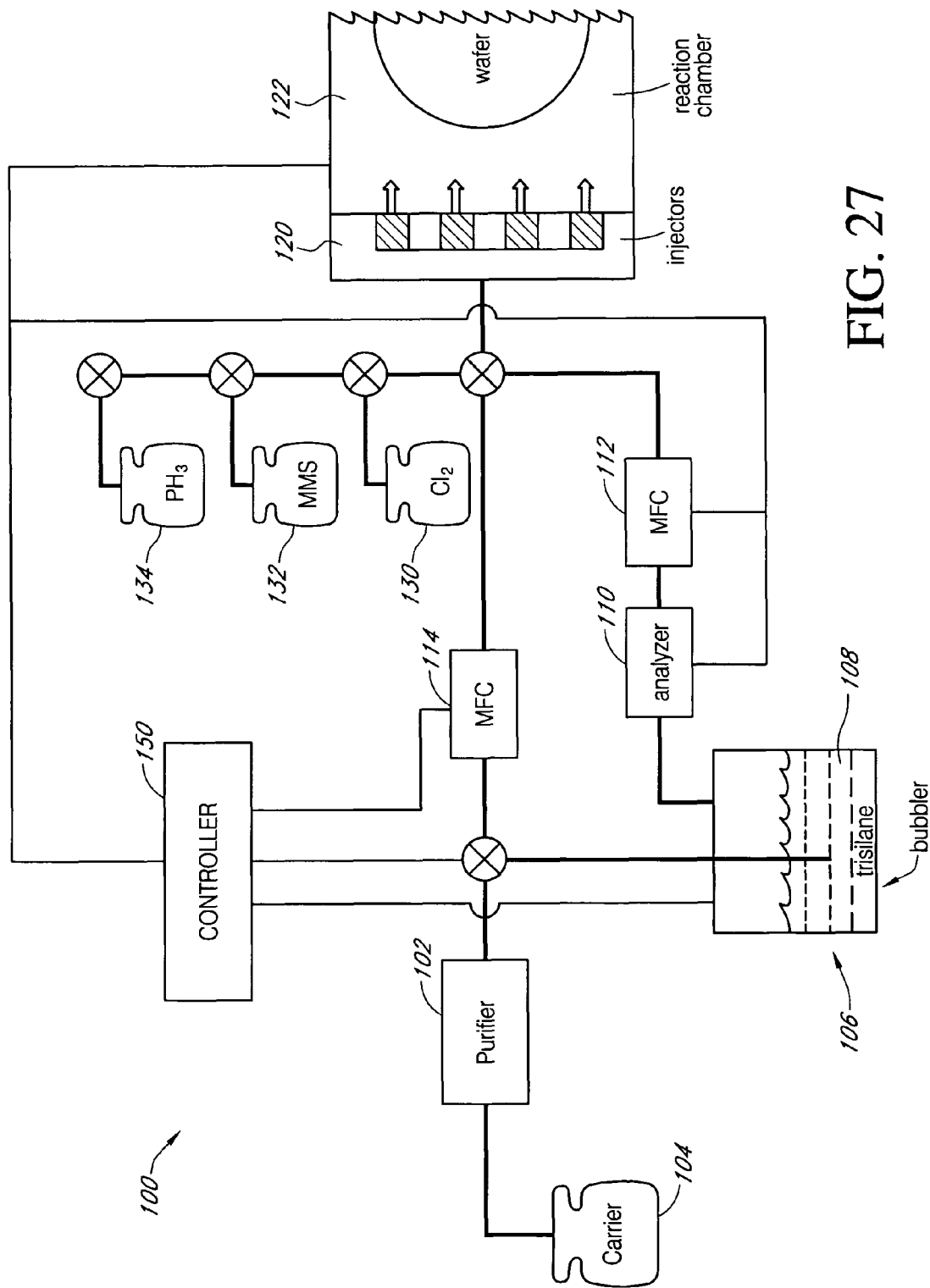
FIG. 27 is a schematic view of a reactor set up for a system employing trisilane, chlorine gas, and an inert, non-hydrogen carrier gas for depositing silicon-containing films in accordance with a preferred embodiment of the invention.

FIG. 27 illustrates a preferred reactor system 100 employing helium, trisilane and chlorine gas. As shown, a purifier 102 is positioned downstream of the helium source 104. Some of the inert gas flow is shunted to a vaporizer in the form of a bubbler 106, from which the carrier gas carries vaporized trisilane 108. Alternatively, the trisilane can be simply heated to increase the vapor pressure of trisilane in the space above the liquid, and the carrier gas picks up trisilane as it passes through that space. In any case, downstream of the liquid reactant source container 106 is an analyzer 110 that determines, by measuring the speed of sound through the vapor, the reactant concentration of the flowing gas. Based upon that measurement, the setpoint for the software-controlled downstream mass flow controller (MFC) 112 is altered by the analyzer 110. Such analyzers are commercially available.

The flow through this MFC 112 merges with the main carrier gas through the main carrier gas MFC 114 and other reactants at the gas panel, upstream of the injection manifold 120 for the deposition chamber 122. Alternatively, the flow can merge at any point within the reactor system 100 to supply the resulting feed gas to the substrate. A source of etchant species, preferably chlorine gas 130, is also provided. In the illustrated embodiment, a source for carbon 132 (illustrated as monomethyl silane or MMS) and a source for dopant hydride 134 (phosphine shown) are also provided.

As illustrated, the reactor system 100 also includes a central controller 150, electrically connected to the various controllable components of the system 100. The controller is programmed to provide gas flows, temperatures, pressures, etc., to practice the deposition processes as described herein upon a substrate housed within the reaction chamber 122. As will be appreciated by the skilled artisan, the controller 150 typically includes a memory and a microprocessor, and may be programmed by software, hardwired or a combination of the two, and the functionality of the controller may be distributed among processors located in different physical locations. Accordingly, the controller 150 can also represent a plurality of controllers distributed through the system 100.

Accordingly, the combination of trisilane/chlorine/non-hydrogen carrier gas results in enhanced deposition rates for silicon-containing materials, particularly epitaxial layers. In one embodiment, the gas flow rates are selected, in combination with pressure and temperature, to achieve selective deposition on/in semiconductor windows among insulating material. It will be understood that the helium source 104 can be replaced with other non-hydrogen gases such as neon, argon, krypton, xenon and/or nitrogen ($N_2$). The helium source 104 can also be replaced with a hydrogen source to provide a reactor system that employs a hydrogen carrier gas. For example, the deposition processes described that employ hydrogen as a carrier gas may be conducted in such a reactor system.

In the illustrated embodiment, the carbon source 132 is also provided, and in combination with trisilane and chlorine, high substitutional carbon content can be achieved, as disclosed hereinabove. In another embodiment, the dopant hydride source 134 is preferably also provided to result in in situ doped semiconductor layers with enhanced conductivity. Preferably, for silicon or SiC epitaxy, the dopant hydride is arsine or phosphine, and the layer is n-type doped. Most preferably the diluent inert gas for the dopant hydride is also a non-hydrogen inert gas. Thus, phosphine and MMS are preferably stored at their source containers 132, 134 in, e.g., helium. Typical dopant hydride concentrations are 0.1% to 5% in helium, more typically 0.5% to 1.0% in helium for arsine and phosphine. Typical carbon source concentrations are 5% to 50% in helium, more typically 10% to 30% in helium. For example, experiments have conducted with 20%

MMS in helium. Alternatively, the carbon source (e.g., MMS) may be supplied in an undiluted form.

The foregoing discussion about the benefits of non-hydrogen inert carrier gases in combination with trisilane and chlorine gas is also applicable to other semiconductor compounds. For example, trisilane, germane, chlorine and a non-hydrogen carrier gas will obtain the same enhanced and selective deposition benefits for SiGe. For example, a p-type doped layer can be obtained with the addition of 1% diborane in helium.

Example 1

This example illustrates the selective deposition of epitaxial silicon films over mixed morphology substrates.

An eight-inch unpatterned Si<100> wafer substrate and separate wafer with a fully oxidized (1000 Å) surface were loaded into an Epsilon E2500™ reactor system. The substrate was then introduced into the reactor system at 900° C., at a hydrogen flow rate of 20 slm, and the substrate was allowed to stabilize for 1 minute. The hydrogen flow was then shut down as the temperature of the substrate was reduced to 550° C. The substrate was then allowed to stabilize for 10 seconds, after which time a flow of 50 mg/min of trisilane was introduced for 10 minutes. A flow of 200 sccm chlorine gas and 100 sccm of 1% phosphine was simultaneously provided and the deposition was conducted at a deposition pressure of about 6 Torr. A continuous, uniform phosphorous-doped Si film having a thickness of about 500 Å was selectively deposited (deposition rate of 5 nm/min) over the single crystal substrate. The substrate was then removed from the reactor and returned to the loadlock. The phosphorous-doped Si film deposited on the silicon wafer had excellent epitaxial quality and a resistivity of about 0.35 mΩ·cm, while essentially no deposition was observed on the oxide substrate.

Example 2

A deposition process was conducted as described in Example 1 except that a separate wafer having a silicon nitride surface was loaded into the reactor system instead of the separate wafer with a silicon oxide surface. An epitaxial phosphorous-doped Si film was selectively deposited on the silicon wafer, with essentially no deposition on the silicon nitride surface. As in Example 1, the deposited phosphorous-doped Si film had excellent epitaxial quality and a resistivity of about 0.35 mΩ·cm.

All patents, patent applications and papers mentioned herein are hereby incorporated by reference in their entireties. It will be appreciated by those skilled in the art that various omissions, additions and modifications may be made to the processes described above without departing from the scope of the invention, and all such modifications and changes are intended to fall within the scope of the invention, as defined by the appended claims.

What is claimed is:

1. A method of selective deposition of a silicon-containing layer over a substrate, comprising:
    providing a substrate, the substrate comprising a first surface having a first surface morphology and a second surface having a second surface morphology different from the first surface morphology on the same side of the wafer, wherein the first surface comprises a semiconductor material and the second surface comprises a dielectric material;
    intermixing trisilane and chlorine gas to thereby form an intermixed feed gas;
    introducing the intermixed feed gas to the substrate under chemical vapor deposition conditions, wherein the chemical vapor deposition conditions comprise a pressure in the range of about 0.25 Torr to about 100 Torr; and
    selectively depositing a Si-containing layer onto the first surface without depositing on the second surface by said introducing of the intermixed feed gas comprising trisilane and chlorine, wherein selectively depositing the Si-containing layer takes place at a deposition rate of greater than about 5 nm/min.

2. The method of claim 1, wherein the chemical vapor deposition conditions comprise a temperature in the range of about 450° C. to about 700° C.

3. The method of claim 1, wherein the chemical vapor deposition conditions comprise a temperature in the range of about 500° C. to about 650° C.

4. The method of claim 1, wherein intermixing the trisilane and chlorine gas comprises flowing about 10 g/min to about 200 g/min of trisilane.

5. The method of claim 4, wherein intermixing the trisilane and chlorine gas comprises flowing about 20 sccm to about 200 sccm of chlorine.

6. The method of claim 1, wherein at least a part of the intermixing to form the intermixed feed gas is conducted within the chamber.

7. The method of claim 1, further comprising intermixing a dopant gas to form the intermixed feed gas.

8. The method of claim 7, wherein the dopant gas comprises at least one of a carbon source, a germanium source, an n-type dopant, and a p-type dopant.

9. The method of claim 8, wherein the dopant gas comprises at least two of the carbon source, the germanium source, the n-type dopant, and the p-type dopant.

10. The method of claim 8, wherein the dopant gas comprises a carbon source selected from the group consisting of monosilylmethane, disilylmethane, trisilylmethane, tetrasilylmethane, monomethyl silane, dimethyl silane and 1,3-disilabutane.

11. The method of claim 10, wherein the carbon source comprises monomethyl silane.

12. The method of claim 8, wherein the dopant gas comprises a carbon source, the carbon source comprising a chlorosilylmethane of the formula $(SiH_{3-z}Cl_z)_xCH_{4-x-y}Cl_y$, where x is an integer in the range of 1 to 4 and where y and z are each independently zero or an integer in the range of 1 to 3, with the provisos that $x+y \leq 4$ and at least one of y and z is not zero.

13. The method of claim 8, wherein the dopant gas comprises a carbon source, the carbon source comprising an alkylhalosilane of the formula $X_aSiH_b(C_nH_{2n+1})_{4-a-b}$, where X is a halogen; n is 1 or 2; a is 1 or 2; b is 0, 1 or 2; and the sum of a and b is less than 4.

14. The method of claim 8, wherein the dopant gas comprises an n-type dopant selected from the group consisting of arsine and phosphine.

15. The method of claim 8, wherein the dopant gas comprises a germanium source selected from the group consisting of germane and digermane.

16. The method of claim 8, wherein the dopant gas comprises a p-type dopant.

17. The method of claim 16, wherein the dopant gas comprises diborane.

18. The method of claim 8, wherein the Si-containing layer comprises an in situ doped silicon film.

19. The method of claim 18, wherein the dopant gas comprises diborane, phosphine or arsine.

20. The method of claim 7, wherein the dopant gas comprises an electrical dopant hydride that getters chlorine from a deposition surface during deposition.

21. The method of claim 1, wherein the first surface morphology is single crystalline.

22. The method of claim 1, wherein the first surface comprises a source and drain region of a partially fabricated transistor.

23. The method of claim 22, wherein the first surface is recessed relative to a channel surface of the partially fabricated transistor.

24. The method of claim 23, wherein the Si-containing layer comprises an alloy configured to introduce stress into a channel region of the partially fabricated transistor to improve electrical carrier mobility.

25. The method of claim 24, wherein the Si-containing layer introduces tensile strain into the channel region.

26. The method of claim 24, wherein the Si-containing layer introduces compressive strain into the channel region.

27. The method of claim 22, wherein the Si-containing layer defines an elevated source/drain structure.

28. The method of claim 1, wherein the Si-containing layer comprises a heteroepitaxial film.

29. The method of claim 1, wherein the Si-containing layer has an average thickness between about 50 Å and about 1000 Å.

30. The method of claim 1, further comprising intermixing a carrier gas to form the intermixed feed gas.

31. The method of claim 30, wherein the carrier gas is a non-hydrogen inert gas.

32. The method of claim 31, wherein no HCl is provided to the chamber while selectively depositing.

33. The method of claim 1, further comprising introducing a non-hydrogen carrier gas comprising nitrogen gas with the intermixed feed gas to the substrate.

34. The method of claim 1, further comprising intermixing an n-type dopant in situ to form the intermixed feed gas.

* * * * *